(12) United States Patent
Maki et al.

(10) Patent No.: US 10,884,041 B2
(45) Date of Patent: Jan. 5, 2021

(54) PHYSICAL QUANTITY MEASUREMENT APPARATUS, ELECTRONIC APPARATUS, AND VEHICLE

(71) Applicant: Seiko Epson Corporation, Tokyo (JP)

(72) Inventors: Katsuhiko Maki, Chino (JP); Hideo Haneda, Matsumoto (JP); Takashi Kurashina, Matsumoto (JP); Akio Tsutsumi, Chino (JP); Yasuhiro Sudo, Chino (JP)

(73) Assignee: Seiko Epson Corporation

( * ) Notice: Subject to any disclaimer, the term of this patent is extended or adjusted under 35 U.S.C. 154(b) by 631 days.

(21) Appl. No.: 15/715,719

(22) Filed: Sep. 26, 2017

(65) Prior Publication Data
US 2018/0088160 A1    Mar. 29, 2018

(30) Foreign Application Priority Data

Sep. 27, 2016  (JP) ................................ 2016-187798
May 24, 2017  (JP) ................................ 2017-102223

(51) Int. Cl.
| | |
|---|---|
| *G01R 23/10* | (2006.01) |
| *G01R 29/02* | (2006.01) |
| *G04F 10/00* | (2006.01) |
| *G04F 10/04* | (2006.01) |
| *H03K 21/02* | (2006.01) |
| *G01R 23/12* | (2006.01) |

(52) U.S. Cl.
CPC ............. *G01R 23/10* (2013.01); *G01R 29/02* (2013.01); *G04F 10/005* (2013.01); *G04F 10/04* (2013.01); *H03K 21/023* (2013.01); *G01R 23/12* (2013.01)

(58) Field of Classification Search
CPC ........ G01R 23/10; G01R 29/02; G01R 23/12; G04F 10/005; G04F 10/04; H03K 21/023; G01K 7/32; H03L 1/04; G01S 7/5273
See application file for complete search history.

(56) References Cited

U.S. PATENT DOCUMENTS 5,515,506 A * 5/1996 Dixon ................. G06F 11/1064
                                                           714/42
7,304,510 B2  12/2007 Matsuta
(Continued)

FOREIGN PATENT DOCUMENTS

| CN | 101079630 A | 11/2007 |
|---|---|---|
| CN | 102112931 A | 6/2011 |

(Continued)

*Primary Examiner* — Regis J Betsch
*Assistant Examiner* — Kaleria Knox
(74) *Attorney, Agent, or Firm* — Harness, Dickey & Pierce, P.L.C.

(57) ABSTRACT

A physical quantity measurement apparatus includes a first resonator, a second oscillator, and an integrated circuit device. The integrated circuit device includes a first oscillation circuit that causes the first resonator to oscillate, and thus generate a first clock signal having a first clock frequency, a second oscillation circuit that causes the second oscillator to oscillate, and thus generate a second clock signal having a second clock frequency which is different from the first clock frequency, and a measurement unit that is provided with a time-to-digital conversion circuit which converts time into a digital value by using the first clock signal and the second clock signal.

18 Claims, 30 Drawing Sheets

(56) References Cited

U.S. PATENT DOCUMENTS

| | | | |
|---|---|---|---|
| 7,363,177 B2* | 4/2008 | Intrator | G01S 7/5273 |
| | | | 702/79 |
| 7,830,191 B2 | 11/2010 | Kojima et al. | |
| 8,258,774 B2* | 9/2012 | Hung | G01R 25/00 |
| | | | 324/76.52 |
| 10,247,621 B1* | 4/2019 | Partridge | G01K 7/32 |
| 10,305,491 B2* | 5/2019 | Yorita | H03L 1/04 |
| 2006/0235635 A1 | 10/2006 | Intrator et al. | |
| 2007/0271051 A1* | 11/2007 | Boerstler | G01R 29/02 |
| | | | 702/79 |
| 2010/0259653 A1* | 10/2010 | Kimura | G09G 5/10 |
| | | | 348/252 |
| 2011/0133973 A1 | 6/2011 | Yamamoto et al. | |
| 2015/0145572 A1* | 5/2015 | Sato | G04F 10/005 |
| | | | 327/159 |
| 2018/0091156 A1* | 3/2018 | Maki | H03B 5/362 |

FOREIGN PATENT DOCUMENTS

| | | |
|---|---|---|
| JP | 01-079687 A | 3/1989 |
| JP | 05-087954 A | 4/1993 |
| JP | 2007-110370 A | 4/2007 |
| JP | 2009-246484 A | 10/2009 |
| JP | 2010-119077 A | 5/2010 |

* cited by examiner

| fr (MHz) | f1 (MHz) | f2 (MHz) | N2 | M2 | N1 | M1 | $\Delta t=|1/f1-1/f2|$ (ps) |
|---|---|---|---|---|---|---|---|
| 101 | 102.01 | 102 | 102 | 101 | 101 | 100 | 0.96 |
| 102 | 189.04 | 189 | 63 | 34 | 139 | 75 | 1.12 |
| 201 | 276.04 | 276 | 92 | 67 | 103 | 75 | 0.53 |

PHYSICAL QUANTITY MEASUREMENT APPARATUS, ELECTRONIC APPARATUS, AND VEHICLE

BACKGROUND

1. Technical Field

The present invention relates to a physical quantity measurement apparatus, an electronic apparatus, a vehicle, and the like.

2. Related Art

In the related art, there are known time-to-digital conversion circuits. The time-to-digital conversion circuit converts time into a digital value. As examples of such time-to-digital conversion circuits of the related art, known techniques of the related art are disclosed in JP-A-2009-246484, JP-A-2007-110370, JP-A-2010-119077, and JP-A-5-87954.

In the techniques of the related art disclosed in JP-A-2009-246484, JP-A-2007-110370, and JP-A-2010-119077, time-to-digital conversion is performed by using a so-called vernier delay circuit. The vernier delay circuit performs time-to-digital conversion by using a delay element which is a semiconductor element.

JP-A-5-87954 discloses a minute time measurement apparatus including a first quartz crystal oscillator outputting a first clock pulse, a second quartz crystal oscillator outputting a second clock pulse, an edge matching detection circuit, a synchronous counter, a microcomputer, and a transmission time control unit. The edge matching detection circuit detects a synchronous point of the first and second clock pulses. The synchronous counter performs a counting process in synchronization with the first and second clock pulses. The microcomputer calculates an unknown time from a start pulse to a stop pulse on the basis of a value of the synchronous counter. The transmission time control unit outputs a start pulse according to an output from the edge matching detection circuit, and values of the synchronous counter and the microcomputer.

In the techniques of the related art disclosed in JP-A-2009-246484, JP-A-2007-110370, and JP-A-2010-119077, time-to-digital conversion is performed by using a so-called vernier delay circuit. The vernier delay circuit performs time-to-digital conversion by using a delay element which is a semiconductor element. However, in time-to-digital conversion using a semiconductor element, improvement of a resolution is easy, but there is a problem in that improvement of accuracy is not easy.

In the technique of the related art disclosed in JP-A-5-87954, time-to-digital conversion is performed by using two quartz crystal oscillators. However, in this technique of the related art, since two oscillation circuits causing the two quartz crystal oscillators to oscillate are respectively built into the quartz crystal oscillators, a circuit used for time measurement is implemented by an IC chip or a circuit component which is different from the oscillation circuit. Thus, an appropriate control process on the two oscillation circuits cannot be performed, and, as a result, it is difficult to achieve high performance time-to-digital conversion.

SUMMARY

An advantage of some aspects of the invention is to provide a physical quantity measurement apparatus, an electronic apparatus, a vehicle, and the like capable of realizing high performance or simplification of a time-to-digital conversion process.

The invention can be implemented in at least the following configurations.

An aspect of the invention relates to a physical quantity measurement apparatus including a first resonator; a second oscillator; and an integrated circuit device, in which the integrated circuit device includes a first oscillation circuit that causes the first resonator to oscillate, and thus generates a first clock signal having a first clock frequency, a second oscillation circuit that causes the second oscillator to oscillate, and thus generates a second clock signal having a second clock frequency which is different from the first clock frequency, and a measurement unit that is provided with a time-to-digital conversion circuit which converts time into a digital value by using the first clock signal and the second clock signal.

In the aspect of the invention, the physical quantity measurement apparatus includes the first and second oscillators, and the integrated circuit device, and the integrated circuit device is provided with the first and second oscillation circuits. The first and second oscillation circuits of the integrated circuit device respectively cause the first and second oscillators of the physical quantity measurement apparatus to oscillate, so as to generate the first and second clock signals having different clock frequencies. Time-to-digital conversion is performed so that time is converted into a digital value by using the first and second clock signals generated by the first and second oscillation circuits. As mentioned above, if the first and second clock signals generated by using the first and second oscillators are used, it is possible to perform time-to-digital conversion by using a clock signal having a highly accurate clock frequency, and thus to achieve high accuracy of time-to-digital conversion compared with a case where time-to-digital conversion is performed by using a semiconductor element. Since the first and second oscillation circuits generating the first and second clock signals are built into the integrated circuit device, it is possible to achieve high performance or simplification of a time-to-digital conversion process compared with a case where the oscillation circuits are not built into the integrated circuit device.

In the aspect of the invention, the integrated circuit device may include a first terminal that connects one end of the first resonator to the first oscillation circuit; a second terminal that connects the other end of the first resonator to the first oscillation circuit; a third terminal that connects one end of the second oscillator to the second oscillation circuit; and a fourth terminal that connects the other end of the second oscillator to the second oscillation circuit.

If the first to fourth terminals are provided in the integrated circuit device, circuit elements can be connected to the terminals, or the first and second oscillation circuits can be controlled by using the terminals.

In the aspect of the invention, one end of the first resonator and the first terminal, the other end of the first resonator and the second terminal, one end of the second oscillator and the third terminal, and the other end of the second oscillator and the fourth terminal may be connected to each other via internal wires of a package in which the first resonator, the second oscillator, and the integrated circuit device are accommodated.

With this configuration, the first resonator can be connected to the first and second terminals of the integrated circuit device via internal wires of a package, or the second oscillator can be connected to the third and fourth terminals of the integrated circuit device via internal wires of the package, and the first and second oscillators can be caused to oscillate by the first and second oscillation circuits of the integrated circuit device.

In the aspect of the invention, the first oscillation circuit may be disposed in a region along a first side among the first side, a second side, a third side, and a fourth side of the integrated circuit device, and the second oscillation circuit may be disposed in a region along a side which is different from the first side among the first side, the second side, the third side, and the fourth side of the integrated circuit device.

With this configuration, a distance between the first oscillation circuit and the second oscillation circuit, or a distance between a terminal of the first oscillation circuit and a terminal of the second oscillation circuit can be increased. Consequently, it is possible to prevent deterioration or the like in performance of time-to-digital conversion due to noise or a jitter.

In the aspect of the invention, the measurement unit may include a processing circuit that performs signal processing on a detection signal corresponding to a physical quantity.

With this configuration, it is possible to perform a physical quantity measurement process by using a signal obtained by performing signal processing on a detection signal, and thus to realize an appropriate physical quantity measurement process.

In the aspect of the invention, the physical quantity may be at least one of time, a distance, a flow rate, flow velocity, and a frequency.

However, a physical quantity which is a measurement target in the measurement unit is not limited to such physical quantities.

In the aspect of the invention, the processing circuit may perform a waveform shaping process on the detection signal.

With this configuration, it is possible to perform a physical quantity measurement process by using a signal whose waveform is appropriately shaped through the waveform shaping process, and thus to realize an appropriate physical quantity measurement process.

In the aspect of the invention, the physical quantity measurement apparatus may further include a light emitting unit that irradiates a target object with light or a sonic wave transmitting unit that transmits a sonic wave to the target object; and a light receiving unit that receives light from the target object or a sonic wave receiving unit that receives a sonic wave from the target object.

With this configuration, it is possible to appropriately measure various physical quantities such as a distance to a target object.

In the aspect of the invention, the processing circuit may perform the signal processing on the detection signal from the light receiving unit or the sonic wave receiving unit.

With this configuration, it is possible to perform appropriate signal processing on a detection signal from the light receiving unit or the sonic wave receiving unit, and thus to perform a physical quantity measurement process.

In the aspect of the invention, the integrated circuit device may include a control unit that controls at least one of the first oscillation circuit and the second oscillation circuit.

With this configuration, control for realizing high performance or simplification of a time-to-digital conversion process can be realized by the control unit controlling the oscillation circuits.

In the aspect of the invention, the control unit may control at least one of an oscillation frequency and a phase of an oscillation signal of at least one oscillation circuit.

If an oscillation frequency or a phase of an oscillation signal is controlled in the above-described way, a frequency relationship or a phase relationship of the first and second clock signals can be set to an appropriate relationship.

In the aspect of the invention, the control unit may control at least one oscillation circuit so that the first clock signal and the second clock signal have a predetermined frequency relationship or a predetermined phase relationship.

With this configuration, it is possible to perform time-to-digital conversion in a state in which a frequency relationship or a phase relationship of the first and second clock signals is appropriate.

In the aspect of the invention, the time-to-digital conversion circuit may convert a time difference between transition timings of a first signal and a second signal into a digital value.

With this configuration, a time difference between transition timings of the first and second signals can be converted into a digital value with high accuracy by using the first and second clock signals generated by the first and second oscillators.

In the aspect of the invention, after a phase synchronization timing of the first clock signal and the second clock signal, in a case where an inter-clock time difference which is a time difference between transition timings of the first clock signal and the second clock signal in a first clock cycle to an i-th clock cycle is $\Delta t$ to $i \times \Delta t$ (where $\Delta t$ is a resolution, and i is an integer of 2 or more), the time-to-digital conversion circuit may specify that the time difference of the first signal and the second signal corresponds to any one of $\Delta t$ to $i \times \Delta t$ which is the inter-clock time difference, so as to obtain the digital value.

With this configuration, a time difference of the first and second signals can be converted into a digital value by effectively using an inter-clock time difference which increases by, for example, $\Delta t$ after a phase synchronization timing.

In the aspect of the invention, in a case where a period between a first phase synchronization timing and a second phase synchronization timing of the first clock signal and the second clock signal is a measurement period, and a time difference between transition timings of the first clock signal and the second clock signal is an inter-clock time difference, the time-to-digital conversion circuit may generate a plurality of the first signals in a plurality of clock cycles of the measurement period, and acquire a plurality of the second signals whose signal levels change so as to correspond to the plurality of generated first signals, and obtain the digital value on the basis of a result of a comparison process for comparing the time difference of the first signal and the second signal in each of the plurality of clock cycles with the inter-clock time difference in each clock cycle.

With this configuration, a plurality of first signals can be generated in a plurality of clock cycles of the measurement period, and digital values of time differences of the plurality of first signals and a plurality of corresponding second signals can be obtained by using inter-clock time differences of the first and second clock signals in the respective clock cycles. Consequently, it is possible to perform time-to-digital conversion at a high speed.

In the aspect of the invention, in a case where a period between a first phase synchronization timing and a second phase synchronization timing of the first clock signal and the second clock signal is a first update period, a period between the second phase synchronization timing and a third phase synchronization timing is a second update period, and a time difference between transition timings of the first clock signal and the second clock signal is an inter-clock time difference, the time-to-digital conversion circuit, in the first update period, may generate the first signal in an m-th (where m is an integer of 1 or more) clock cycle, acquire the second signal whose signal level changes so as to correspond to the first signal, and perform a comparison process for comparing the time difference of the first signal and the second signal with the inter-clock time difference in the m-th clock cycle, and, in the second update period, may generate the first signal in an n-th (where n is an integer of 1 or more) clock cycle which is set according to a result of the comparison process in the first update period, acquire the second signal whose signal level changes so as to correspond to the generated first signal, and perform a comparison process for comparing the time difference of the first signal and the second signal with the inter-clock time difference in the n-th clock cycle.

With this configuration, a result of a comparison process in the previous update period can be fed back so that a clock cycle in which the first signal is generated in this update period can be set, and time-to-digital conversion can be performed.

In the aspect of the invention, the integrated circuit device may include a first PLL circuit that performs phase synchronization between the first clock signal and a reference clock signal; and a second PLL circuit that performs phase synchronization between the second clock signal and the reference clock signal.

As mentioned above, since phase synchronization is performed by using the first and second PLL circuits, it is possible to increase a frequency of phase synchronization compared with a case where phase synchronization between the first and second clock signals is performed by using a single PLL circuit, and thus to realize high performance of a time-to-digital conversion process using the first and second clock signals.

In the aspect of the invention, in a case where a jitter amount of the first clock signal and the second clock signal per clock cycle is indicated by J, and a resolution in time-to-digital conversion is indicated by $\Delta t$, a relationship of $J \leq \Delta t$ may be satisfied.

With this configuration, it is possible to prevent a situation in which the accuracy of time-to-digital conversion deteriorates due to a jitter amount exceeding a resolution.

In the aspect of the invention, in a case where the number of clocks of one clock signal in a period between a timing at which one of the first clock signal and the second clock signal is phase-synchronized with the other clock signal or a reference clock signal and the next phase synchronization timing is indicated by K, a relationship of $J \geq \Delta t/K$ may be satisfied.

With this configuration, it is possible to prevent a situation in which the accuracy of time-to-digital conversion deteriorates due to a resolution as a main factor.

In the aspect of the invention, in a case where the number of clocks of one clock signal in a period between a timing at which one of the first clock signal and the second clock signal is phase-synchronized with the other clock signal or a reference clock signal and the next phase synchronization timing is indicated by K, a relationship of $(1/10) \times (\Delta t/K^{1/2}) \leq J \leq 10 \times (\Delta t/K^{1/2})$ may be satisfied.

With this configuration, it is possible to perform time-to-digital conversion with a resolution in which the influence of a cumulative jitter is taken into consideration, and thus to achieve high accuracy of time-to-digital conversion.

Another aspect of the invention relates to an electronic apparatus including anyone of the physical quantity measurement apparatuses.

Still another aspect of the invention relates to a vehicle including anyone of the physical quantity measurement apparatuses.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, a preferred embodiment of the invention will be described with reference to the drawings. The present embodiment described below is not intended to limit the scope of the invention disclosed in the appended claims, and all constituent elements described in the embodiment are not essential constituent elements of the invention.

1. Physical Quantity Measurement Apparatus

Figure 1:
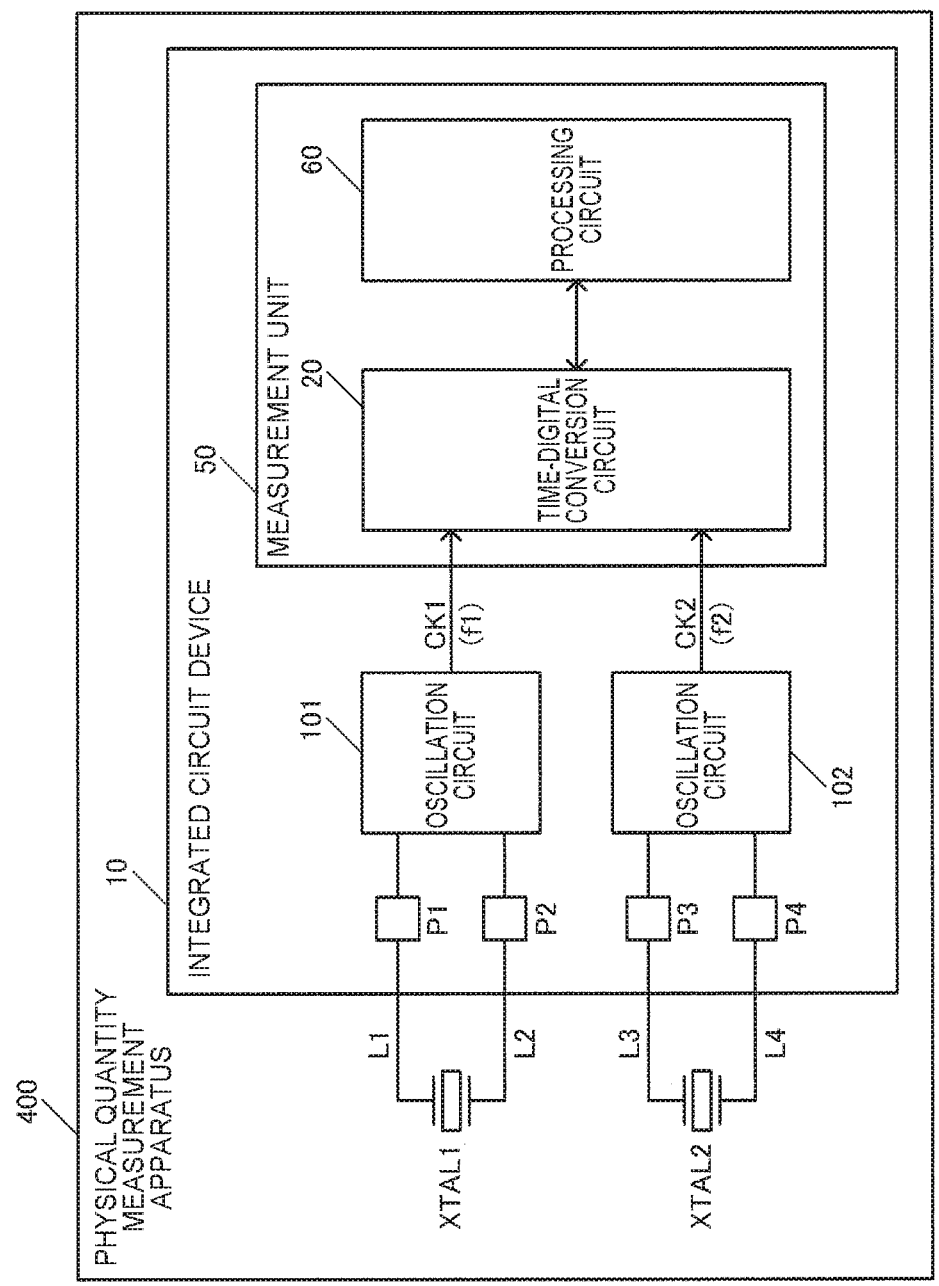
FIG. 1 is a fundamental configuration example of a physical quantity measurement apparatus according to the present embodiment.

FIG. 1 illustrates a fundamental configuration example of a physical quantity measurement apparatus 400 according to the present embodiment. The physical quantity measurement apparatus 400 includes an oscillator XTAL1 (first resonator), an oscillator XTAL2 (second oscillator), and an integrated circuit device 10. Signal lines L1, L2, L3 and L4 or a package which will be described later may be included. However, the physical quantity measurement apparatus 400 is not limited to the configuration illustrated in FIG. 1, and may be variously modified, for example, some of the constituent elements may be omitted, or other constituent elements may be added thereto.

The oscillators XTAL1 and XTAL2 are, for example, piezoelectric resonators. Specifically, the oscillators XTAL1 and XTAL2 are, for example, quartz crystal resonators. For example, the oscillators XTAL1 and XTAL2 are thickness shear resonant type quartz crystal resonators such as AT cut type or SC cut type quartz crystal resonators. For example, the oscillators XTAL1 and XTAL2 may be simple package type (SPXO) resonators, may be an oven type (OCXO) resonators provided with thermostatic tanks, or may be a temperature compensation type (TCXO) resonators not provided with thermostatic tanks. As the oscillators XTAL1 and XTAL2, a surface acoustic wave (SAW) resonator, a micro electro mechanical systems (MEMS) resonator which is a silicon resonator, or the like may be used.

The integrated circuit device 10 includes oscillation circuits 101 and 102, and a measurement unit 50. The integrated circuit device 10 may include terminals P1, P2, P3 and P4. However, the integrated circuit device 10 is not limited to the configuration illustrated in FIG. 1, and may be variously modified, for example, some of the constituent elements may be omitted, or other constituent elements may be added thereto.

The oscillation circuit 101 (first oscillation circuit) causes the oscillator XTAL1 to oscillate. A clock signal CK1 (first clock signal) having a clock frequency f1 (first clock frequency) is generated. The oscillation circuit 102 (second oscillation circuit) causes the oscillator XTAL2 to oscillate. A clock signal CK2 (second clock signal) having a clock frequency f2 (second clock frequency) is generated. Each of the oscillation circuits 101 and 102 is formed of an oscillation buffer circuit, or circuit elements such as a capacitor and a resistor. The clock signals CK1 and CK2 generated by the oscillation circuits 101 and 102 are supplied to the measurement unit 50 (time-to-digital conversion circuit 20).

The measurement unit 50 includes the time-to-digital conversion circuit 20 which converts time into a digital value by using the clock signal CK1 and the clock signal CK2. The measurement unit 50 performs a process of measuring a physical quantity. For example, the measurement unit 50 performs a process of measuring time which is a physical quantity through time-to-digital conversion in the time-to-digital conversion circuit 20. Alternatively, a process of measuring other physical quantities may be performed by using time-to-digital conversion in the time-to-digital conversion circuit 20.

The measurement unit 50 includes a processing circuit 60 which performs signal processing on a detection signal corresponding to a physical quantity. For example, the processing circuit 60 performs analog signal processing on an analog detection signal corresponding to a physical quantity. Specifically, the processing circuit 60 performs a waveform shaping process on a detection signal. The processing circuit 60 may include an analog circuit for performing analog signal processing such as a waveform shaping process. A physical quantity is at least one of time, a distance, a flow rate, flow velocity, and a frequency. A physical quantity may be velocity, acceleration, angular velocity, angular acceleration, or the like. Details of the processing circuit 60 will be described later.

The time-to-digital conversion circuit 20 receives the clock signal CK1 having the clock frequency f1 generated by using the oscillator XTAL1 and the clock signal CK2 having the clock frequency f2 generated by using the oscillator XTAL2. Time is converted into a digital value by using the clock signals CK1 and CK2. The clock frequency f2 is different from the clock frequency f1, and is, for example, lower than the clock frequency f1. The time-to-digital conversion circuit 20 may perform a digital value filtering process (a digital filter process or a low-pass filter process), so as to output a digital value having undergone the filtering process.

In FIG. 1, two oscillation circuits 101 and 102 are provided, and the time-to-digital conversion circuit 20 performs time-to-digital conversion by using the two clock signals CK1 and CK2 from the two oscillation circuits 101 and 102, but the present embodiment is not limited thereto. For example, three or more oscillation circuits may be provided, three or more clock signals may be generated, and time-to-digital conversion may be provided by using the three or more clock signals. For example, time-to-digital conversion is performed by using a third clock signal in addition to the clock signals CK1 and CK2. In the above-described way, higher performance (higher accuracy or the like) of time-to-digital conversion can be achieved.

As illustrated in FIG. 1, in the present embodiment, since the clock signals CK1 and CK2 are generated by using the oscillators XTAL1 and XTAL2, and time-to-digital conversion is performed by using the clock signals CK1 and CK2, it is possible to achieve high accuracy or the like of time-to-digital conversion. Particularly, it is possible to improve the accuracy of time-to-digital conversion considerably compared with the techniques of the related art disclosed in JP-A-2009-246484, JP-A-2007-110370, and JP-A-2010-119077 in which time-to-digital conversion is performed by using a delay element which is a semiconductor element. Consequently, it is possible to improve the accuracy of a physical quantity measurement process performed by the measurement unit 50.

In the technique of the related art disclosed in JP-A-5-87954, the oscillation circuit is provided on the quartz crystal oscillator side, and no oscillation circuit is provided on a circuit device side such as the microcomputer. Thus, the first and second quartz crystal oscillators can perform only a free running oscillation operation, and thus an oscillation operation of the first and second quartz crystal oscillators cannot be controlled. The first and second clock pulses from the first and second quartz crystal oscillators cannot be made to have a predetermined frequency relationship or a predetermined phase relationship, and thus there is a problem in that a circuit process or a circuit configuration is complex, or high performance of the circuit process cannot be sufficiently realized.

In contrast, in the present embodiment, as illustrated in FIG. 1, the oscillation circuits 101 and 102 causing the oscillators XTAL1 and XTAL2 to oscillate are built into the integrated circuit device 10. Therefore, the oscillation circuits 101 and 102 can be controlled, or the clock signals CK1 and CK2 can be made to have a predetermined frequency relationship or a predetermined phase relationship. Consequently, it is possible to realize high performance or simplification of a time-to-digital conversion process.

Figure 2:
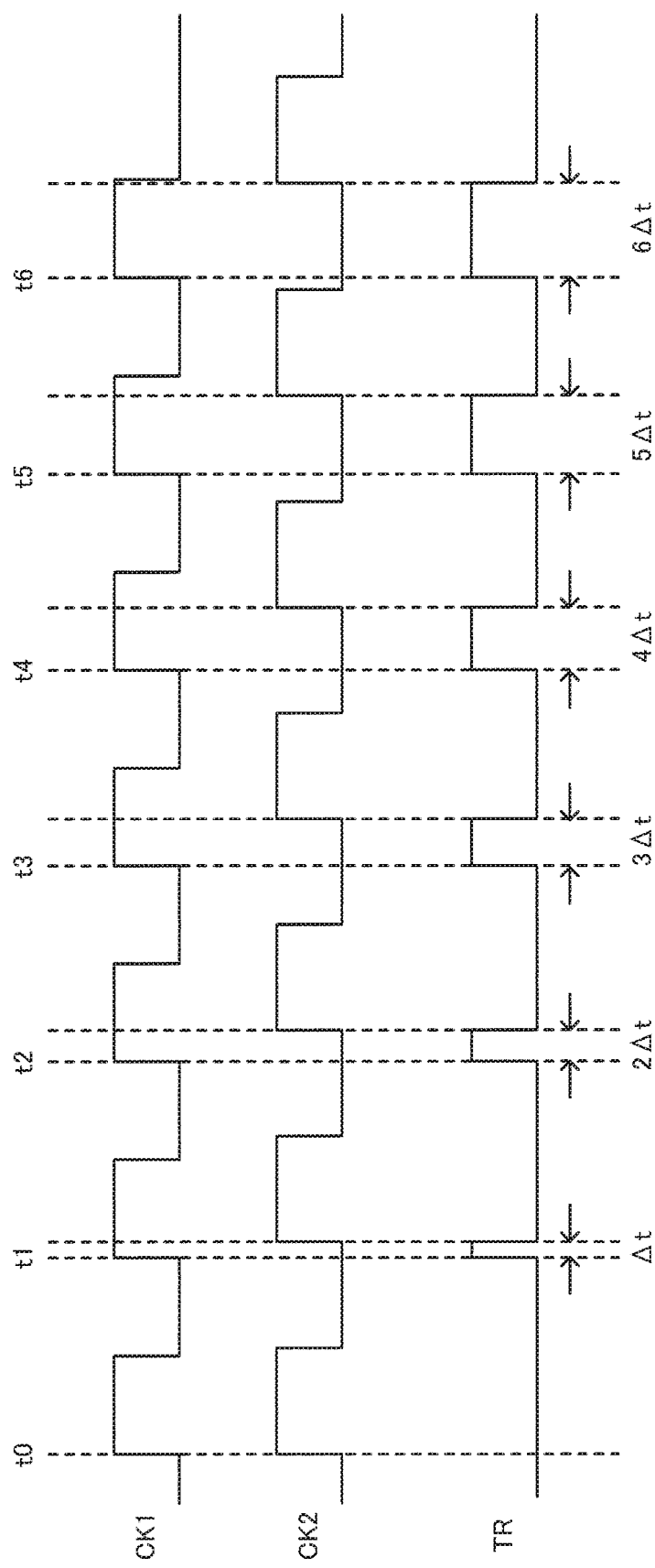
FIG. 2 is a diagram for explaining a time-to-digital conversion method using a clock frequency difference.

FIG. 2 is a diagram for explaining a time-to-digital conversion method using a clock frequency difference. At t0, the transition timings (phases) of the clock signals CK1 and CK2 match each other. Thereafter, at t1, t2, t3, . . . , an inter-clock time difference TR (phase difference) which is a time difference between transition timings of the clock signals CK1 and CK2 increases as in $\Delta t$, $2\Delta t$, $3\Delta t$, . . . . In FIG. 2, the inter-clock time difference is indicated by a pulse signal having a width of TR.

In time-to-digital conversion of the present embodiment, for example, a plurality of oscillators are used, and time is converted into a digital value by using a clock frequency difference. In other words, in a case where clock frequencies of the clock signals CK1 and CK2 are indicated by f1 and f2, the time-to-digital conversion circuit 20 converts time into a digital value with a resolution corresponding to a frequency difference |f1−f2| of the clock frequencies f1 and f2. For example, as illustrated in FIG. 2, time is converted into a digital value by using a Nonius' principle.

In the above-described way, a resolution in time-to-digital conversion can be set by using the frequency difference |f1−f2| of the clock frequencies f1 and f2, and thus performance such as the accuracy of or the resolution in the time-to-digital conversion can be improved.

Specifically, the resolution (temporal resolution) in the time-to-digital conversion of the present embodiment may be represented by $\Delta t = |1/f1 - 1/f2| = |f1 - f2|/(f1 \times f2)$. The time-to-digital conversion circuit 20 converts time into a digital value so that the resolution $\Delta t$ becomes $\Delta t = |1/f1 - 1/f2| = |f1 - f2|/(f1 \times f2)$. The resolution $\Delta t$ is represented by $\Delta t = |f1 - f2|/(f1 \times f2)$, and corresponds to the frequency difference |f1−f2|.

In the above-described way, a resolution in time-to-digital conversion can be set by setting the clock frequencies f1 and f2. For example, the resolution $\Delta t$ can be reduced by reducing the frequency difference |f1−f2| of the clock frequencies f1 and f2, and thus it is possible to realize time-to-digital conversion of high resolution. The resolution $\Delta t$ can be reduced by increasing the clock frequencies f1 and f2, and thus it is possible to realize time-to-digital conversion of high resolution. If the clock signals CK1 and CK2 respectively having the clock frequencies f1 and f2 are generated by using the oscillators XTAL1 and XTAL2, it is possible to improve the accuracy of time-to-digital conversion compared with a case of using a delay element which is a semiconductor element.

Particularly, in the present embodiment, quartz crystal resonators are used as the oscillators XTAL1 and XTAL2 (first and second oscillators). For example, thickness shear resonant type quartz crystal resonators such as AT cut type or SC cut type quartz crystal resonators are used. As mentioned above, if the clock signals CK1 and CK2 are generated by using the quartz crystal resonators, high accuracy of the clock frequencies f1 and f2 can be achieved. For example, it is possible to minimize variations in the clock frequencies f1 and f2 due to a manufacturing variation or environmental variations such as a temperature variation. Therefore, it is also possible to minimize a variation in the resolution $\Delta t = |f1 - f2|/(f1 \times f2)$, and thus to realize higher performance of time-to-digital conversion.

Figure 3:
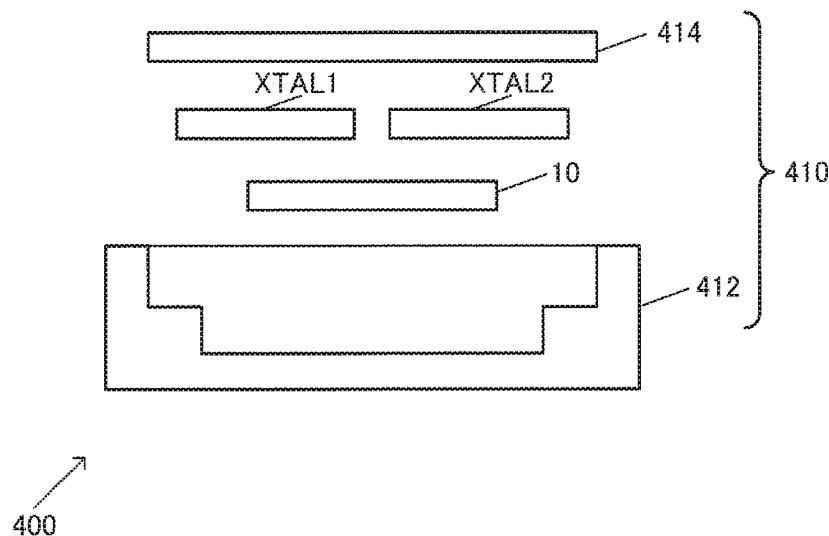
FIG. 3 is a specific configuration example of the physical quantity measurement apparatus.
Figure 4:
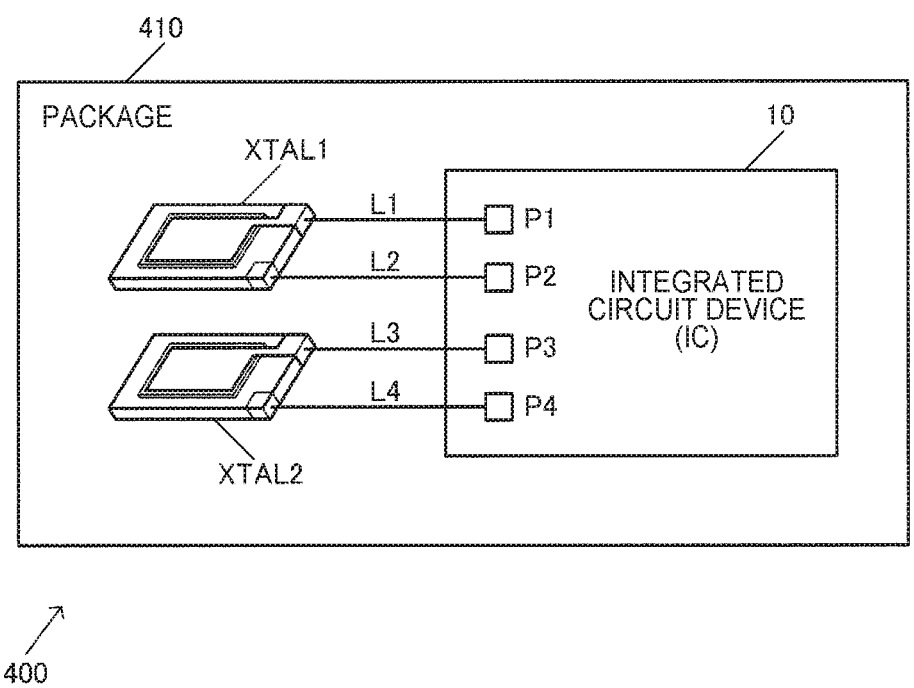
FIG. 4 is a specific configuration example of the physical quantity measurement apparatus.

FIGS. 3 and 4 illustrate a specific configuration example of the physical quantity measurement apparatus 400 according to the present embodiment. As illustrated in FIGS. 3 and 4, the physical quantity measurement apparatus 400 includes the integrated circuit device 10, the oscillator XTAL1 (a first resonator or a first resonator element), the oscillator XTAL2 (a second oscillator or a second resonator element), and a package 410 in which the integrated circuit device 10 and the oscillators XTAL1 and XTAL2 are accommodated. The package 410 is formed of, for example, a base portion 412 and a lid portion 414. The base portion 412 is, for example, a box-shaped member made of an insulating material such as ceramics, and the lid portion 414 is, for example, a tabular member joined to the base portion 412. External connection terminals (external electrodes) for connection to an external apparatus are provided on, for example, a bottom of the base portion 412. The integrated circuit device 10, and the oscillators XTAL1 and XTAL2 are accommodated in an internal space (cavity) formed by the base portion 412 and the lid portion 414. The package 410 is sealed with the lid portion 414, and thus the integrated circuit device 10 and the oscillators XTAL1 and XTAL2 are air-tightly enclosed therein.

The integrated circuit device 10 and the oscillators XTAL1 and XTAL2 are mounted in the package 410. Terminals of the oscillators XTAL1 and XTAL2 and terminals (pads) of the integrated circuit device 10 (IC) are electrically connected to each other via internal wires of the package 410. The integrated circuit device 10 is provided with the oscillation circuits 101 and 102 causing the oscillators XTAL1 and XTAL2 to oscillate, and the oscillation circuits 101 and 102 cause the oscillators XTAL1 and XTAL2 to oscillate, and thus the clock signals CK1 and CK2 are generated.

Specifically, the integrated circuit device 10 includes terminals P1 to P4 (first to fourth terminals, or first to fourth pads). The terminals P1 to P4 are terminals (pads) for connection to the oscillators. The terminal P1 (first terminal) is a terminal for connecting one end of the oscillator XTAL1 to the oscillation circuit 101. The terminal P2 (second terminal) is a terminal for connecting the other end of the oscillator XTAL1 to the oscillation circuit 101. One and the other ends of the oscillator XTAL1 are, for example, first and second terminals of the oscillator XTAL1. The oscillator XTAL1 and the oscillation circuit 101 are connected to each other via signal wires L1 and L2. The signal wires L1 and L2 are, for example, internal wires (metal wires) of the package 410 of the physical quantity measurement apparatus 400. The signal wires L1 and L2 connect one and the other ends (first and second electrodes) of the oscillator XTAL1 to the terminals P1 and P2 of the integrated circuit device 10.

The terminal P3 (third terminal) is a terminal for connecting one end of the oscillator XTAL2 to the oscillation circuit 102. The terminal P4 (fourth terminal) is a terminal for connecting the other end of the oscillator XTAL2 to the oscillation circuit 102. The one end and the other end of the oscillator XTAL2 are, for example, first and second terminals of the oscillator XTAL2. The oscillator XTAL2 and the oscillation circuit 102 are connected to each other via signal wires L3 and L4. The signal wires L3 and L4 are, for example, internal wires (metal wires) of the package 410 of the physical quantity measurement apparatus 400. The signal wires L3 and L4 connect one and the other ends (first and second electrodes) of the oscillator XTAL2 to the terminals P3 and P4 of the integrated circuit device 10.

As mentioned above, in the present embodiment, as illustrated in FIGS. 3 and 4, one end (first electrode) of the oscillator XTAL1 and the terminal P1, the other end (second electrode) of the oscillator XTAL1 and the terminal P2, one end (first electrode) of the oscillator XTAL2 and the terminal P3, the other end (second electrode) of the oscillator XTAL2 and the terminal P4, are respectively connected to each other via the signal wires L1, L2, L3 and L4 which are internal wires of the package 410 in which the oscillators XTAL1 and XTAL2 and the integrated circuit device 10 are accommodated.

A configuration of the physical quantity measurement apparatus 400 may be variously modified. For example, the base portion 412 may have a tabular shape, and the lid portion 414 may have such a shape in which a depression is formed therein. A mounting form, wire connection, or the like of the integrated circuit device 10 and the oscillators XTAL1 and XTAL2 in the package 410 may also be variously modified. The oscillators XTAL1 and XTAL2 are not necessarily required to be formed completely separately, and may be first and second oscillation regions formed in a single member. Three or more oscillators may be provided in the physical quantity measurement apparatus 400 (package 410). In this case, three or more oscillation circuits corresponding thereto may be provided in the integrated circuit device 10.

As mentioned above, in the present embodiment, as illustrated in FIGS. 1, 3 and 4, the terminals P1 to P4 for connection to the oscillators XTAL1 and XTAL2 are provided in the integrated circuit device 10. If such terminals P1 to P4 are provided in the integrated circuit device 10, for example, an oscillation frequency or the like can be controlled by connecting a circuit element such as a variable capacitance circuit to nodes (NB1, NB2, and NX1) of terminals (P1 to P4) of oscillation circuits illustrated in FIGS. 20 and 21. Consequently, oscillation frequencies of the oscillation circuits 101 and 102 can be controlled, or the clock signals CK1 and CK2 can be set to have a predetermined frequency relationship. If the terminals P1 to P4 are provided in the integrated circuit device 10, oscillation loops LP1 and LP2 can be connected to each other by using a synchronization circuit 110 in FIG. 17 which will be described later, or phase synchronization can be realized by controlling an oscillation frequency of the oscillation circuit 101 with a PLL circuit 120 in FIG. 19. According to the present embodiment, a control process common to the oscillation circuits 101 and 102 can be performed by the integrated circuit device 10.

In the present embodiment, the oscillators XTAL1 and XTAL2 and the terminals P1 to P4 of the integrated circuit device 10 are connected to each other via the signal wires L1, L2, L3 and L4 which are internal wires of the package 410. In the above-described way, the oscillators XTAL1 and XTAL2 and the integrated circuit device 10 accommodated in the package 410 can be connected to each other via the signal wires L1 to L4 which are internal wires of the package 410, and thus oscillation operations or various control processes for the oscillators XTAL1 and XTAL2 can be performed by the integrated circuit device 10.

2. Layout Arrangement Examples

Figure 5:
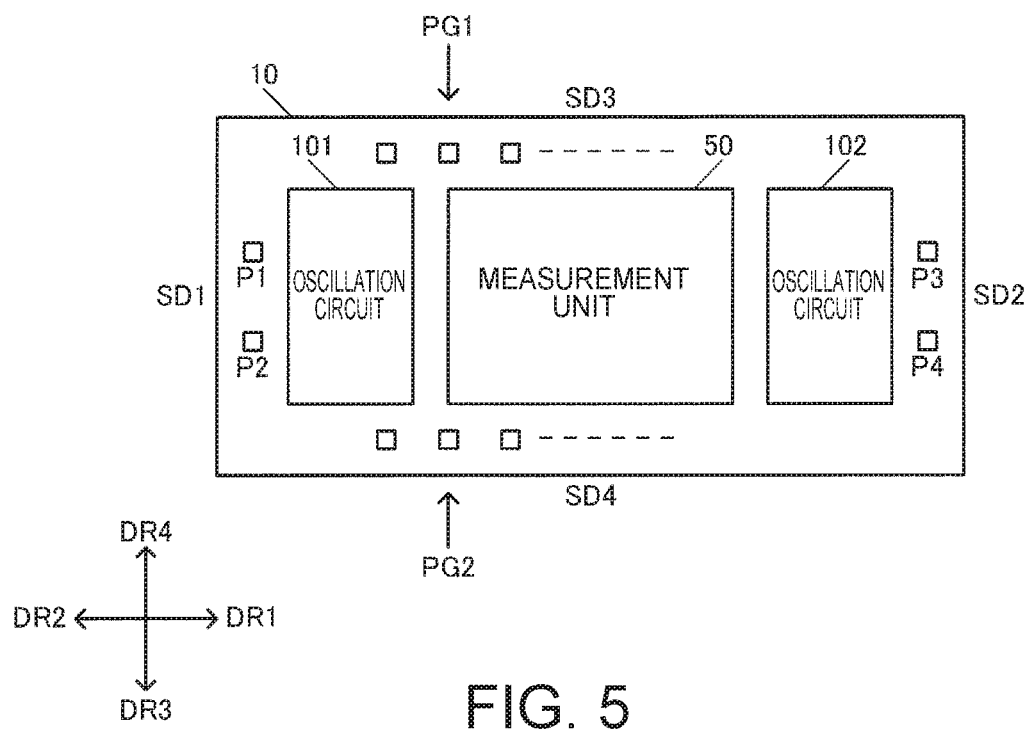
FIG. 5 illustrates a first layout arrangement example of an integrated circuit device of the physical quantity measurement apparatus.
Figure 6:
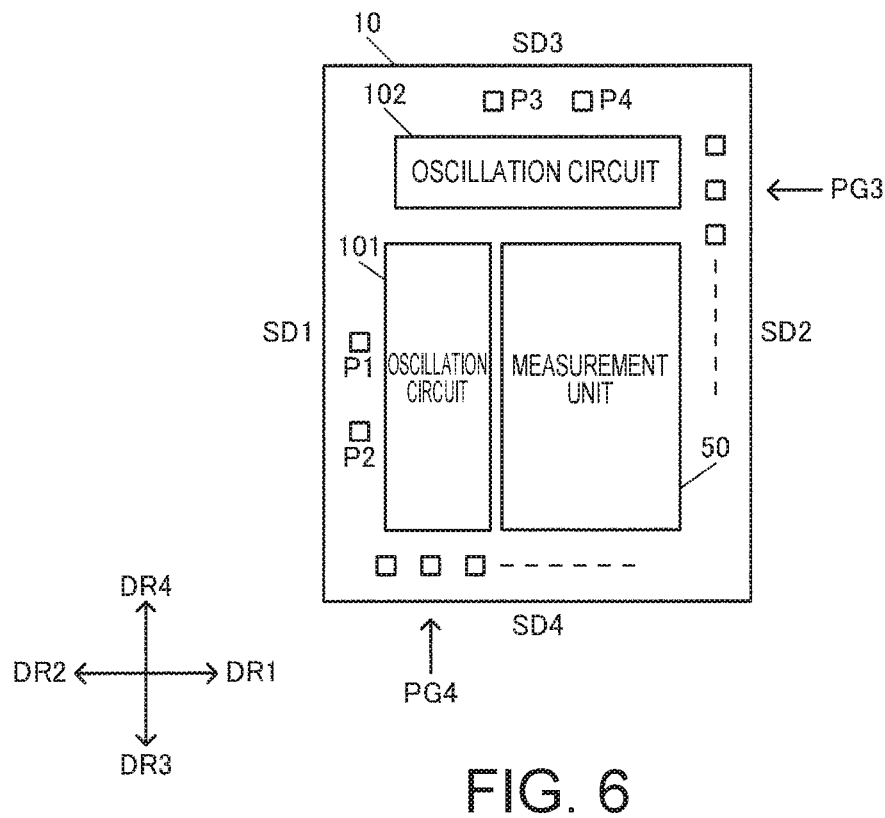
FIG. 6 illustrates a second layout arrangement example of an integrated circuit device of the physical quantity measurement apparatus.

FIGS. 5 and 6 illustrate first and second layout arrangement examples of the integrated circuit device 10 incorporated into the physical quantity measurement apparatus 400 according to the present embodiment. FIGS. 5 and 6 illustrate arrangement of circuit blocks formed of circuit elements such as transistors or passive elements in an IC chip of the integrated circuit device 10. Sides SD1, SD2, SD3 and SD4 are sides of the IC chip of the integrated circuit device 10. In FIGS. 5 and 6, a direction from the side SD1 (first side) toward the side SD2 (second side) opposing the side SD1 is set as a direction DR1 (first direction), and a direction opposite to DR1 is set as a direction DR2 (second direction). A direction from the side SD3 (third side) intersecting the side SD1 toward the side SD4 (fourth side) opposing the side SD3 is set as a direction DR3 (third direction), and a direction opposite to DR3 is set as a direction DR4 (fourth direction).

In FIG. 5, the oscillation circuit 101 is disposed in a region along the side SD1 among the sides SD1 to SD4 (first to fourth sides) of the integrated circuit device 10. For example, the oscillation circuit 101 is disposed so that a side (long side) of the circuit block of the oscillation circuit 101 is parallel to (substantially parallel to) the side SD1 of the integrated circuit device 10. On the other hand, the oscillation circuit 102 is disposed in a region along the side SD2 which is different from the side SD1. For example, the oscillation circuit 102 is disposed so that a side (long side) of the circuit block of the oscillation circuit 102 is parallel to (substantially parallel to) the side SD2 of the integrated circuit device 10.

Specifically, in FIG. 5, the terminals P1 and P2 (pads) for oscillator connection are disposed on the direction DR1 side of the side SD1 of the integrated circuit device 10. For example, the terminals P1 and P2 are disposed in an I/O region (first I/O region) along the side SD1. The oscillation circuit 101 is disposed on the direction DR1 side of the terminals P1 and P2. The terminals P1 and P2 are connected to the oscillation circuit 101 via signal lines.

The terminals P3 and P4 (pads) for oscillator connection are disposed on the direction DR2 side of the side SD2 of the integrated circuit device 10. For example, the terminals P3 and P4 are disposed in an I/O region (second I/O region) along the side SD2. The oscillation circuit 102 is disposed on the direction DR2 side of the terminals P3 and P4. The terminals P3 and P4 are connected to the oscillation circuit 102 via signal lines.

The measurement unit 50 is disposed between, for example, the oscillation circuit 101 and the oscillation circuit 102. For example, the measurement unit 50 is disposed on the direction DR1 side of the oscillation circuit 101, and the oscillation circuit 102 is disposed on the direction DR1 side of the measurement unit 50. A terminal group PG1 is disposed in an I/O region (third I/O region) along the side SD3 of the integrated circuit device 10, and a terminal group PG2 is disposed in an I/O region (fourth I/O region) along the side SD4. The terminal groups PG1 and PG2 are connected to respective circuit blocks such as the measurement unit 50 via signal lines.

In FIG. 6, the oscillation circuit 101 is disposed in a region along the side SD1 of the integrated circuit device 10. On the other hand, the oscillation circuit 102 is disposed in a region along the side SD3 which is different from the side SD1.

Specifically, in FIG. 6, the terminals P1 and P2 are disposed on the direction DR1 side of the side SD1 of the integrated circuit device 10. The oscillation circuit 101 is disposed on the direction DR1 side of the terminals P1 and P2. The terminals P3 and P4 are disposed on the direction DR3 side of the side SD3 of the integrated circuit device 10. The oscillation circuit 102 is disposed on the direction DR3 side of the terminals P3 and P4. The measurement unit 50 is disposed on the direction DR1 side of the oscillation circuit 101 and on the direction DR3 side of the oscillation circuit 102.

As mentioned above, in FIGS. 5 and 6, the oscillation circuit 101 and the oscillation circuit 102 are disposed on different sides of the integrated circuit device 10. Therefore, for example, a distance between the oscillation circuit 101 and the oscillation circuit 102 can be increased, or a distance between the terminals P1 and P2 of the oscillation circuit 101 and the terminals P3 and P4 of the oscillation circuit 102 can be increased. Particularly, as illustrated in FIG. 5, if the oscillation circuits 101 and 102 are respectively disposed on the regions along the opposing sides, a distance between the oscillation circuit 101 and the oscillation circuit 102, or a distance between the terminals P1 and P2 of the oscillation circuit 101 and the terminals P3 and P4 of the oscillation circuit 102 can be sufficiently increased.

As mentioned above, if a layout is disposed so that a distance between the oscillation circuits or a distance between the terminals for oscillator connection is increased, for example, noise generated in one of the oscillation circuits 101 and 102 can be prevented from being transmitted to the other oscillation circuit. Therefore, it is possible to prevent performance (conversion accuracy or the like) of time-to-digital conversion from deteriorating due to the noise. In a case where the clock signals CK1 and CK2 from the oscillation circuits 101 and 102 are output to the measurement unit 50, signal lines for the clock signals CK1 and CK2 can be connected on short paths. Therefore, a signal delay amount of the clock signals CK1 and CK2 or a signal delay difference between both of the signals can be reduced so that a jitter can be reduced, and thus it is possible to improve time-to-digital conversion performance.

A layout arrangement of the integrated circuit device 10 is not limited to the arrangements illustrated in FIGS. 5 and 6, and may be variously modified. For example, circuit blocks other than the measurement unit 50 may be disposed in the integrated circuit device 10. There may be a modification in which the oscillation circuits 101 and 102 are disposed in a region along the same side of the integrated circuit device 10.

3. First Configuration Example

Figure 7:
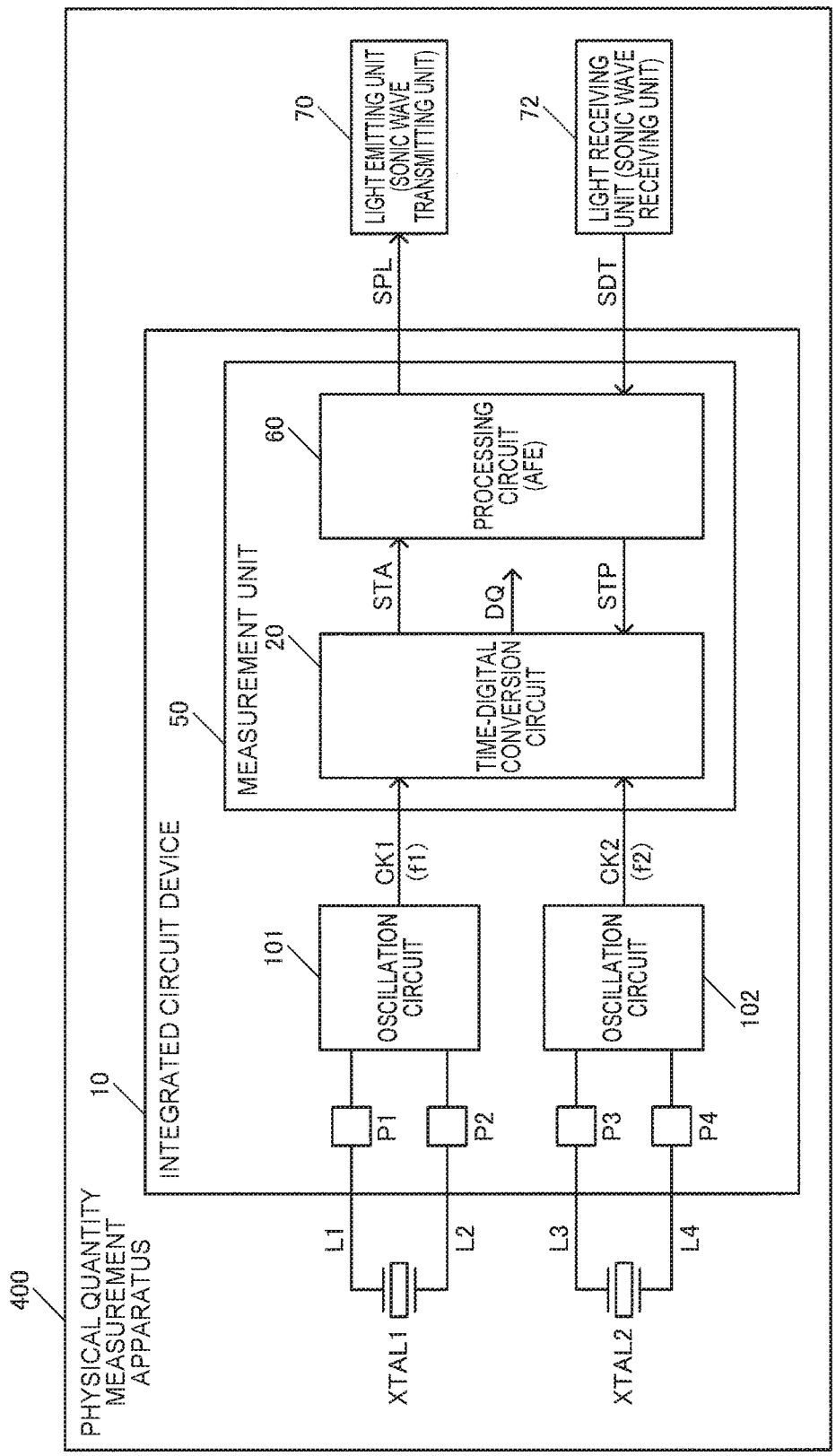
FIG. 7 illustrates a first configuration example of the physical quantity measurement apparatus according to the present embodiment.

FIG. 7 illustrates a first configuration example of the physical quantity measurement apparatus 400 according to the present embodiment. In FIG. 7, the time-to-digital conversion circuit 20 of the measurement unit 50 converts a time difference between transition timings of a signal STA (a first signal; for example, a start signal) and a signal STP (a second signal; for example, a stop signal) into the digital value DQ. The time difference between transition timings of the signal STA and the signal STP is a time difference between edges (for example, between rising edges or between falling edges) of the signal STA and the signal STP. Hereinafter, a description will be made focusing on a case where a method according to the present embodiment is applied to time-to-digital conversion in which a time difference between transition timings of the signals STA and STP (first and second signals) is converted into a digital value, but the present embodiment is not limited thereto. The method according to the present embodiment may be applied to, for example, time-to-digital conversion for measuring an absolute time point or the like.

Specifically, the time-to-digital conversion circuit 20 obtains a digital value DQ corresponding to a time difference between transition timings of the signal STA and the signal STP by using the clock signals CK1 and CK2 generated by the oscillation circuits 101 and 102. For example, phases of the clock signals CK1 and CK2 are synchronized with each other, and, after the phase synchronization timing, the time-to-digital conversion circuit 20 causes the a signal level of the signal STA to transition by using the clock signal CK1. For example, a signal level of the signal STA is changed from a first voltage level (for example, an "L" level) to a second voltage level (for example, an "H" level). Specifically, the time-to-digital conversion circuit 20 generates the signal STA as a pulse signal.

The time-to-digital conversion circuit 20 compares a phase of the signal STP whose signal level transitions so as to correspond to the signal STA with a phase of the clock signal CK2 so as to obtain a digital value DQ corresponding to a time difference. For example, a timing at which the chronological order of phases of the signal STP and the clock signal CK2 changes is determined through phase comparison, and the digital value DQ is obtained. The timing at which the chronological order of phases changes is a timing at which a state in which a phase of one of the signal STP and the clock signal CK2 delays with respect to a phase of the other signal changes to a state in which the phase of one signal advances with respect to the phase of the other signal. Such phase comparison between the signal STP and the clock signal CK2 may be performed by, for example, sampling the other signal on the basis of one of the signal STP and the clock signal CK2. Alternatively, a comparison process for phase comparison may be performed by using a first count value based on the clock signal CK1 and a second count value based on the clock signal CK2.

As mentioned above, in FIG. 7, the signal STA is generated on the basis of the clock signal CK1, a phase of the signal STP whose signal level transitions so as to correspond to the generated signal STA is compared with a phase of the clock signal CK2, and the digital value DQ corresponding to a time difference between transition timings of the signal STA and the signal STP is obtained. In the above-described way, it is possible to realize time-to-digital conversion with high performance (high accuracy and a high resolution) while voluntarily generating the first signal used for the time-to-digital conversion.

The measurement unit 50 includes the processing circuit 60 which performs signal processing on a detection signal corresponding to a physical quantity, and the processing circuit 60 performs, for example, a waveform shaping process on the detection signal.

Specifically, the physical quantity measurement apparatus 400 illustrated in FIG. 7 includes a light emitting unit 70 which irradiates a target object with light, and a light receiving unit 72 which receives light from the target object. The processing circuit 60 which is an analog front-end circuit (AFE) receives the signal STA generated from the time-to-digital conversion circuit 20, and outputs a drive signal SPL to the light emitting unit 70. For example, the processing circuit 60 has a pulse signal generation circuit for driving the light emitting unit 70, and outputs the drive signal SPL which is a pulse signal to the light emitting unit 70. The light emitting unit 70 is formed of, for example, a laser device or an LED, and emits light (laser light or the like) to a target object on the basis of the drive signal SPL.

The light receiving unit 72 receives light from the target object. For example, reflected light of light emitted from the light emitting unit 70 is received. For example, an analog detection signal SDT is output to the processing circuit 60. The processing circuit 60 performs signal processing such as a waveform shaping process on the detection signal SDT. The signal STP having undergone signal processing is output to the time-to-digital conversion circuit 20.

Instead of the light emitting unit 70 and the light receiving unit 72 in FIG. 7, a sonic wave transmitting unit which transmits a sonic wave to a target object and a sonic wave receiving unit which receives a sonic wave from the target object may be provided in the physical quantity measurement apparatus 400. In this case, the sonic wave transmitting unit transmits a sonic wave (an ultrasonic wave or the like) to the target object on the basis of the drive signal SPL from the processing circuit 60. The sonic wave receiving unit receives a sonic wave (an ultrasonic wave echo or the like) from the target object, and outputs, for example, the analog detection signal SDT to the processing circuit 60. The processing circuit 60 performs signal processing such as a waveform shaping process on the detection signal SDT, and outputs the signal STP having undergone signal processing to the time-to-digital conversion circuit 20.

Figure 8:
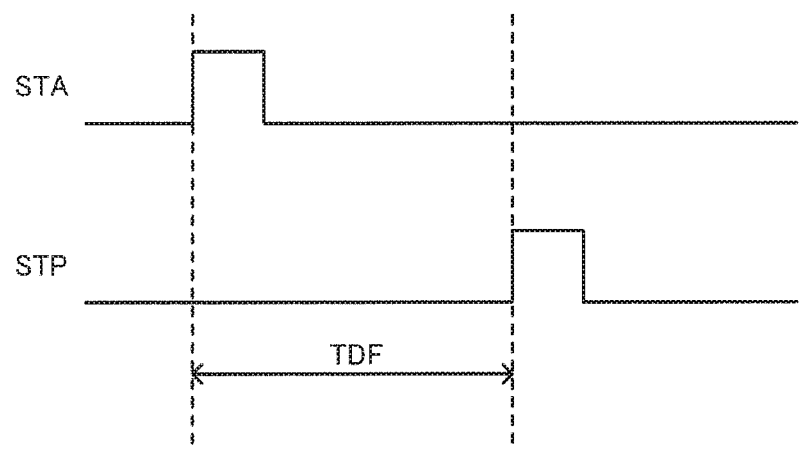
FIG. 8 is a diagram illustrating a relationship between signals STA and STP.

FIG. 8 is a diagram illustrating a relationship between the signal STA (a first signal or a start signal) and the signal STP (a second signal or a stop signal). The time-to-digital conversion circuit 20 according to the present embodiment converts a time difference TDF between transition timings of the signal STA and the signal STP into a digital value. In FIG. 8, the time difference TDF is a time difference between rising transition timings (between rising edges) of the signal STA and the signal STP, but may be a time difference between falling transition timings (between falling edges) of the signal STA and the signal STP.

Figure 9:
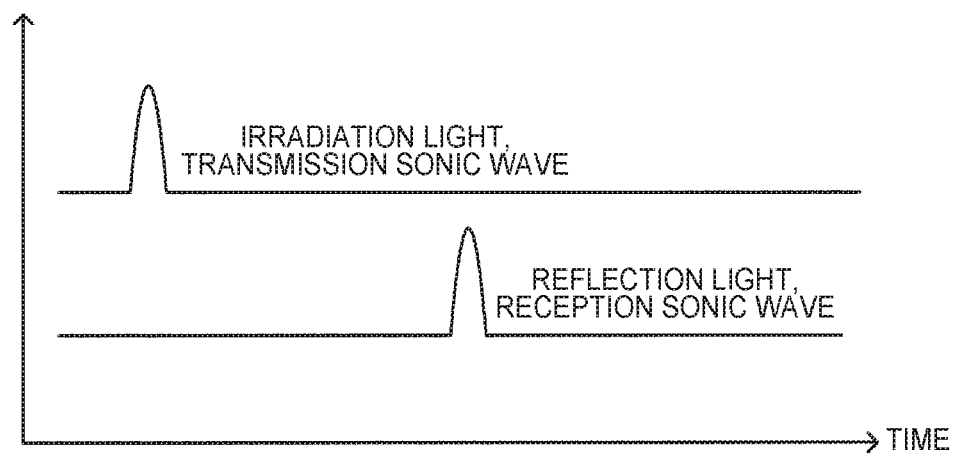
FIG. 9 is a diagram illustrating an example of physical quantity measurement using the signals STA and STP.

FIG. 9 is a diagram illustrating an example of physical quantity measurement using the signals STA and STP. For example, the light emitting unit 70 in FIG. 7 emits irradiation light (for example, laser light) to a target object (for example, an object around a car) by using the signal STA. Specifically, the light emitting unit 70 emits the irradiation light to the target object by using, for example, the drive signal SPL based on the signal STA. The light receiving unit 72 receives reflected light or the like from the target object so as to generate the signal STP. Specifically, the light receiving unit 72 having received the reflected light outputs the detection signal SDT which is a light reception signal to the processing circuit 60, and the processing circuit 60 outputs the signal STP which is generated by shaping a waveform of the detection signal SDT, to the time-to-digital conversion circuit 20. If the time difference TDF between transition timings of the signal STA and the signal STP is converted into a digital value in the above-described way, a distance from the target object can be measured as a physical quantity, for example, in a time-of-flight (TOF) method, and this can be used for automatic driving of a car, for example.

Alternatively, a sonic wave transmitting unit may be provided in the physical quantity measurement apparatus 400, and the sonic wave transmitting unit may transmit a transmission sonic wave (for example, an ultrasonic wave) to a target object (for example, a living body) by using the signal STA. Specifically, the sonic wave transmitting unit emits the sonic wave to the target object by using, for example, the drive signal SPL based on the signal STA. A sonic wave receiving unit receives a reception sonic wave from the target object so as to generate the signal STP. Specifically, the sonic wave receiving unit having received the sonic wave outputs the detection signal SDT which is a reception signal to the processing circuit 60, and the processing circuit 60 outputs the signal STP which is generated by shaping a waveform of the detection signal SDT, to the time-to-digital conversion circuit 20. If the time difference TDF between transition timings of the signal STA and the signal STP is converted into a digital value in the above-described way, for example, a distance from the target object can be measured, and thus it is possible to measure biological information by using an ultrasonic wave.

In FIGS. 8 and 9, time from transmission of transmission data to reception of reception data may be measured by transmitting the transmission data on the basis of the signal STA and by using the signal STP which is generated through reception of the reception data. A physical quantity measured by the physical quantity measurement apparatus of the present embodiment is not limited to time and a distance, and various physical quantities such as a flow rate, a flow velocity, a frequency, velocity, acceleration, angular velocity, and angular acceleration may be measured.

As mentioned above, in the present embodiment, the processing circuit 60 performs signal processing on a detection signal corresponding to a physical quantity. For example, a detection signal (SDT) corresponding to a physical quantity which is at least one of time, a distance, flow rate, flow velocity, and a frequency is input to the processing circuit 60, and the processing circuit 60 performs signal processing on the detection signal. In the above-described way, it is possible to perform a measurement process of a physical quantity such as time by using a signal obtained by performing signal processing on a detection signal, and thus to realize an appropriate physical quantity measurement process. For example, in FIG. 7, the processing circuit 60 performs a waveform shaping process on the detection signal SDT. In the above-described way, even in a case where a waveform of the detection signal SDT which is an analog signal is not sharp, it is possible to perform a measurement process of a physical quantity such as time by using the signal STP whose waveform is shaped through the waveform shaping process.

In FIG. 7, the light emitting unit 70 (or the sonic wave transmitting unit) and the light receiving unit 72 (or the sonic wave receiving unit) are provided in the physical quantity measurement apparatus 400. With this configuration, for example, the light emitting unit 70 emits (transmits) light (sonic wave) to a target object, and the light receiving unit 72 receives light (sonic wave), so that a physical quantity such as a distance can also be measured by using the time-to-digital conversion circuit 20. In the present embodiment, since the time-to-digital conversion circuit 20 can convert time into a digital value with high accuracy, it is possible to achieve high accuracy of physical quantity measurement.

4. Second Configuration Example

Figure 10:
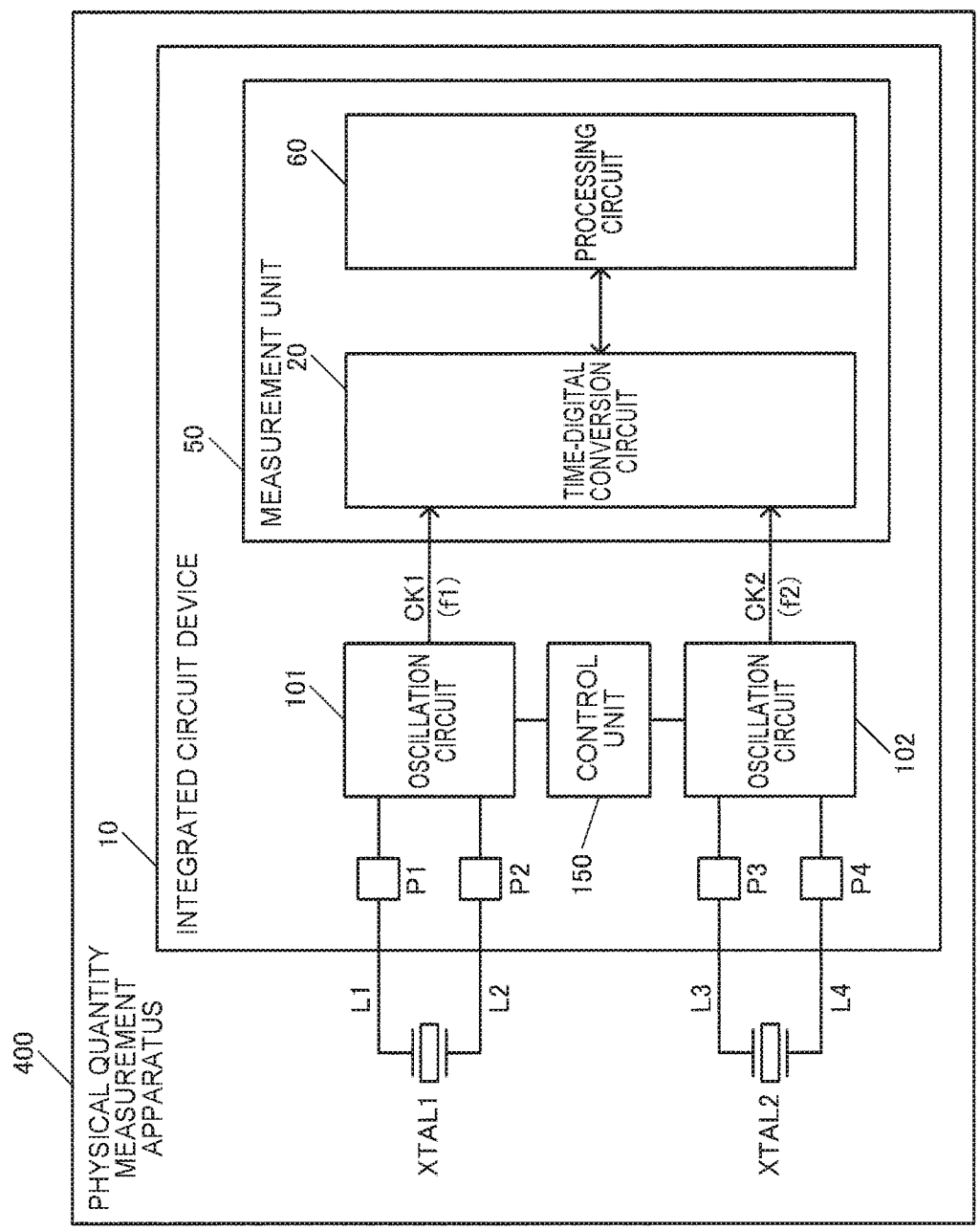
FIG. 10 illustrates a second configuration example of the physical quantity measurement apparatus according to the present embodiment.

FIG. 10 illustrates a second configuration example of the physical quantity measurement apparatus 400 according to the present embodiment. In the second configuration example illustrated in FIG. 10, a control unit 150 is further provided in the configuration illustrated in FIG. 1. The control unit 150 controls at least one of the oscillation circuits 101 and 102. For example, the control unit 150 controls both of the oscillation circuits 101 and 102 or controls one of the oscillation circuits.

For example, in the technique of the related art disclosed in JP-A-5-87954, the first and second quartz crystal oscillators operate in a free running method without being controlled at all. In contrast, in FIG. 10, the control unit 150 controls an operation or setting of at least one of the oscillation circuits 101 and 102. For example, the control unit 150 controls a circuit operation such as an oscillation operation of at least one oscillation circuit, or controls setting of a circuit constant such as an oscillation frequency or a phase. In the above-described way, for example, a frequency relationship or a phase relationship of the clock signals CK1 and CK2 can be set to a frequency relationship or a phase relationship appropriate for time-to-digital conversion under the control of the control unit 150. Consequently, it is possible to realize high performance or simplification of a time-to-digital conversion process.

Figure 11:
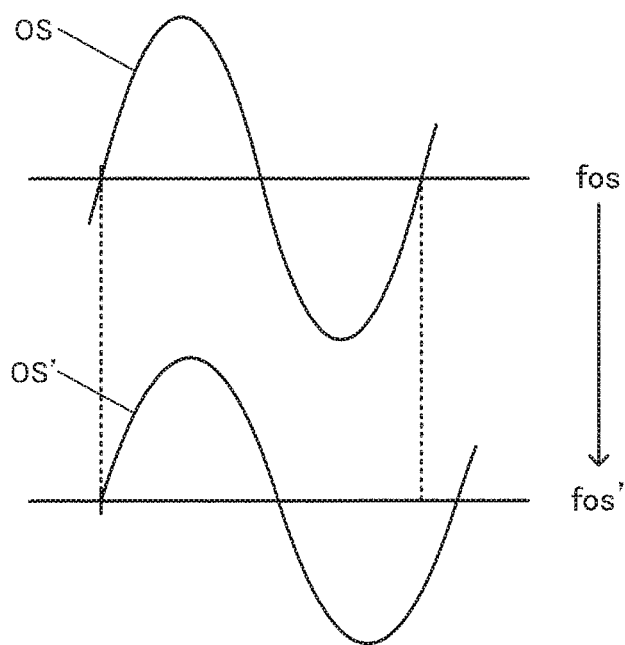
FIG. 11 is a diagram for explaining control for an oscillation frequency of an oscillation signal.

Specifically, the control unit 150 controls at least one of an oscillation frequency and a phase of an oscillation signal of at least one of the oscillation circuits 101 and 102. For example, in FIG. 11, the control unit 150 performs control of changing an oscillation frequency of an oscillation signal OS (OS1 or OS2 which will be described later) of at least one of the oscillation circuits from fos to fos'. For example, the control unit 150 performs control of changing an oscillation frequency so that the clock signals CK1 and CK2 have a predetermined frequency relationship. As an example, the control unit 150 controls an oscillation frequency of at least one oscillation circuit so that phases of the clock signals CK1 and CK2 are synchronized with each other at a phase synchronization timing as in FIG. 19 which will be described later.

Figure 12:
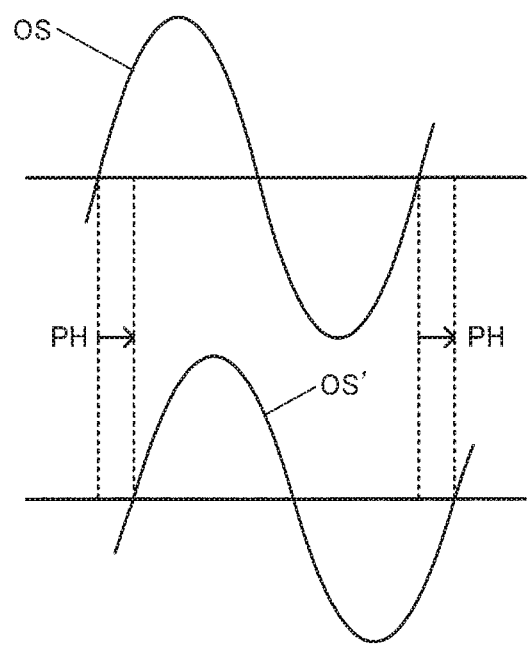
FIG. 12 is a diagram for explaining control for a phase of an oscillation signal.

In FIG. 12, the control unit 150 performs control of changing a phase of the oscillation signal OS of at least one oscillation circuit as indicated by PH. For example, the control unit 150 performs control of changing a phase so that the clock signals CK1 and CK2 have a predetermined phase relationship. As an example, as in FIG. 17 which will be described later, the control unit 150 controls a phase of at least one oscillation circuit so that phases of the clock signals CK1 and CK2 are synchronized with each other at a phase synchronization timing.

If the control unit 150 controls an oscillation frequency or a phase of an oscillation signal in the above-described way, for example, a frequency relationship or a phase relationship of the clock signals CK1 and CK2 can be set to a frequency relationship or a phase relationship appropriate for time-to-digital conversion. Therefore, since time-to-digital conversion can be performed by using the clock signals CK1 and CK2 set to have the appropriate frequency relationship or phase relationship, it is possible to realize high performance or simplification of a time-to-digital conversion process.

The control of an oscillation frequency of the oscillation signal can be realized by controlling, for example, a capacitance value of a variable capacitance circuit provided in the oscillation circuit. The control of a phase of the oscillation signal can be realized through connection to an oscillation loop in the synchronization circuit 110 which will be described later.

The control unit 150 controls at least one of the oscillation circuits 101 and 102 so that the clock signal CK1 and the clock signal CK2 have a predetermined frequency relationship or a predetermined phase relationship. For example, at least one oscillation circuit is controlled so that a frequency relationship or a phase relationship appropriate for time-to-digital conversion is obtained. As an example, at least one oscillation circuit is controlled so that a frequency difference or a phase difference between the clock signals CK1 and CK2 becomes a predetermined frequency difference or a predetermined phase difference. Alternatively, at least one oscillation circuit is controlled so that phases of the clock signals CK1 and CK2 are synchronized with each other at a phase synchronization timing. For example, at least one oscillation circuit is controlled so that transition timings of the clock signals CK1 and CK2 match (substantially match) each other at a phase synchronization timing.

The frequency relationship of the clock signals CK1 and CK2 is, for example, a relationship of a frequency difference between the clock frequencies f1 and f2 of the clock signals CK1 and CK2, a relationship of a frequency ratio, a predetermined relational expression expressed by a clock frequency, or a relationship of frequency magnitude. The phase relationship of the clock signals CK1 and CK2 is, for example, a relationship of a phase difference between the clock signals CK1 and CK2 or the chronological order of phases. For example, the control unit 150 controls at least one of the oscillation circuits 101 and 102 so that a frequency relationship (a frequency difference, a magnitude relationship, a frequency ratio, or the like) or a phase relationship (a phase difference, the chronological order of phases, or the like) of the clock signals CK1 and CK2 are maintained to be a predetermined relationship. In the above-described way, time-to-digital conversion can be performed in a state in which a frequency relationship or a phase relationship of the clock signals CK1 and CK2 is appropriate, and thus it is possible to realize high performance or simplification of a time-to-digital conversion process.

Specifically, in a case where clock frequencies of the clock signals CK1 and CK2 are respectively indicated by f1 and f2, the control unit 150 controls at least one of the oscillation circuits 101 and 102 so that a relationship of $N/f1=M/f2$ is obtained. In the above-described way, it is possible to perform time-to-digital conversion in a state in which the clock signals CK1 and CK2 have an appropriate frequency relationship.

Figure 13:
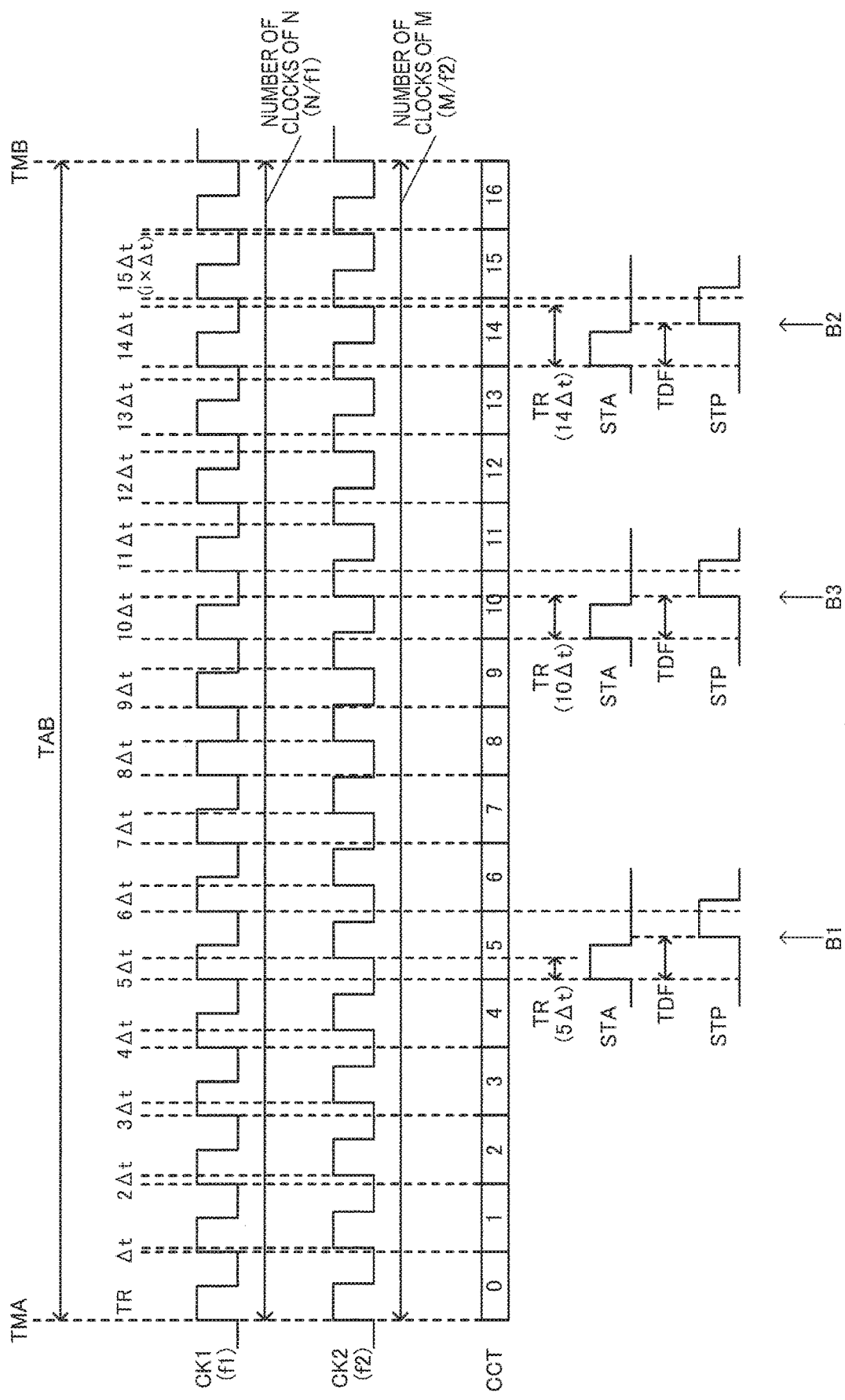
FIG. 13 is a signal waveform diagram for explaining time-to-digital conversion in the present embodiment.

FIG. 13 is a signal waveform diagram for explaining time-to-digital conversion according to the present embodiment. In FIG. 13, at a phase synchronization timing TMA, phases of the clock signals CK1 and CK2 are synchronized with each other, and transition timings of the clock signals CK1 and CK2 match each other. Next, as described in FIG. 2, a time difference between transition timings of the clock signals CK1 and CK2 increases by $\Delta t$ for each clock cycle (CCT), such as $\Delta t$, $2\Delta t$, $3\Delta t$, . . . . At the next phase synchronization timing TMB, phases of the clock signals CK1 and CK2 are synchronized with each other, and transition timings of the clock signals CK1 and CK2 match each other.

As illustrated in FIG. 13, a length of a period TAB between the phase synchronization timings TMA and TMB is a length corresponding to the number of clocks of N of the clock signal CK1. The length of the period TAB is a length corresponding to the number of clocks of M of the clock signal CK2. Here, N and M are integers of 2 or more which are different from each other. For example, in FIG. 13, N is 17, M is 16, and N−M is 1.

For example, in a case where the length of the period TAB is indicated by the same reference sign TAB, in FIG. 13, a relationship of TAB=N/f1=M/f2 is obtained. In other words, the clock frequencies f1 and f2 have a relationship of N/f1=M/f2. For example, if the clock frequency f2 is set to f2=16 MHz, N is set to 17, and M is set to 16, f1 is 17 MHz, and thus a relational expression of N/f1=M/f2 is established. The control unit 150 controls at least one of the oscillation circuits 101 and 102 so that such a relationship of N/f1=M/f2 is established.

In the above-described way, as illustrated in FIG. 13, transition timings of the clock signals CK1 and CK2 match each other at the phase synchronization timing TMA, and then the inter-clock time difference TR of the clock signals CK1 and CK2 increases by Δt, such as Δt, 2Δt, 3Δt, . . . . In other words, it is possible to generate the inter-clock time difference TR of the clock signals CK1 and CK2 which increases by Δt for each clock cycle. Transition timings of the clock signals CK1 and CK2 match each other at the next phase synchronization timing TMB, and thus the inter-clock time difference TR becomes 0. Thereafter, the inter-clock time difference TR increases by Δt for each clock cycle.

Since the inter-clock time difference TR which becomes 0 at a phase synchronization timing, and then increases by Δt (resolution) is generated, it is possible to perform a process related to time-to-digital conversion (a first method, a second method, a repetition method, an update method, and a binary method). In other words, it is possible to perform time-to-digital conversion of converting time into a digital value at the resolution Δt. In a time-to-digital conversion process at the resolution Δt, as illustrated in FIG. 13, the inter-clock time difference TR in each clock cycle (CCT) in the period TAB can be uniquely specified, and thus it is possible to simplify a process or a circuit configuration related to time-to-digital conversion. Since transition timings of the clock signals CK1 and CK2 match (substantially match) each other at the phase synchronization timings TMA and TMB, it is also possible to improve the accuracy of time-to-digital conversion.

For example, as a method of a comparative example of the present embodiment, there may be a method in which a clock frequency is set in terms of design so that a relationship of N/f1=M/f2 is established without the control unit 150 controlling at least one oscillation circuit. For example, in the technique of the related art disclosed in JP-A-5-87954, the method is a method in which a relationship of N/f1=M/f2 is established as a relationship of clock frequencies in terms of design of the first and second quartz crystal oscillators.

However, clock frequencies obtained by the first and second quartz crystal oscillators vary due to a manufacturing variation or environmental variations such as a temperature variation. Therefore, even if a relationship of N/f1=M/f2 is established in terms of design, the relationship of N/f1=M/f2 may not be established in an actual product. Thus, since deviation occurs between transition timings, the accuracy of time-to-digital conversion is reduced.

In contrast, in the present embodiment, even in a case where there are variations in clock frequencies due to a manufacturing variation or environmental variations such as a temperature variation, the control unit 150 controls at least one of the oscillation circuits 101 and 102 so that the clock signals CK1 and CK2 have a predetermined frequency relationship or a predetermined phase relationship. For example, at least one oscillation circuit is controlled so that a relationship of N/f1=M/f2 is established. Consequently, a frequency relationship or a phase relationship of the clock signals CK1 and CK2 is adjusted so that variations due to a management variation or an environmental variation are compensated for. Therefore, even in a case where such variations occur, it is possible to perform appropriate time-to-digital conversion. It is possible to reduce a conversion error caused by deviation between transition timings of the clock signals CK1 and CK2 at the phase synchronization timings TMA and TMB, and thus to realize high performance time-to-digital conversion.

As mentioned above, in the present embodiment, the control unit 150 controls the oscillation circuit so that a relational expression of N/f1=M/f2 is established. As described in FIG. 2, the resolution Δt in time-to-digital conversion of the present embodiment may be expressed by a relational expression of Δt=|f1−f2|/(f1×f2). Therefore, the following Equation (1) is established on the basis of the two relational expressions.

$$\Delta t = |N-M|/(N \times f2) = |N-M|/(M \times f1) \qquad (1)$$

In the above-described way, the clock signals CK1 and CK2 can be generated by setting N, M, and the like according to the resolution Δt required for time-to-digital conversion.

For example, as a resolution in time-to-digital conversion, a resolution of Δt=2 nanoseconds (ns) is assumed to be required. A clock frequency of the clock signal CK2 is assumed to be f2=100 MHz. In this case, in the above Equation (1), if N=5, and M=4 are set, it is possible to perform time-to-digital conversion at the resolution Δt=|5−4|/(5×f2)=2 ns. In this case, from a relational expression of N/f1=M/f2, a clock frequency of the clock signal CK1 is f1=(N/M)×f2=125 MHz.

As a resolution in time-to-digital conversion, a resolution of Δt=1 picoseconds (ps) is assumed to be required. A clock frequency of the clock signal CK2 is assumed to be f2=122.865 MHz. In this case, in the above Equation (1), if N=8139, and M=8138 are set, it is possible to perform time-to-digital conversion at the resolution Δt=|8139−8138|/(8139×f2)=1 ps. In this case, from a relational expression of N/f1=M/f2, a clock frequency of the clock signal CK1 is f1=(N/M)×f2=122.880 MHz.

In the present embodiment, the time-to-digital conversion circuit 20 converts the time difference TDF between transition timings of the signal STA and the signal STP into a digital value. In this case, in FIG. 13, after the phase synchronization timing TMA of the clock signals CK1 and CK2, the inter-clock time difference TR which is a time difference between transition timings of the clock signals CK1 and CK2 is first to i-th clock cycles (where i is an integer of 2 or more) is Δt to i×Δt. For example, in the first clock cycle (CCT=1) after the phase synchronization timing TMA, the inter-clock time difference TR is Δt. Similarly, the inter-clock time difference TR is 2Δt to 14Δt in the second to fourteenth clock cycles (CCT=2 to 14). The inter-clock time difference TR is 15Δt (i×Δt) in the fifteenth clock cycle (in a broad sense, an i-th clock cycle; CCT=i=15). As mentioned above, since an inter-clock time difference of the clock signals CK1 and CK2 increases by Δt after the phase synchronization timing TMA, an inter-clock time difference in a j-th clock cycle (where 1≤j≤i) is TR=j×Δt.

In the time-to-digital conversion method of the present embodiment, the time-to-digital conversion circuit 20 specifies that the time difference TDF between transition timings of the signal STA and the signal STP corresponds to anyone of TR=Δt to i×Δt which are inter-clock time differences between transition timings of the clock signals CK1 and CK2, so as to obtain the digital value DQ.

For example, in a clock cycle (CCT=5) indicated by B1 in FIG. 13, an inter-clock time difference is TR=5Δt. As indicated by B1, the time difference TDF of the signals STA and STP is longer than the inter-clock time difference TR=5Δt. In other words, a relationship of TDF>TR=5Δt is obtained.

In a clock cycle (CCT=14) indicated by B2, an inter-clock time difference is TR=14Δt. As indicated by B2, the time difference TDF of the signals STA and STP is shorter than the inter-clock time difference TR=14Δt. In other words, a relationship of TDF<TR=14Δt is obtained.

In a clock cycle (CCT=10) indicated by B3, an inter-clock time difference is TR=10Δt. As indicated by B3, the time difference TDF of the signals STA and STP is the same as (substantially the same as) the inter-clock time difference TR=10Δt. In other words, a relationship of TDF=TR=10Δt is obtained. Therefore, it is satisfied that the time difference TDF of the signals STA and STP corresponds to the inter-clock time difference TR=10Δt. As a result, it can be determined that the digital value DQ corresponding to the time difference TDF is a digital value corresponding to TR=10Δt.

In the above-described way, it is possible to obtain the time difference TDF of the signal STA and the signal STP by using the inter-clock time difference TR which increases by Δt after the phase synchronization timing TMA. Therefore, it is possible to perform time-to-digital conversion by effectively using the clock signals CK1 and CK2 having different clock frequencies.

Figure 14:
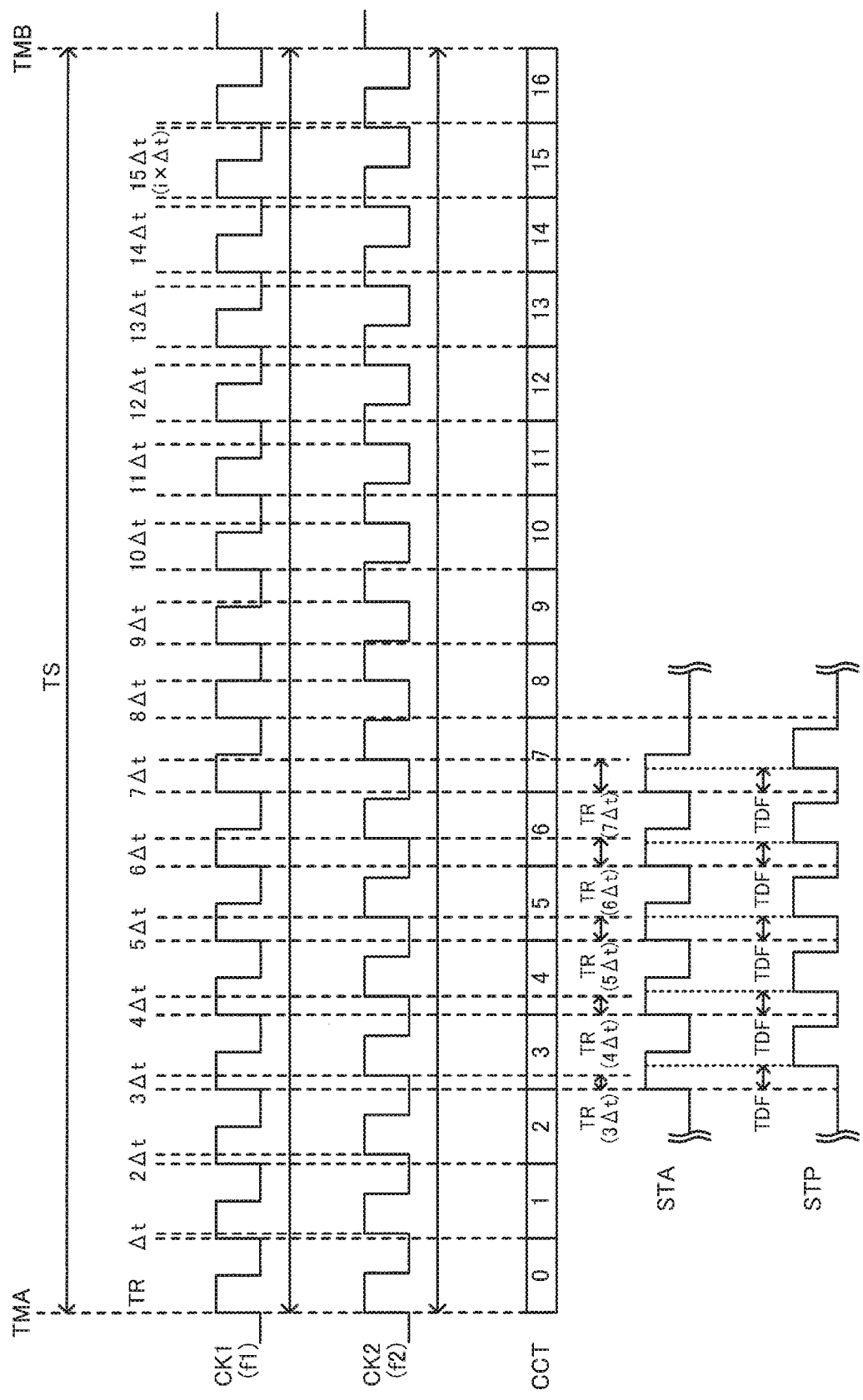
FIG. 14 is a signal waveform diagram for explaining a first method of time-to-digital conversion.

Here, a method of performing time-to-digital conversion of the present embodiment in FIG. 13 includes a first method and a second method. FIG. 14 is a signal waveform diagram for explaining the first method. The first method related to time-to-digital conversion includes a repetition method and the like which will be described later.

For example, in FIG. 14, a period (a period between first and second phase synchronization timings) between the phase synchronization timings TMA and TMB of the clock signals CK1 and CK2 is set as a measurement period TS. The phase synchronization timing TMB is the next phase synchronization timing of the phase synchronization timing TMA.

In this case, the time-to-digital conversion circuit 20 generates a plurality of signals STA in a plurality of clock cycles of the measurement period TS. For example, in FIG. 14, the pulse signals STA are generated in the third to seventh clock cycles (CCT=3 to 7). The time-to-digital conversion circuit 20 acquires (receives) a plurality of signals STP whose signal levels changed so as to correspond to the plurality of generated signals STA. For example, the signal STP whose signal level changes so as to correspond to the signal STA generated in the third clock cycle (CCT=3) is acquired (received). Similarly, the respective signals STP whose signal levels change so as to correspond to the signals STA generated in the fourth, fifth, sixth and seventh clock cycles (CCT=4, 5, 6 and 7) are acquired.

The time-to-digital conversion circuit 20 performs a comparison process of comparing the time difference TDF of the signal STA and the signal STP in each of the plurality of clock cycles with the inter-clock time difference TR in each clock cycle, and obtains the digital value DQ on the basis of a result of the comparison process. For example, in FIG. 14, a comparison process is performed between each of the inter-clock time difference TR=3Δt, 4Δt, 5Δt, 6Δt and 7Δt in the third, fourth, fifth, sixth and seventh clock cycles (CCT=3, 4, 5, 6, and 7), and the time difference TDF. As results of the comparison process in each clock cycle, TDF>3Δt, TDF>4Δt, TDF=5Δt, TDF<6Δt, and TDF<7Δt are obtained. Therefore, the digital value DQ corresponding to the time difference TDF of the signal STA and the signal STP is determined to be a digital value corresponding to, for example, TR=5Δt.

As mentioned above, in the first method in FIG. 14, a plurality of signals STA are continuously generated in a plurality of clock cycles. A plurality of signals STP whose signal level transition so as to correspond to the plurality of signals STA are acquired, and a comparison process of comparing the time difference TDF of each signal STA and each corresponding signal STP with the inter-clock time difference TR in each clock cycle is performed. The inter-clock time difference TR in each clock cycle increases by Δt as illustrated in FIG. 14, and thus a digital value corresponding to the time difference TDF can be obtained through the comparison process. In the above-described way, it is possible to specify that the time difference TDF corresponds to any one of the inter-clock time differences TR=Δt to 15Δt (Δt to i×Δt) in FIG. 14 in a single measurement period TS. Therefore, it is possible to perform time-to-digital conversion at a high speed.

Figure 15:
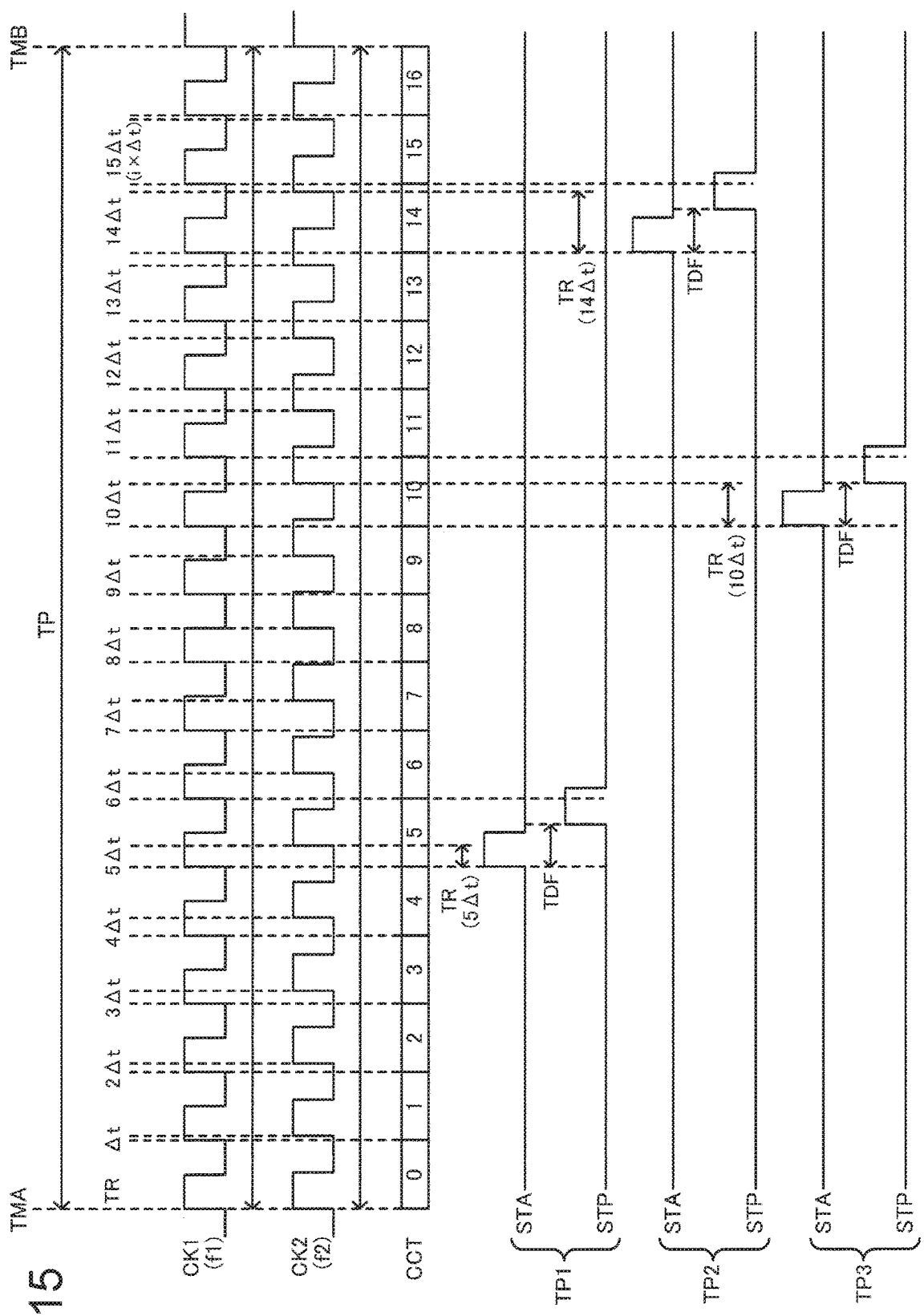
FIG. 15 is a signal waveform diagram for explaining a second method of time-to-digital conversion.

FIG. 15 is a signal waveform diagram for explaining the second method related to time-to-digital conversion of the present embodiment. The second method related to time-to-digital conversion includes an update method, a binary search method, and the like.

For example, in FIG. 15, a period between the phase synchronization timings TMA and TMB of the clock signals CK1 and CK2 is set as an update period TP. Specifically, in FIG. 15, a period between first and second phase synchronization timings of the clock signals CK1 and CK2 is an update period TP1 (first update period), a period between second and third phase synchronization timings is an update period TP2 (second update period), and a period between third and fourth phase synchronization timings is an update period TP3 (third update period). The update period TP2 is the next update period of TP1, and the update period TP3 is the next update period of TP2. This is also the same for the subsequent update periods.

In this case, as illustrated in FIG. 15, in the update period of TP1, the time-to-digital conversion circuit 20 generates the signal STA in, for example, the fifth clock cycle (in a broad sense, an m-th clock cycle where m is an integer of 1 or more; CCT=5), and acquires the signal STP whose signal level changes so as to correspond to the generated signal STA. The time-to-digital conversion circuit 20 performs a comparison process of comparing the time difference TDF of the signal STA and the signal STP in the fifth clock cycle (m-th clock cycle) with the inter-clock time difference TR=5Δt. Herein, a relationship of TDF>TR=5Δt is obtained, that is, as a result of the comparison process, the time difference TDF is longer than the inter-clock time difference TR=5Δt.

In the next update period of TP2 of the update period of TP1, the signal STA in the fourteenth clock cycle (in abroad sense, an n-th clock cycle where n is an integer of 1 or more; m and n are different integers; CCT=14) which is set according to the result of the comparison process in the update period of TP1 is generated, and the signal STP whose signal level changes so as to correspond to the generated signal STA is acquired. For example, in the update period of TP1, as the result of the comparison process, the time difference TDF is longer than the inter-clock time difference TR=5Δt. Thus, a clock cycle is set so that the inter-clock time difference TR is longer in the next update period of TP2. For example, in the update period of TP1, the signal STA is generated in the fifth clock cycle in which the inter-clock time difference is TR=5Δt, but, in the update period of TP2, the signal STA is generated in the fourteenth clock cycle in which the inter-clock time difference is TR=14Δt. The time-to-digital conversion circuit 20 performs a comparison process of comparing the time difference TDF of the signal STA and the signal STP in the fourteenth clock cycle (n-th clock cycle) with the inter-clock time difference TR=14Δt. Herein, a relationship of TDF<TR=14Δt is obtained, that is, as a result of the comparison process, the time difference TDF is shorter than the inter-clock time difference TR=14Δt.

In the next update period of TP3 of the update period of TP2, the signal STA in the tenth clock cycle (CCT=10) which is set according to the result of the comparison process in the update period of TP2 is generated, and the signal STP whose signal level changes so as to correspond to the generated signal STA is acquired. For example, in the update period of TP2, as the result of the comparison process, the time difference TDF is shorter than the inter-clock time difference TR=14Δt. Thus, a clock cycle is set so that the inter-clock time difference TR is shorter in the next update period of TP3. For example, in the update period of TP2, the signal STA is generated in the fourteenth clock cycle in which the inter-clock time difference is TR=14Δt, but, in the update period of TP3, the signal STA is generated in the tenth clock cycle in which the inter-clock time difference is TR=10Δt. The time-to-digital conversion circuit 20 performs a comparison process of comparing the time difference TDF of the signal STA and the signal STP in the tenth clock cycle with the inter-clock time difference TR=10Δt. Herein, a relationship of TDF=TR=10Δt is obtained, that is, as a result of the comparison process, the time difference TDF is the same as (substantially the same as) the inter-clock time difference TR=10Δt. Therefore, the digital value DQ corresponding to the time difference TDF of the signal STA and the signal STP is determined to be a digital value corresponding to, for example, TR=10Δt.

As mentioned above, in the second method illustrated in FIG. 15, a result of a comparison process in the previous update period is fed back so that a clock cycle in which the signal STA is generated is set in this update period, and a comparison process between the time difference TDF and the inter-clock time difference TR is performed. In other words, since a result of a comparison process in the previous update period is fed back, it is possible to perform time-to-digital conversion at a high speed compared with, for example, the technique of the related art disclosed in JP-A-5-87954. Even in a case where time or a physical quantity as a measurement target dynamically changes, it is possible to perform time-to-digital conversion tracking the dynamic change.

The comparison process of comparing the time difference TDF with the inter-clock time difference TR may be performed through phase comparison between the signal STP and the clock signal CK2, described in a repetition method, an update method, and a binary search method which will be described later. Alternatively, the comparison process may be performed by using a first count value based on the clock signal CK1 or a second count value based on the clock signal CK2. For example, the comparison process may be performed by using first and second count values at a timing at which a signal level of the signal STP changes.

5. Third Configuration Example

Figure 16:
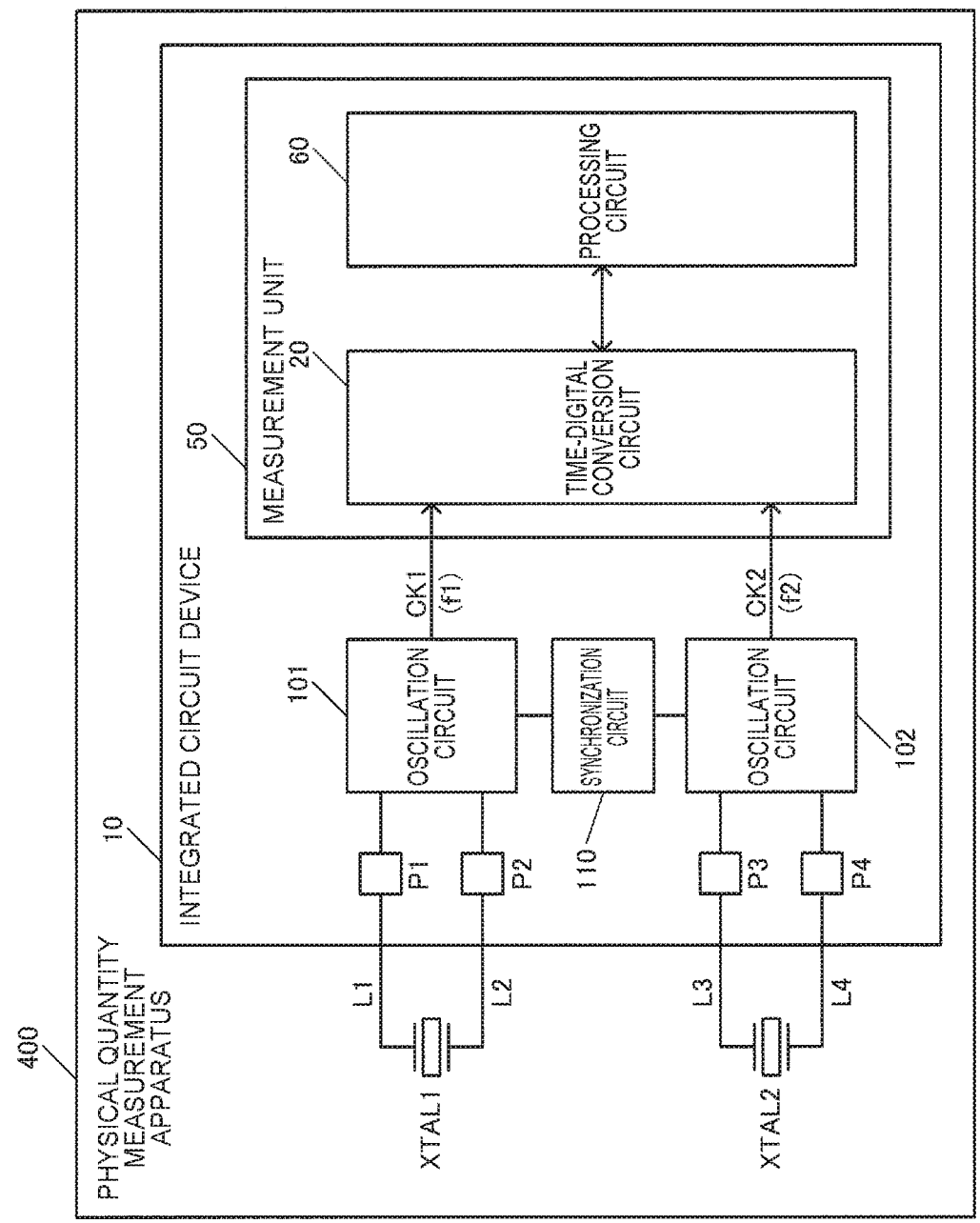
FIG. 16 illustrates a third configuration example of the physical quantity measurement apparatus according to the present embodiment.

FIG. 16 illustrates a third configuration example of the integrated circuit device 10 according to the present embodiment. In the third configuration example in FIG. 16, the synchronization circuit 110 is provided as the control unit 150 in FIG. 10.

The synchronization circuit 110 performs phase synchronization between the clock signal CK1 and the clock signal CK2. For example, the synchronization circuit 110 performs phase synchronization between the clock signal CK1 and the clock signal CK2 at each phase synchronization timing (at each predetermined timing). Specifically, phase synchronization is performed so that transition timings of the clock signals CK1 and CK2 match each other at each phase synchronization timing.

Figure 17:
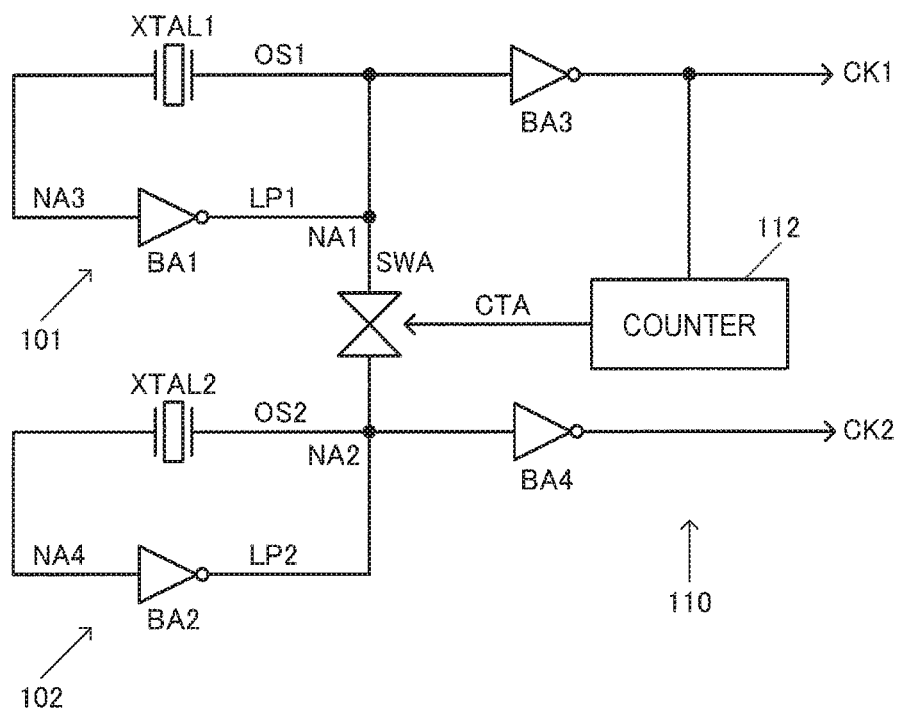
FIG. 17 illustrates a first configuration example of a synchronization circuit.
Figure 18:
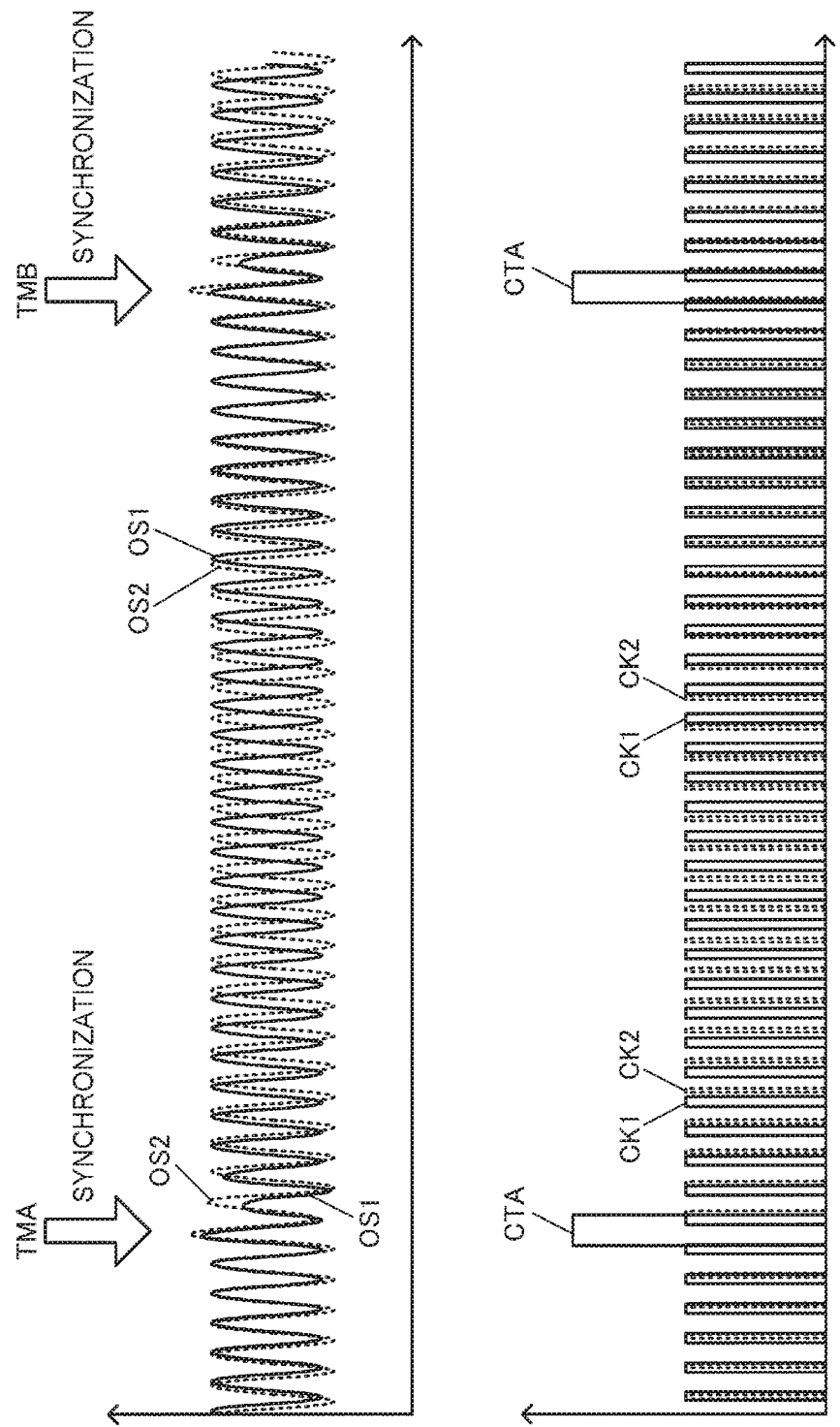
FIG. 18 is a signal waveform diagram for explaining an operation of the synchronization circuit.

FIG. 17 illustrates a first configuration example of the synchronization circuit 110, and FIG. 18 is a signal waveform diagram for explaining an operation of the synchronization circuit 110. The oscillation circuits 101 and 102 respectively cause the oscillators XTAL1 and XTAL2 to oscillate, thereby generating the clock signals CK1 and CK2. For example, oscillation signals OS1 and OS2 in the oscillation circuits 101 and 102 are buffered by buffer circuits BA3 and BA4, so as to be output as the clock signals CK1 and CK2.

The synchronization circuit 110 in FIG. 17 performs phase synchronization between the oscillation signal OS1 (first oscillation signal) in the oscillation circuit 101 and the oscillation signal OS2 (second oscillation signal) in the oscillation circuit 102. For example, the synchronization circuit 110 performs phase synchronization between the oscillation signals OS1 and OS2 at each phase synchronization timing. For example, in FIG. 18, phases of the oscillation signals OS1 and OS2 are synchronized with each other at the phase synchronization timing TMA, and phases of the oscillation signals OS1 and OS2 are also synchronized with at the next phase synchronization timing TMB. This is also performed in the same manner at the next phase synchronization timing. The phases of the oscillation signals OS1 and OS2 are aligned with each other at the phase synchronization timing through the phase synchronization.

As mentioned above, the synchronization circuit 110 in FIG. 17 controls the oscillation circuits 101 and 102 so that the clock signals CK1 and CK2 have a predetermined phase relationship.

More specifically, the synchronization circuit 110 performs phase synchronization so that a transition timing of the clock signal CK1 matches a transition timing of the clock signal CK2 at each phase synchronization timing. For example, the synchronization circuit 110 performs phase synchronization so that transition timings (edges) of the clock signals CK1 and CK2 match each other at the phase synchronization timing TMA in FIG. 18. The synchronization circuit 110 performs phase synchronization so that transition timings of the clock signals CK1 and CK2 match each other at the phase synchronization timing TMB.

As illustrated in FIG. 17, the synchronization circuit 110 electrically connects an oscillation loop LP1 (first oscillation loop) of the oscillation circuit 101 to an oscillation loop LP2 (second oscillation loop) of the oscillation circuit 102 at each phase synchronization timing. For example, the synchronization circuit 110 connects an output node NA1 of the buffer circuit BA1 (first buffer circuit) for oscillation included in the oscillation circuit 101 to an output node NA2 of the buffer circuit BA2 (second buffer circuit) for oscillation included in the oscillation circuit 102.

Specifically, the synchronization circuit 110 includes a counter 112 which performs a counting operation on the basis of one of the clock signals CK1 and CK2. In FIG. 17, the counter 112 performs a counting operation on the basis of, for example, the clock signal CK1. The synchronization circuit 110 performs phase synchronization whenever a count value in the counter 112 reaches a predetermined set value. The set value is a value corresponding to, for example, the number of clocks of the clock signal CK1 (or the clock signal CK2) between the phase synchronization timings TMA and TMB in FIG. 18.

More specifically, the synchronization circuit 110 includes a switch circuit SWA which electrically connects the oscillation loop LP1 of the oscillation circuit 101 to the oscillation loop LP2 of the oscillation circuit 102. The switch circuit SWA is turned on on the basis of a signal CTA from the counter 112, so as to electrically connect the oscillation loop LP1 to the oscillation loop LP2. For example, as illustrated in FIG. 18, the signal CTA is a pulse signal which becomes active (for example, an "H" level) at each phase synchronization timing, and, if the signal CTA becomes active, the switch circuit SWA is turned on. Specifically, if a count value reaches the set value, the counter 112 makes the signal CTA active, and thus the switch circuit SWA is turned on. Thereafter, a count value of the counter 112 is reset.

In FIG. 17, in a case where phases of the oscillation signal OS1 and the oscillation signal OS2 are deviated by exactly 180° when the switch circuit SWA is turned on, there is concern that oscillation may stop.

Therefore, in the synchronization circuit 110, preferably, one of the oscillation circuits 101 and 102 is activated, and the other oscillation circuit is activated at a phase synchronization timing (for example, a first phase synchronization timing) after one oscillation circuit is activated. For example, in FIG. 17, the oscillation circuit 101 is activated, and the oscillation circuit 102 is activated at a phase synchronization timing after the oscillation circuit 101 is activated. For example, the activation of the oscillation circuit 101 may be performed by a seed circuit (not illustrated) provided in the oscillation circuit 101. At a phase synchronization timing after the oscillation circuit 101 is activated, the switch circuit SWA is turned on, and thus the oscillation signal OS1 in the oscillation circuit 101 is transmitted to the oscillation loop LP2 of the oscillation circuit 102. The transmitted oscillation signal OS1 serves as a seed signal, and thus oscillation of the oscillation circuit 102 is activated. In the above-described way, it is possible to prevent the occurrence of the above-described problem that oscillation is stopped.

Figure 19:
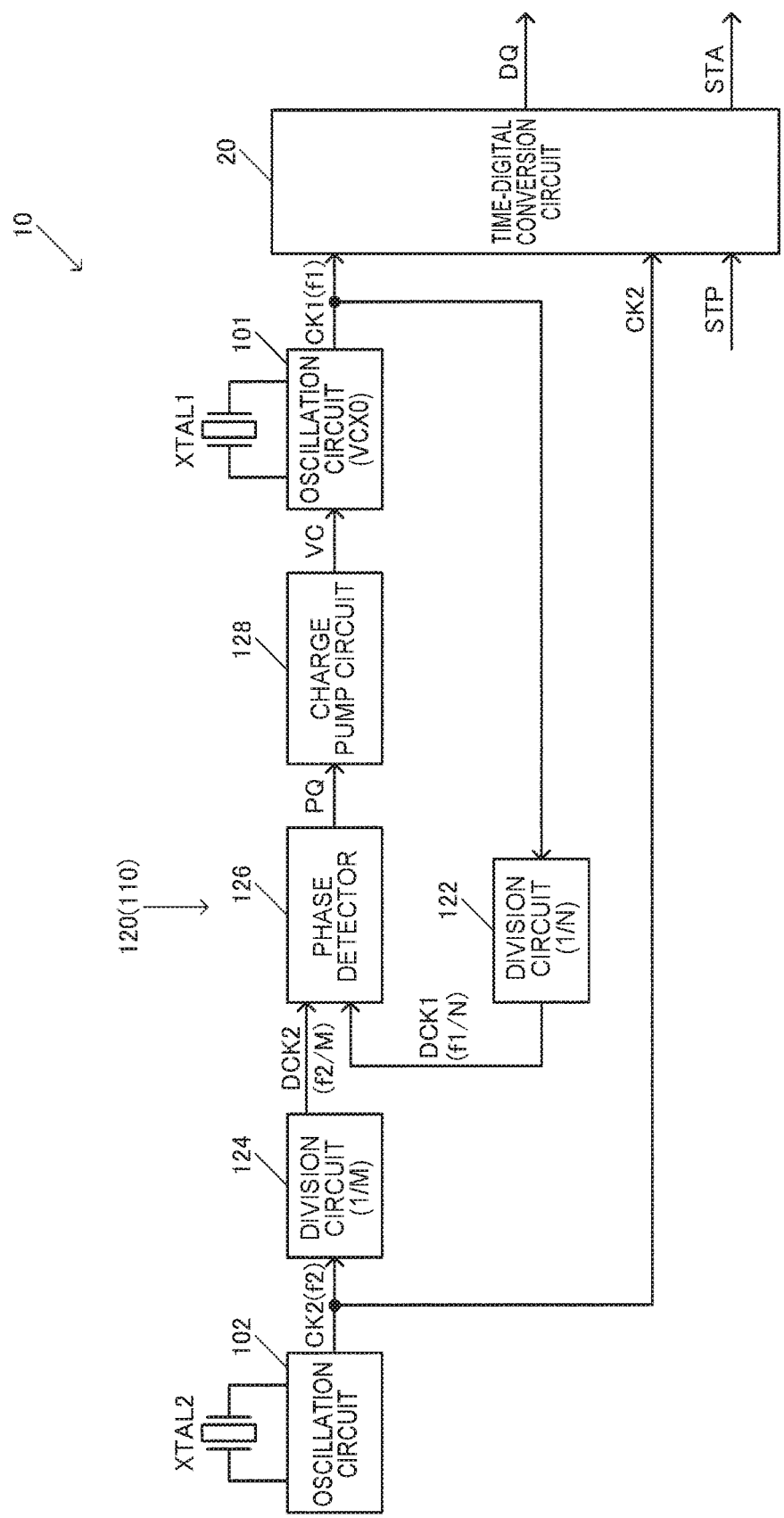
FIG. 19 illustrates a second configuration example of the synchronization circuit.

FIG. 19 illustrates a second configuration example of the synchronization circuit 110. In FIG. 19, the PLL circuit 120 is used as the synchronization circuit 110. The PLL circuit 120 performs phase synchronization between the clock signals CK1 and CK2 which are input to the time-to-digital conversion circuit 20. The PLL circuit 120 controls the oscillation circuit 101 so that the clock signals CK1 and CK2 have a predetermined frequency relationship.

Specifically, as illustrated in FIG. 19, the PLL circuit 120 includes division circuits 122 and 124 (first and second division circuits) and a phase detector 126 (phase comparator). The division circuit 122 divides the clock signal CK1 so as to output a frequency-divided clock signal DCK1 (first frequency-divided clock signal). Specifically, frequency division is performed so that the clock frequency f1 of the clock signal CK1 is multiplied by 1/N, and thus the frequency-divided clock signal DCK1 having f1/N as a clock frequency is output.

The division circuit 124 divides the clock signal CK2 so as to output a frequency-divided clock signal DCK2 (second frequency-divided clock signal). Specifically, frequency division is performed so that the clock frequency f2 of the clock signal CK2 is multiplied by 1/M, and thus the frequency-divided clock signal DCK2 having f2/M as a clock frequency is output. For example, the integrated circuit device 10 includes the oscillation circuit 102, and the oscillation circuit 102 causes the oscillator XTAL2 to oscillate so as to generate the clock signal CK2 which is then output to the division circuit 124. The phase detector 126 performs phase comparison between the frequency-divided clock signal DCK1 and the frequency-divided clock signal DCK2.

The integrated circuit device 10 includes the oscillation circuit 101, and the oscillation circuit 101 is controlled on the basis of a phase comparison result in the phase detector 126 of the PLL circuit 120, so as to cause the oscillator XTAL1 to oscillate. The oscillation circuit 101 is also a constituent element of, for example, the PLL circuit 120. Specifically, the oscillation circuit 101 is, for example, a voltage controlled oscillation circuit (VCXO) of which an oscillation frequency is controlled through voltage control. The PLL circuit 120 includes a charge pump circuit 128, and the phase detector 126 outputs a signal PQ corresponding to a phase comparison result to the charge pump circuit 128. The signal PQ is, for example, an up/down signal, and the charge pump circuit 128 outputs a control voltage VC based on the signal PQ to the oscillation circuit 101. For example, the charge pump circuit 128 includes a loop filter, and converts the up/down signal as the signal PQ into the control voltage VC by using the loop filter. The oscillation circuit 101 performs an oscillation operation of the oscillator XTAL1 whose oscillation frequency is controlled on the basis of the control voltage VC, and thus generates the clock signal CK1. For example, the oscillation circuit 101 has a variable capacitance circuit, and a capacitance value of the variable capacitance circuit is controlled on the basis of the control voltage VC so that an oscillation frequency is controlled.

According to the second configuration example in FIG. 19, it is possible to realize phase synchronization between the clock signals CK1 and CK2 by effectively using the PLL circuit 120. In other words, in the same manner as in FIG. 18, it is possible to realize phase synchronization in which transition timings of the clock signals CK1 and CK2 match each other at each phase synchronization timing.

If the synchronization circuit 110 is provided in the integrated circuit device 10 as mentioned above, it is possible to match transition timings of the clock signals CK1 and CK2 with each other at each phase synchronization timing. Therefore, since a circuit process can be started with a phase synchronization timing as a reference timing, it is possible to simplify a circuit process or a circuit configuration. A time-to-digital conversion process can be immediately started from a phase synchronization timing set by the synchronization circuit 110 without waiting for transition timings of the clock signals CK1 and CK2 to accidentally match each other. Therefore, it is possible to perform time-to-digital conversion at a high speed. Since the synchronization circuit 110 is provided, it is possible to minimize an error due to a time difference between transition timings of the clock signals CK1 and CK2 at a phase synchronization timing. Therefore, it is possible to sufficiently reduce an error which occurs systematically due to the time difference, and thus to improve accuracy.

For example, in the technique of the related art disclosed in JP-A-5-87954, the edge matching detection circuit detects matching between the first and second clock pulses, and time measurement is started on the condition that matching between the edges is detected. However, in the technique of the related art, since time measurement cannot be started as long as matching between edges of the first and second clock pulses is not detected, starting of time measurement is delayed, and thus there is a first problem in that a time-to-digital conversion time increases. In a case where a relationship of clock frequencies of the first and second clock pulses is a frequency relationship in which edges do not match each other at synchronous points, edges match each other only accidentally, and thus there is a second problem in that it is difficult to perform time-to-digital conversion. Since timings of synchronous points of the first and second clock pulses cannot be fixed systematically, there is a third problem in that a circuit process or a circuit configuration is complex. In a case where there is an error in detection of matching between edges of the first and second clock pulses, there is a fourth problem in that accuracy is reduced due to the error.

In contrast, in the present embodiment, since the synchronization circuit 110 is provided, transition timings of the clock signals CK1 and CK2 can be forced to match each other at each phase synchronization timing. Therefore, since a time-to-digital conversion process can be started right after the phase synchronization timing, it is possible to solve the above-described first problem in the technique of the related art. According to the present embodiment, even in a case where a relationship of clock frequencies of the clock signals CK1 and CK2 is a frequency relationship in which transition timings do not match each other, transition timings of the clock signals CK1 and CK2 are forced to match each other at each phase synchronization timing by the synchronization circuit 110. Therefore, it is possible to solve the second problem in the technique of the related art. Since a phase synchronization timing can be systematically fixed through phase synchronization in the synchronization circuit 110, a circuit processor an integrated circuit device can be simplified, and thus it is possible to solve the third problem in the technique of the related art. Since transition timings of the clock signals CK1 and CK2 match each other at each phase synchronization timing, and thus it is possible to reduce a conversion error due to deviation between transition timings of the clock signals CK1 and CK2 can be reduced, it is also possible to solve the fourth problem in the technique of the related art.

6. Oscillation Circuit

Figure 20:
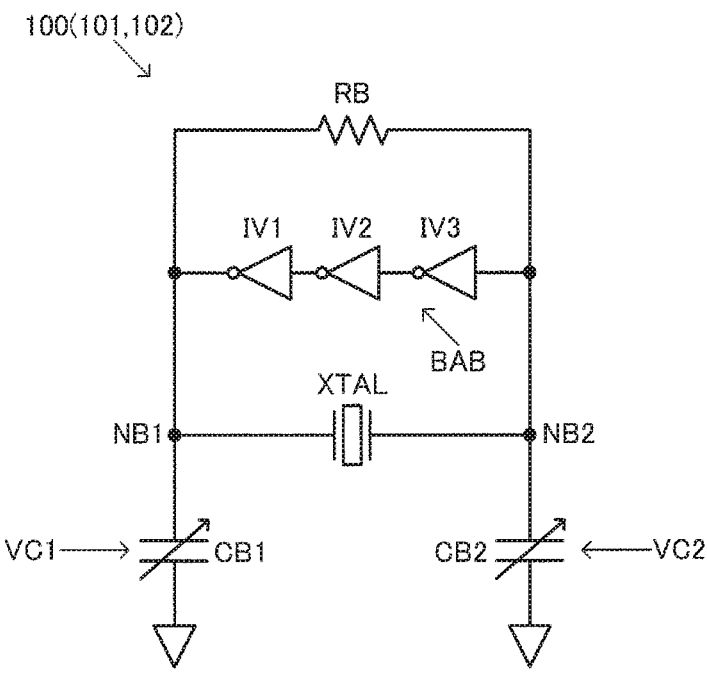
FIG. 20 illustrates a first configuration example of the oscillation circuit.

FIG. 20 illustrates a first configuration example of an oscillation circuit 100. Herein, the oscillation circuit 100 is described as a representative of the oscillation circuits 101 and 102.

The oscillation circuit 100 (101, 102) in FIG. 20 includes a buffer circuit BAB for oscillation, variable capacitance circuits CB1 and CB2 (variable capacitance capacitors; capacitors in a broad sense), and a feedback resistor RB. The buffer circuit BAB may be formed of one or a plurality of (odd-numbered stage) inverter circuits. In FIG. 20, the buffer circuit BAB is formed of three-stage inverter circuits IV1, IV2 AND IV3. The buffer circuit BAB (IV1 to IV3) may be a circuit which can control enabling or disabling of oscillation or can control of a flowing current.

The variable capacitance circuits CB1 and CB2 are respectively provided at one end (NB1) and the other end (NB2) of an oscillator XTAL. The feedback resistor RB is provided between one end and the other end of the oscillator XTAL. Capacitance values of the variable capacitance circuits CB1 and CB2 are controlled on the basis of control voltages VC1 and VC2 (in a broad sense, control signals). The variable capacitance circuits CB1 and CB2 are formed of variable capacitance diodes (varactors) or the like. If capacitance values are controlled in the above-described way, an oscillation frequency (clock frequency) of the oscillation circuit 100 can be adjusted (finely adjusted).

A variable capacitance circuit may be provided at only one of one end and the other end of the oscillator XTAL. A normal capacitor whose capacitance value is not variable may be provided instead of the variable capacitance circuit.

Figure 21:
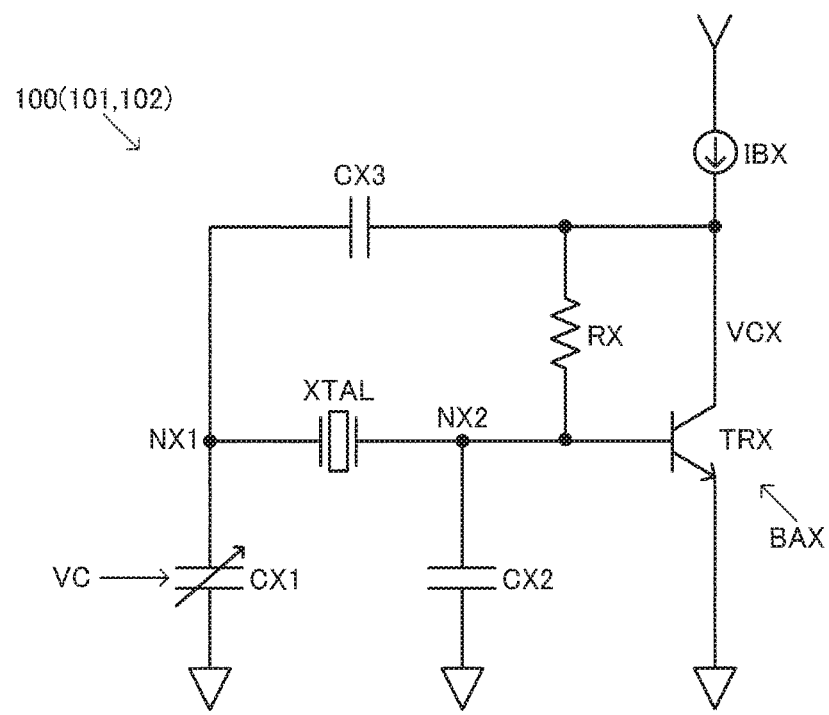
FIG. 21 illustrates a second configuration example of the oscillation circuit.

FIG. 21 illustrates a second configuration example of the oscillation circuit 100. The oscillation circuit 100 includes a current source IBX, a bipolar transistor TRX, a resistor RX, capacitors CX2 and CX3, and a variable capacitance circuit CX1 (variable capacitance capacitor). For example, a buffer circuit BAX for oscillation is formed of the current source IBX, the bipolar transistor TRX, the resistor RX, and the capacitor CX3.

The current source IBX supplies a bias current to a collector of the bipolar transistor TRX. The resistor RX is provided between the collector and a base of the bipolar transistor TRX.

One end of the variable capacitance circuit CX1 whose capacitance is variable is connected to one end (NX1) of an oscillator XTAL. Specifically, one end of the variable capacitance circuit CX1 is connected to one end of the oscillator XTAL via a first terminal for oscillation (pad for oscillation) of the integrated circuit device 10. One end of the capacitor CX2 is connected to the other end (NX2) of the oscillator XTAL. Specifically, one end of the capacitor CX2 is connected to the other end of the oscillator XTAL via a second terminal for oscillation (pad for oscillation) of the integrated circuit device 10. One end of the capacitor CX3 is connected to one end of the oscillator XTAL, and the other end thereof is connected to the collector of the bipolar transistor TRX.

A base-emitter current generated by oscillation of the oscillator XTAL flows through the bipolar transistor TRX. If the base-emitter current increases, a collector-emitter of the bipolar transistor TRX increases, and thus a bias current which branches into the resistor RX from the current source IBX is reduced, so that a collector voltage VCX is reduced. On the other hand, if a base-emitter current is reduced, a collector-emitter of the bipolar transistor TRX is reduced, and thus a bias current which branches into the resistor RX from the current source IBX increases, so that the collector voltage VCX increases. The collector voltage VCX is fed back to one end of the oscillator XTAL via the capacitor CX3. In other words, an AC component is cut by the capacitor CX3, and thus a DC component is fed back. As mentioned above, the buffer circuit BAX for oscillation formed of the bipolar transistor TRX and the like operates as an inverting circuit (inverting amplification circuit) which outputs an inverting signal (a signal having a phase difference of 180 degrees) of a signal at the node NX2 to the node NX1.

A capacitance value of the variable capacitance circuit CX1 formed of a variable capacitance diode (varactor) and the like is controlled on the basis of a control voltage VC (control signal). Consequently, an oscillation frequency of the oscillation circuit 100 can be adjusted. For example, in a case where an oscillation frequency of the oscillator XTAL has temperature characteristics, temperature compensation of the oscillation frequency or the like is possible.

The oscillation circuit 100 (101, 102) is not limited to the configurations illustrated in FIGS. 20 and 21, and may be variously modified. For example, variable configurations may be employed as a configuration of a buffer circuit or a connection configuration of a variable capacitance circuit or a capacitor. For example, a capacitance value of the variable capacitance circuit (CB1, CB2, or CX1) may be adjusted in a digital value. In this case, the variable capacitance circuit is formed of a plurality of capacitors (capacitor array), and a plurality of switch elements (switch array) whose turning-on and turning-off are controlled on the basis of frequency control data (in a broad sense, a control signal) which has a digital value. The plurality of switch elements are respectively electrically connected to the plurality of capacitors. If the plurality of switch elements are turned on or off, the number of capacitors connected to one end of the oscillator XTAL among the plurality of capacitors is changed. Consequently, a capacitance value of the variable capacitance circuit is controlled, and thus a capacitance value of one end of the oscillator XTAL varies. Therefore, a capacitance value of the variable capacitance circuit is directly controlled on the basis of frequency control data, and thus an oscillation frequency of an oscillation signal can be controlled.

7. Configuration of Time-to-Digital Conversion Circuit

Figure 22:
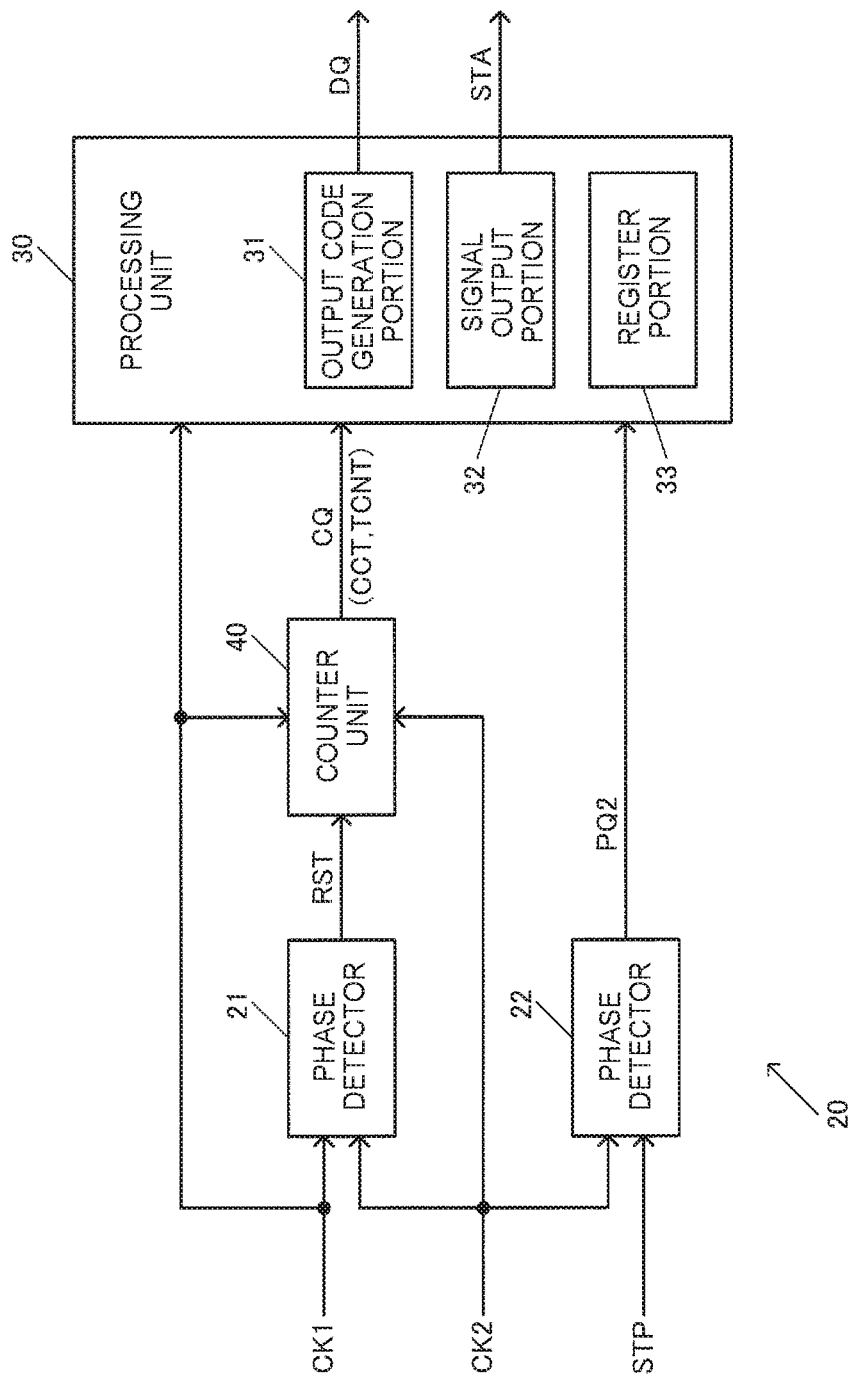
FIG. 22 illustrates a configuration example of a time-to-digital conversion circuit.

FIG. 22 illustrates a configuration example of the time-to-digital conversion circuit 20. The time-to-digital conversion circuit 20 includes phase detectors 21 and 22, a processing unit 30, and a counter unit 40. However, the time-to-digital conversion circuit 20 is not limited to the configuration illustrated in FIG. 22, and may be variously modified, for example, some of the constituent elements may be omitted, or other constituent elements may be added thereto.

The phase detector 21 (phase comparator) receives the clock signals CK1 and CK2, and outputs a reset signal RST to the counter unit 40. For example, the reset signal RST as a pulse signal which becomes active at a phase synchronization timing is output.

The phase detector 22 (phase comparator) receives the signal STP and the clock signal CK2, and outputs a signal PQ2 corresponding to a phase comparison result. The phase detector 22 samples, for example, one of the signal STP and the clock signal CK2 with the other signal so as to perform phase comparison between the signal STP and the clock signal CK2. The signal PQ2 corresponding to a phase comparison result is output to the processing unit 30.

The counter unit 40 performs a counting process for obtaining a count value. For example, the counter unit 40 includes at least one of a first counter which performs a counting process on the basis of the clock signal CK1, and a second counter which performs a counting process on the basis of the clock signal CK2. Count values in the first and second counters are reset on the basis of, for example, the reset signal RST from the phase detector 22. A count value CQ in the counter unit 40 is output to the processing unit 30. The count value CQ is a count value in at least one of the first and second counters performing a counting process on the basis of the clock signals CK1 and CK2, and corresponds to CCT or TCNT which will be described later.

The processing unit 30 performs a process of converting time into the digital value DQ. In other words, various calculation processes on time-to-digital conversion are performed. For example, the processing unit 30 performs a calculation process of obtaining the digital value DQ corresponding to a time difference between the signal STA and the signal STP. Specifically, the processing unit 30 performs a calculation process for time-to-digital conversion on the basis of the count value CQ from the counter unit 40 or the signal PQ2 corresponding to a phase comparison result from the phase detector 22. The processing unit 30 may be implemented by, for example, a logic circuit of an ASIC, or a processor such as a CPU.

The processing unit 30 includes an output code generation portion 31, a signal output portion 32, and a register portion 33. The output code generation portion 31 performs the calculation process for time-to-digital conversion so as to output the final digital value DQ as a final output code. The signal output portion 32 generates and outputs the signal STA. The signal output portion 32 outputs the signal STA on the basis of the clock signal CK1. For example, the signal output portion 32 outputs the signal STA in each clock cycle of the clock signal CK1 on the basis of, for example, the clock signal CK1. Alternatively, the signal output portion 32 outputs the signal STA in a clock cycle designated by, for example, a clock cycle designation value. The register portion 33 is formed of one or a plurality of registers. For example, the register portion 33 includes, for example, a register in which clock cycle designation information which will be described later is stored. The register portion 33 may be implemented by, for example, a flip-flop circuit or a memory element.

Figure 23:
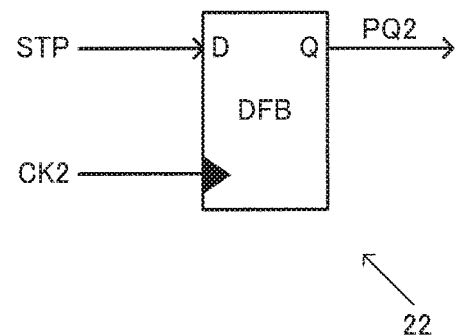
FIG. 23 illustrates a configuration example of a phase detector.

FIG. 23 illustrates a configuration example of the phase detector 22. The phase detector 22 is formed of, for example, a flip-flop circuit DFB. The signal STP is input to a data terminal of the flip-flop circuit DFB, and the clock signal CK2 is input to a clock terminal thereof. Consequently, the signal STP is sampled with the clock signal CK2, and thus phase comparison can be performed. The clock signal CK2 may be input to the data terminal of the flip-flop circuit DFB, and the signal STP may be input to the clock terminal thereof. Consequently, the clock signal CK2 is sampled with the signal STP, and thus phase comparison can be performed.

8. Repetition Method for Signal STA

Next, a description will be made of various examples of a time-to-digital conversion method according to the present embodiment. First, a description will be made of a method of repeatedly generating the signal STA in each cycle.

Figure 24:
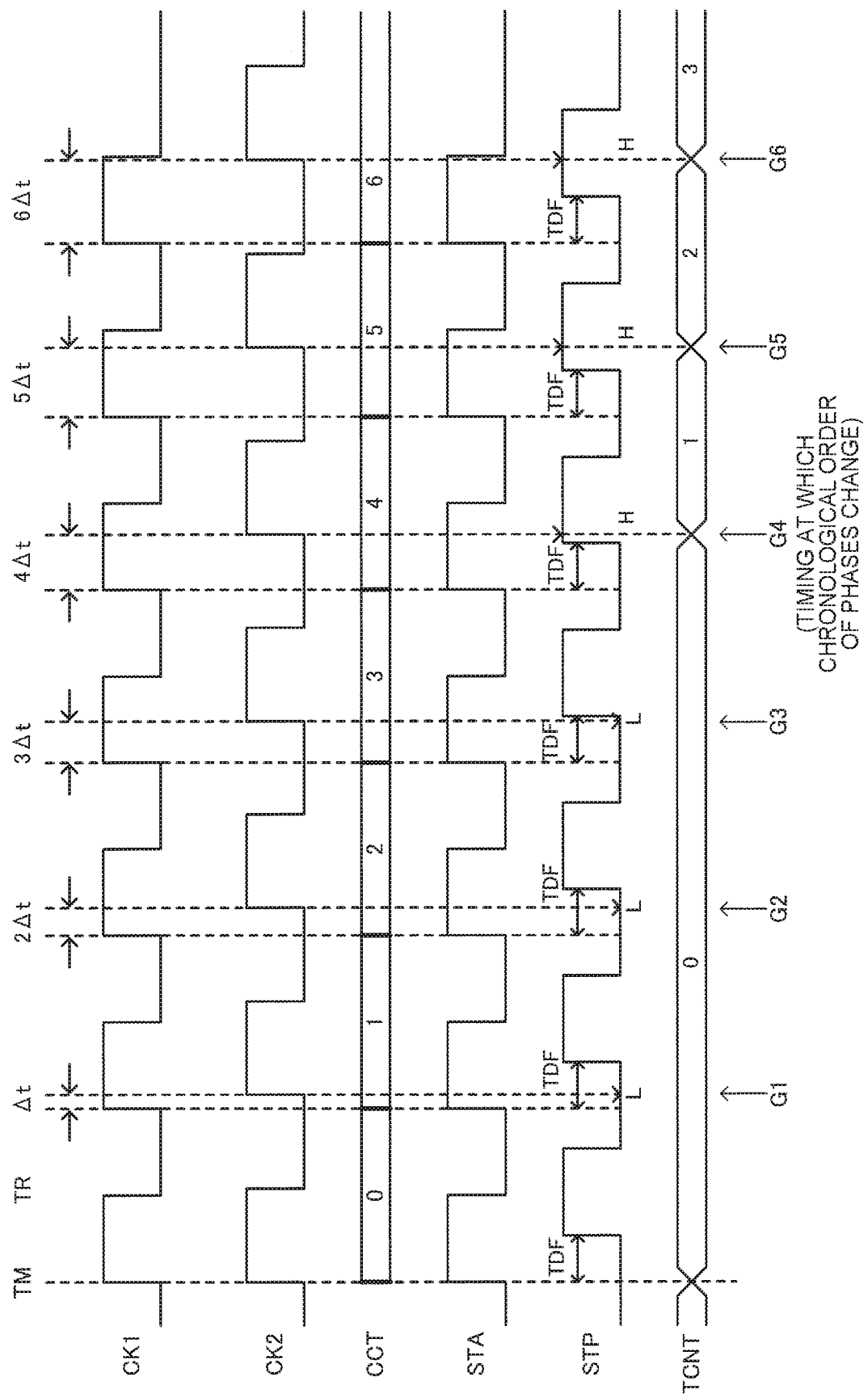
FIG. 24 is a signal waveform diagram for explaining a method of repeating the signal STA.

FIG. 24 is a signal waveform diagram for explaining a repetition method for the signal STA of the present embodiment (hereinafter, simply referred to as a repetition method as appropriate). In FIG. 24, phases of the clock signals CK1 and CK2 are synchronized with each other at a phase synchronization timing TM. This phase synchronization is performed by the synchronization circuit 110. At the phase synchronization timing TM, a count value TCNT in the counter unit 40 (second counter) is reset to, for example, 0.

In a case where the phase synchronization timing TM is a known timing in the system of the integrated circuit device 10, the phase synchronization timing TM is set by, for example, a timing controller (not illustrated). In this case, the function of the phase detector 21 in FIG. 22 is realized by the timing controller. In other words, the timing controller outputs the reset signal RST which becomes active at the phase synchronization timing TM, to the counter unit 40.

The time-to-digital conversion circuit 20 causes a signal level of the signal STA to transition on the basis of the clock signal CK1 after the phase synchronization timing TM of the clock signals CK1 and CK2. Specifically, a signal level of the signal STA transitions in each clock cycle of the clock signal CK1 after the phase synchronization timing TM. For example, the signal output portion 32 in FIG. 22 outputs a signal obtained by buffering the clock signal CK1 in a buffer circuit, as the signal STA, and thus the signal level of the signal STA transitions in each clock cycle.

In FIG. 24, CCT indicates a clock cycle value. The clock cycle value CCT is updated in each clock cycle of the clock signal CK1. Specifically, the clock cycle value CCT increments in each clock cycle. Herein, for convenience of description, a value of a first clock cycle is set to be CCT=0. Thus, a value of the next clock cycle is CCT=1. In FIG. 24, CCT indicates a clock cycle value of the clock signal CK1, but may indicate a clock cycle value of the clock signal CK2 instead.

If the signal level of the signal STA transitions on the basis of the clock signal CK1 after the phase synchronization timing TM, as described in FIGS. 8 and 9, a signal level of the signal STP transitions so as to correspond to the signal STA. Herein, a time difference between transition timings of the signals STA and STP is TDF.

In this case, the time-to-digital conversion circuit 20 performs phase comparison between the signal STP and the clock signal CK2 as indicated by G1 to G6 in FIG. 24. The digital value DQ corresponding to the time difference TDF between transition timings of the signals STA and STP is obtained on the basis of a phase comparison result. Specifically, the processing unit 30 in FIG. 22 performs a calculation process of obtaining the digital value DQ on the basis of the signal PQ2 corresponding to the phase comparison result from the phase detector 22.

For example, as described in FIG. 2, after the phase synchronization timing TM, the inter-clock time difference TR which is a time difference between transition timings of the clock signals CK1 and CK2 increases in each clock cycle of the clock signal CK1, such as $\Delta t$, $2\Delta t$, $3\Delta t$, . . . , and $6\Delta L$. In the repetition method of the present embodiment, time-to-digital conversion is performed focusing on the inter-clock time difference TR which increases by $\Delta t$ as mentioned above after the phase synchronization timing TM.

For example, in G1 to G3 in FIG. 24, the signal PQ2 which is obtained by sampling the signal STP with the clock signal CK2 and corresponds to a phase comparison result has an "L" level. In other words, in G1 to G3, a phase of the signal STP delays with respect to a phase of the clock signal CK2, and thus the signal PQ2 has an "L" level.

As mentioned above, in G1 to G3 in FIG. 24, it is determined that a phase of the signal STP delays with respect to a phase of the clock signal CK2 on the basis of a result of phase comparison between the signal STP and the clock signal CK2. In other words, in G1, G2, and G3, relationships of TDF>TR=$\Delta t$, TDF>TR=$2\Delta t$, and TDF>TR=$3\Delta t$ are obtained, and thus the time difference TDF between transition timings of the signals STA and STP is longer than the inter-clock time difference TR of the clock signals CK1 and CK2.

In G4 in FIG. 24, the chronological order of phases of the signal STP and the clock signal CK2 changes. For example, a state in which a phase of the signal STP delays with respect to a phase of the clock signal CK2 changes to a state in which the phase of the signal STP advances with respect to the phase of the clock signal CK2.

If the chronological order of phases changes as mentioned above, as indicated by G4 to G6, the signal PQ2 which is obtained by sampling the signal STP with the clock signal CK2 and corresponds to a phase comparison result has an "H" level. In other words, in G4 to G6, a phase of the signal STP advances with respect to a phase of the clock signal CK2, and thus the signal PQ2 has an "H" level. In other words, in G4, G5, and G6, relationships of TDF<TR=$4\Delta t$, TDF<TR=$5\Delta t$, and TDF<TR=$6\Delta t$ are obtained, and thus the time difference TDF between transition timings of the signals STA and STP is shorter than the inter-clock time difference TR of the clock signals CK1 and CK2.

In G1 to G3 in FIG. 24, the signal PQ2 corresponding to a phase comparison result has an "L" level, and it is determined that the phase of the signal STP delays with respect to the phase of the clock signal CK2. In this case, the count value TCNT is not updated (e.g., is maintained). For example, the count value TCNT does not increment from 0. On the other hand, in G4 to G6, the signal PQ2 corresponding to a phase comparison result has an "H" level, and it is determined that the phase of the signal STP advances with respect to the phase of the clock signal CK2. In this case, the count value TCNT is updated. For example, the count value TCNT is incremented by 1 in each clock cycle.

The time-to-digital conversion circuit 20 (processing unit 30) obtains the digital value DQ corresponding to the time difference TDF by using the count value TCNT obtained in the above-described way. For example, a conversion process is performed on a code indicated by the count value TCNT, and thus an output code which is the final digital value DQ is obtained and output.

Figure 25:
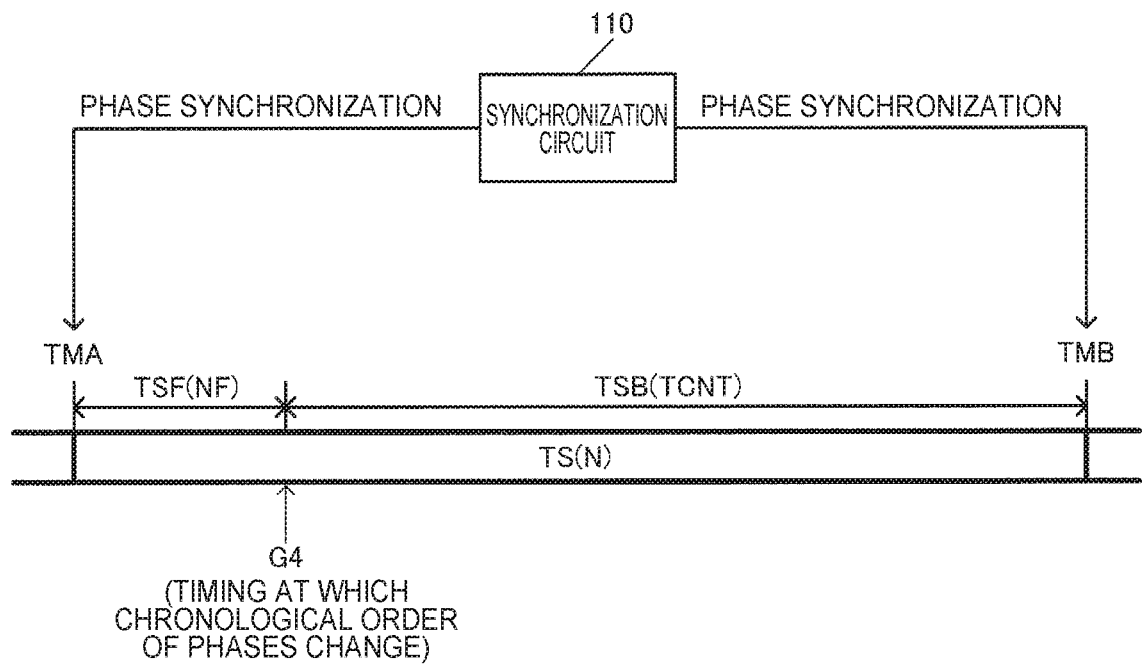
FIG. 25 is a signal waveform diagram for explaining a method of repeating the signal STA.

FIG. 25 is a diagram for explaining the repetition method according to the present embodiment. The synchronization circuit 110 performs phase synchronization between the clock signals CK1 and CK2 at the phase synchronization timings TMA and TMB. Consequently, transition timings of the clock signals CK1 and CK2 match each other at the phase synchronization timings TMA and TMB. A period between the phase synchronization timings TMA and TMB is the measurement period TS. In the repetition method according to the present embodiment, the digital value DQ corresponding to the time difference TDF is obtained in the measurement period TS.

Specifically, as indicated by G4 in FIGS. 24 and 25, the time-to-digital conversion circuit 20 specifies a timing (clock cycle) at which the chronological order of the signal STP and the clock signal CK2 changes, and thus obtains the digital value DQ corresponding to the time difference TDF. For example, a clock cycle of CCT=4 indicated by G4 is specified, and thus it may be determined that the digital value DQ corresponding to the time difference TDF is a digital value corresponding to, for example, TR=$4\Delta t$ (or a digital value corresponding to a value between $3\Delta t$ and $4\Delta t$). Therefore, since the time difference TDF can be converted into the digital value DQ in a single measurement period TS in FIG. 25, it is possible to perform time-to-digital conversion at a high speed.

For example, in the technique of the related art disclosed in JP-A-5-87954, since only a single start pulse is generated in a single measurement period in which time measurement is performed, it is necessary to repeat a lot of measurement periods in order to obtain a final digital value.

In contrast, according to the repetition method of the present embodiment, as illustrated in FIGS. 24 and 25, the signal STA is generated a plurality of number of times in a single measurement period TS, and a plurality of number of times (for example, 1000 or more) of phase comparison is performed so that the digital value DQ is obtained. Consequently, since the final digital value DQ can be obtained in a single measurement period TS, it is possible to perform time-to-digital conversion at a considerably higher speed than in the technique of the related art.

In FIG. 25, a length of the measurement period TS corresponds to the number of clocks N of, for example, the clock signal CK1 in this measurement period TS. For example, the synchronization circuit 110 performs phase synchronization between the clock signals CK1 and CK2 in each measurement period TS corresponding to the set number of clocks N (the number of clock cycles). In the repetition method of the present embodiment, the number of clocks N in the measurement period TS is set to a considerably great number such as 1000 or more (or 5000 or more) in order to realize high resolution time-to-digital conversion. For example, in a case where clock frequencies of the clock signals CK1 and CK2 are respectively indicated by f1 and f2, a resolution in time-to-digital conversion of the present embodiment may be represented by $\Delta t=|f1-f2|/(f1 \times f2)$. Therefore, as the frequency difference $|f1-f2|$ becomes smaller, or $f1 \times f2$ increases, the resolution $\Delta t$ is reduced, and thus it is possible to realize high resolution time-to-digital conversion. If the resolution $\Delta t$ is reduced, the number of clocks N in the measurement period TS increases.

The count value TCNT corresponds to a length of a period TSB in FIG. 25. Herein, a first half period from the phase synchronization timing TMA to the timing G4 at which the chronological order of phases changes is indicated by TSF, and a second half period from the timing G4 to the phase synchronization timing TMB is indicated by TSB. For example, in a case where the number of clocks (the number of clock cycles) of the clock signal CK1 in the period TSF is indicated by NF, for example, a relationship of N=NF+TCNT is established. For example, in FIG. 24, since NF=4, a value corresponding to the final digital value DQ=4$\Delta t$ is a digital value corresponding to the number of clocks NF. Thus, the time-to-digital conversion circuit 20 (processing unit 30) obtains a digital value corresponding to a relationship of NF=N−TCNT on the basis of the count value TCNT. For example, in a case where the digital value DQ is represented in 8 bits, a digital value corresponding to the number of clocks N is 11111111. However, the number of clocks NF may be counted so that the digital value DQ is obtained.

In a case where the number of clocks N corresponding to the measurement period TS is increased, the time difference TDF which can be measured in FIG. 24 is short, and thus a dynamic range is reduced. However, in the repetition method of the present embodiment, a resolution is heightened by increasing the number of clocks N, and time-to-digital conversion is completed in a single measurement period TS. Consequently, it is possible to perform a conversion process at a high speed, for example, as in flash type A/D conversion and also to realize high resolution.

In this case, in the repetition method of the present embodiment, instead of performing phase comparison by normally generating the signal STA in each clock cycle, phase comparison may be performed by generating the signal STA only in a specific period. For example, in a binary search method which will be described later, a search range of the digital value DQ may be narrowed, and then phase comparison may be performed by generating the signal STA in each clock cycle in a period corresponding to the search range so that the final digital value DQ is obtained. In this case, for example, in the measurement period TS in FIG. 25, time-to-digital conversion may be performed in which phase comparison is performed by generating the signal STA in each clock cycle only in a period corresponding to a narrowed search range. After a timing (G4) at which the chronological order of phases changes is specified, power may be saved by not generating the signal STA.

In the present embodiment, as illustrated in FIG. 1, the clock signals CK1 and CK2 are clock signals generated by respectively using the oscillators XTAL1 and XTAL2. As mentioned above, according to the method using the clock signals CK1 and CK2 generated by the oscillators XTAL1 and XTAL2, it is possible to considerably improve the accuracy of measurement of time (physical quantity) compared with the technique of the related art of performing time-to-digital conversion by using a semiconductor element as in a vernier delay circuit.

For example, in the technique of the related art using a semiconductor element, a resolution is relatively easily improved, but there is a problem in that accuracy is hardly improved. In other words, a delay time of a delay element which is a semiconductor element greatly varies depending on a manufacturing variation or an environmental change. Thus, there is a limitation in achievement of high accuracy of measurement due to such variations. For example, relative accuracy can be ensured to some degree, but it is hard to ensure absolute accuracy.

In contrast, an oscillation frequency of an oscillator scarcely varies due to a manufacturing variation or an environmental change compared with a delay time of a delay element which is a semiconductor element. Therefore, according to the method of performing time-to-digital conversion by using the clock signals CK1 and CK2 generated by the oscillators XTAL1 and XTAL2, it is possible to considerably improve accuracy compared with the technique of the related art using a semiconductor element. A resolution can also be heightened by reducing a frequency difference of the clock signals CK1 and CK2.

For example, if a frequency difference of the clock signals CK1 and CK2 is $\Delta f=|f1-f2|=1$ MHz, and f1 and f2 are 100 MHz, a time measurement resolution $\Delta t=|f1-f2|/(f1 \times f2)$ can be made about 100 picoseconds (ps). Similarly, if f1 and f2 are about 100 MHz, and $\Delta f$ is 100 kHz, 10 kHz, and 1 kHz, the resolution $\Delta t$ can be made 10 ps, 1 ps, 0.1 ps. Variations in oscillation frequencies of the oscillators XTAL1 and XTAL2 are extremely smaller than in the technique using a semiconductor element. Therefore, it is possible to realize both of improvement of a resolution and improvement of accuracy.

In the technique of the related art disclosed in JP-A-5-87954, time-to-digital conversion is performed by using the quartz crystal oscillator. However, this technique of the related art employs a configuration in which a time measurement starting timing is delayed in order from a timing of a synchronous point at which edges of the first and second clock pulses match each other. Each time measurement operation is performed from a timing of a synchronous point at which edges of the first and second clock pulses match each other, and this time measurement operation is required to be performed several times. Thus, there is a problem in that the time required for time-to-digital conversion considerably increases.

In contrast, in the repetition method of the present embodiment, the signal STA is generated a plurality of number of times in the measurement period TS, and phase comparison is performed a plurality of number of times so that time-to-digital conversion is performed. Therefore, it is possible to perform time-to-digital conversion at a considerably higher speed than in the technique of the related art.

9. Method of Updating Clock Cycle Designation Value

Figure 26:
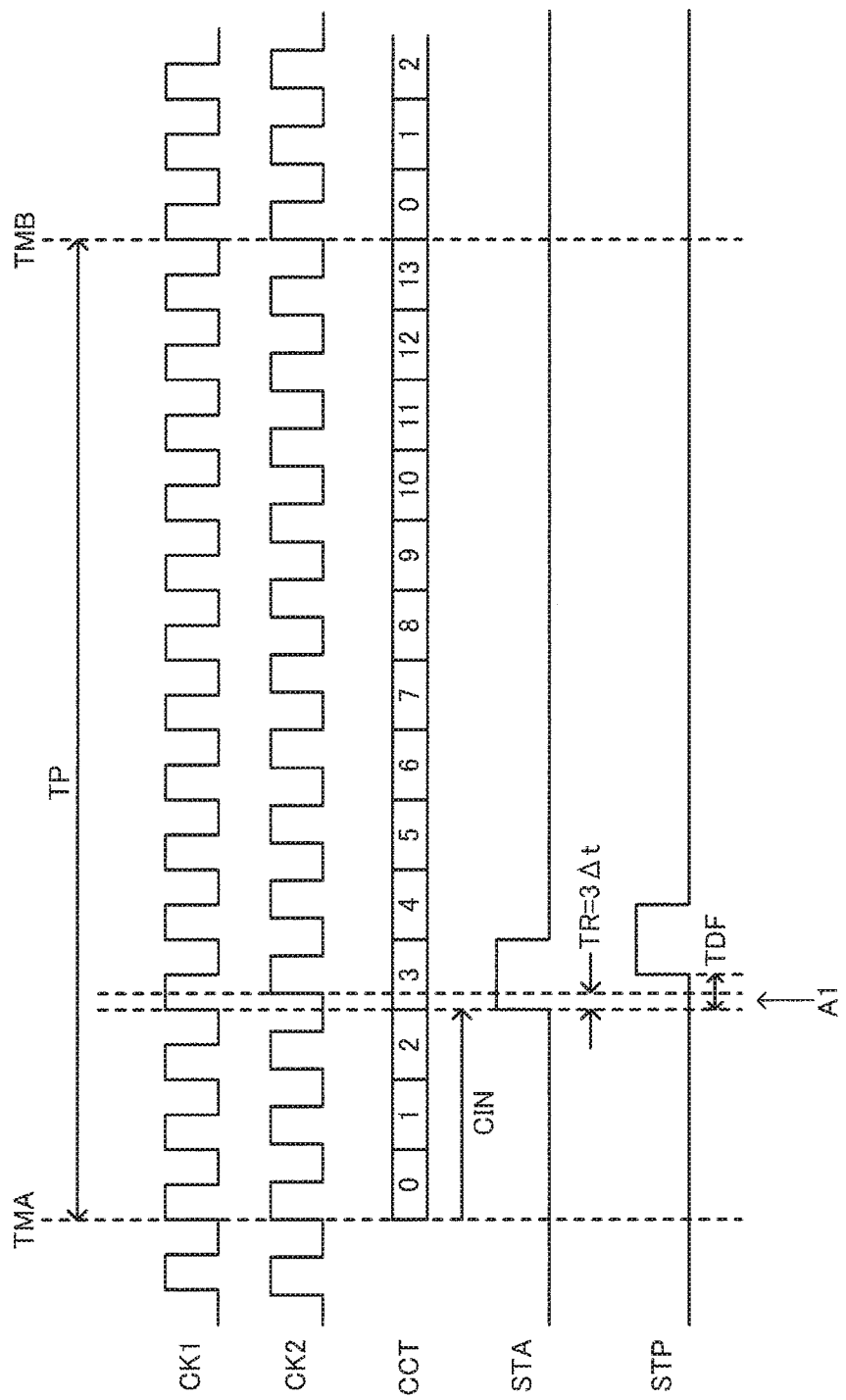
FIG. 26 is a signal waveform diagram for explaining a method of updating a clock cycle designation value.
Figure 27:
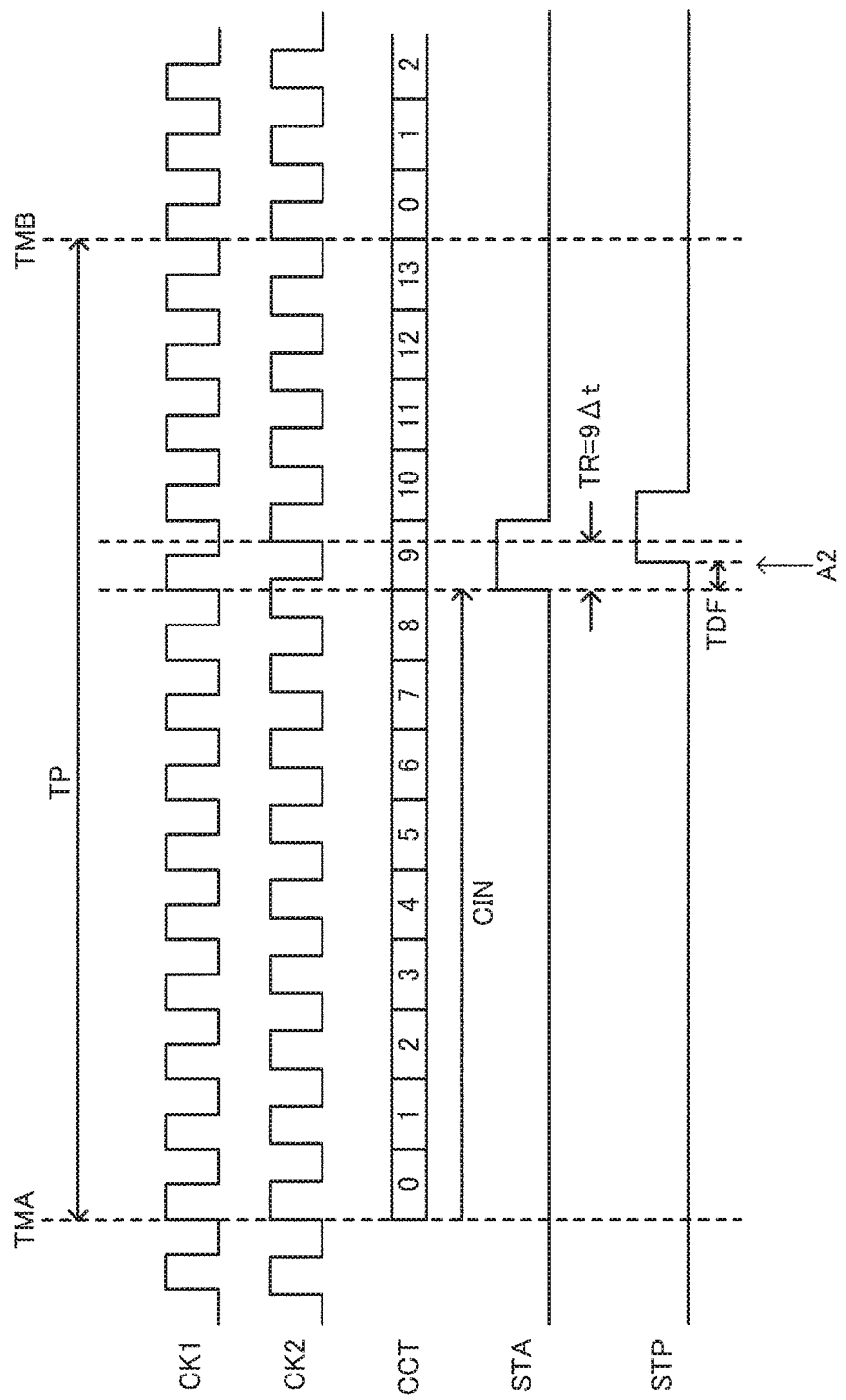
FIG. 27 is a signal waveform diagram for explaining a method of updating a clock cycle designation value.
Figure 28:
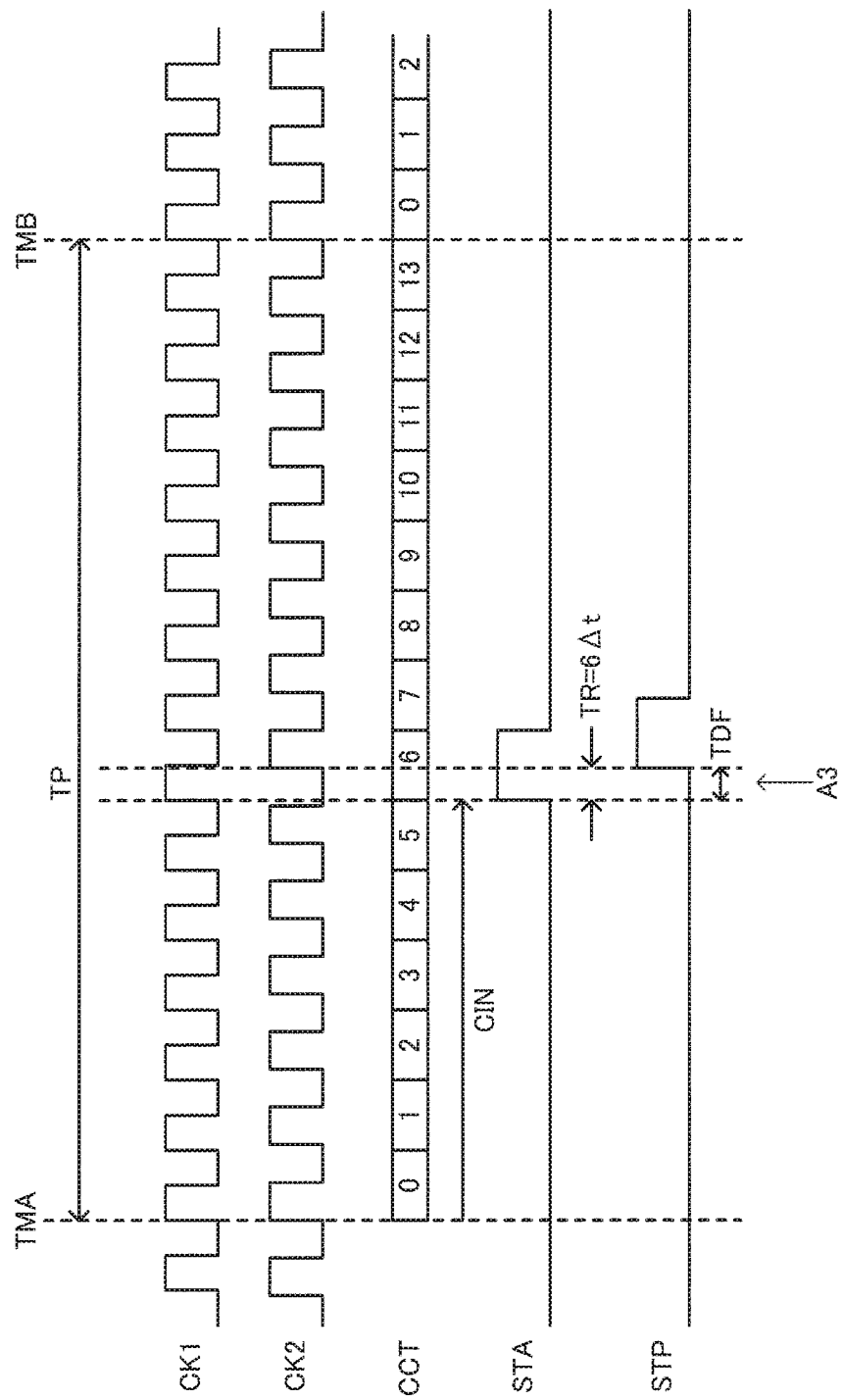
FIG. 28 is a signal waveform diagram for explaining a method of updating a clock cycle designation value.

Next, as a time-to-digital conversion method of the present embodiment, a description will be made of a method of performing time-to-digital conversion by updating a clock cycle designation value (in a broad sense, clock cycle designation information). FIGS. 26 to 28 are signal waveform diagrams for explaining a method of updating a clock cycle designation value (hereinafter, simply referred to as an update method as appropriate). CIN indicates clock cycle designation information. Hereinafter, a description will be made of a case where a clock cycle designation value CIN is indicated by clock cycle designation information.

TMA and TMB indicate phase synchronization timings. In FIGS. 26 to 28, the phase synchronization timings TMA and TMB are timings at which transition timings of the clock signals CK1 and CK2 match each other. However, an update method of the present embodiment is not limited thereto, and the phase synchronization timings TMA and TMB may be timings at which the chronological order of phases of the clock signals CK1 and CK2 changes. The timing at which the chronological order of phases changes is a timing at which a state in which a phase of one of the clock signals advances with respect to a phase of the other clock signal changes to a state in which the phase of one clock signal delays with respect to the phase of the other clock signal.

The update period TP is a period between the phase synchronization timings TMA and TMB. In the update method of the present embodiment, a clock cycle designation value is updated, for example, once in the update period TP. In FIGS. 26 to 28, for simplification of description, a case where the number of clocks of the clock signal CK1 in the update period TP is fourteen is illustrated. However, actually, the number of clocks in the update period TP is set to a considerably great number such as 1000 or more (or 5000 or more) in order to set a high resolution.

In the update period TP (first update period) in FIG. 26, a clock cycle designation value is CIN=3. Therefore, a signal level of the signal STA is caused to transition in a clock cycle (CCT=3) designated by CIN=3. As mentioned above, in the update method of the present embodiment, a signal level of the signal STA is caused to transition in a clock cycle of the clock signal CK1 designated on the basis of the clock cycle designation value CIN (clock cycle designation information). As described in FIGS. 8 and 9, a signal level of the signal STP transitions so as to correspond to the signal STA, and a time difference between transition timings of the signals STA and STP is TDF. On the other hand, in the clock cycle (CCT=3) designated by CIN=3, as described in FIG. 2, an inter-clock time difference of the clock signals CK1 and CK2 is TR=CIN×Δt=3Δt.

In this case, in the update method of the present embodiment, as indicated by A1 in FIG. 26, phase comparison between the signal STP and the clock signal CK2 is performed. This phase comparison may be performed by sampling one of the signal STP and the clock signal CK2 with the other signal.

In A1 in FIG. 26, a phase comparison result as a result of sampling the signal STP with the clock signal CK2 is in an "L" level. It is determined that a phase of the signal STP delays with respect to a phase of the clock signal CK2. In other words, in A1 in FIG. 26, a relationship of TDF>TR=3Δt is obtained, and thus the time difference TDF of the signals STA and STP is longer than the inter-clock time difference TR=3Δt of the clock signals CK1 and CK2. In this case, an update for increasing the clock cycle designation value CIN is performed.

In the update period TP (second update period) in FIG. 27, a clock cycle designation value is CIN=9. For example, in the previous update period TP illustrated in FIG. 26, as described above, a clock cycle designation value is updated to be increased from CIN=3 to CIN=9. Therefore, a signal level of the signal STA is caused to transition in a clock cycle (CCT=9) designated by CIN=9. A signal level of the signal STP transitions so as to correspond to the signal STA, and a time difference between transition timings of the signals STA and STP is TDF. On the other hand, in the clock cycle (CCT=9) designated by CIN=9, an inter-clock time difference of the clock signals CK1 and CK2 is TR=CIN×Δt=9Δt.

In the update method of the present embodiment, as indicated by A2 in FIG. 27, phase comparison between the signal STP and the clock signal CK2 is performed. In this case, a phase comparison result as a result of sampling the signal STP with the clock signal CK2 is in an "H" level, and thus it is determined that a phase of the signal STP advances with respect to a phase of the clock signal CK2. In other words, in A2 in FIG. 27, a relationship of TDF<TR=9Δt is obtained, and thus the time difference TDF of the signals STA and STP is shorter than the inter-clock time difference TR=9Δt. In this case, an update for decreasing the clock cycle designation value CIN is performed.

In the update period TP (third update period) in FIG. 28, a clock cycle designation value is CIN=6. For example, in the previous update period TP illustrated in FIG. 27, as described above, a clock cycle designation value is updated to be decreased from CIN=9 to CIN=6. Therefore, a signal level of the signal STA is caused to transition in a clock cycle (CCT=6) designated by CIN=6. A signal level of the signal STP transitions so as to correspond to the signal STA, and a time difference between transition timings of the signals STA and STP is TDF. On the other hand, in the clock cycle (CCT=6) designated by CIN=6, an inter-clock time difference of the clock signals CK1 and CK2 is TR=CIN×Δt=6Δt.

In the update method of the present embodiment, as indicated by A3 in FIG. 28, phase comparison between the signal STP and the clock signal CK2 is performed. In this case, in A3 in FIG. 28, transition timings (phases) of the signal STP and the clock signal CK2 match (substantially match) each other. In other words, in A3 in FIG. 28, a relationship of TDF=TR=6Δt is obtained. Therefore, a digital value corresponding to DQ=TR=6Δt is output as a digital value into which the time difference TDF of the signals STA and STP is converted.

In FIGS. 26 to 28, for simplification of description, a change value of the clock cycle designation value CIN in each update period is a value greater than 1, but, actually, a change value of the clock cycle designation value CIN may be 1 or GK which is a value of 1 or less as in ΔΣ type A/D conversion. GK is a gain coefficient, and is a value of GK≤1.

For example, in FIGS. 26 and 27, the clock cycle designation value CIN is increased from 3 to 9, but, actually, the clock cycle designation value CIN is updated to be increased by, for example, the predetermined value GK in each update period. For example, in a case where a gain coefficient of GK≤1 is set as GK, the clock cycle designation value CIN is updated to increase GK. For example, in a case where GK is 0.1, for example, if an update for increasing GK is continuously performed ten times, the clock cycle designation value CIN is incremented by 1.

For example, in FIGS. 27 and 28, the clock cycle designation value CIN is decreased from 9 to 6, but, actually, the clock cycle designation value CIN is updated to be decreased by, for example, the predetermined value GK in each update period. For example, the clock cycle designation value CIN is updated to decrease GK. For example, in a case where GK is 0.1, for example, if an update for increasing GK is continuously performed ten times, the clock cycle designation value CIN is decremented by 1.

It is assumed that, in A3 in FIG. 28, the clock cycle designation value CIN is updated even after the transition timings of the signal STP and the clock signal CK2 substantially match each other, and changes, for example, 6, 7, 6, 7, . . . . In this case, the digital value DQ which is output as a final result may be a value (for example, 6.5×Δt) between 6Δt and 7Δt. As mentioned above, according to the update method of the present embodiment, a substantial resolution can be reduced as in ΔΣ type A/D conversion.

As mentioned above, in the update method of the present embodiment, phase comparison is performed between the signal STP whose signal level transitions so as to correspond to the signal STA and the clock signal CK2, and the clock cycle designation value CIN for causing a signal level of the signal STA to transition is updated on the basis of a result of the phase comparison. Specifically, the clock cycle designation value CIN is updated in each update period. The updated cycle designation value CIN is configured to be fed back. Therefore, even in a case where time or a physical quantity as a measurement target dynamically changes, it is possible to perform time-to-digital conversion tracking the dynamic change. For example, as indicated by A3 in FIG. 28, even in a case where the clock cycle designation value CIN corresponding to a measurement target time (time difference TDF) comes close, and then the time dynamically changes, it is possible to cope with the dynamic change by sequentially updating the clock cycle designation value CIN according thereto.

In the update method of the present embodiment, in a case where an error component caused by mismatching between transition timings of the clock signals CK1 and CK2 is reduced, preferably, the time-to-digital conversion circuit 20 performs a process of converting a time difference into the digital value DQ on the basis of a clock cycle designation value, and number-of-clocks information of the clock signal CK1 or the clock signal CK2 in an update period corresponding to the clock cycle designation value. For example, the digital value DQ is obtained by updating the clock cycle designation value CIN on the basis of a phase comparison result between the signal STP and the clock signal CK2, and number-of-clocks information.

In other words, in the update method of the present embodiment, it is possible to perform time-to-digital conversion even if transition timings of the clock signals CK1 and CK2 do not exactly match each other at a phase synchronization timing. For example, in the update method of the present embodiment, each of the phase synchronization timings TMA and TMB may be a timing at which the chronological order of phases of the clock signals CK1 and CK2 changes, and transition timings of the clock signals CK1 and CK2 may not exactly match each other. In other words, in the present embodiment, there may be a modification in which the synchronization circuit 110 is not provided.

For example, a relationship of N/f1=M/f2 should be satisfied in order to exactly match transition timings of the clock signals CK1 and CK2 with each other in a phase synchronization timing. Here, N and M are respectively numbers of clocks of the clock signals CK1 and CK2 in an update period, and are integers of 2 or more. However, actually, it may be difficult to set the clock frequencies f1 and f2 in the oscillators XTAL1 and XTAL2 in FIG. 1 to frequencies at which the relationship of N/f1=M/f2 is completely satisfied. In a case where the relationship of N/f1=M/f2 is not satisfied, unless the synchronization circuit 110 is provided, deviation occurs between transition timings of the clock signals CK1 and CK2 at the phase synchronization timings TMA and TMB, and this deviation serves as a conversion error.

Therefore, in the update method of the present embodiment, the number of clocks N in each update period is measured. If deviation occurs between transition timings of the clock signals CK1 and CK2 at the phase synchronization timings TMA and TMB, the number of clocks N is not the same value at all times, and changes depending on an update period. The time-to-digital conversion circuit 20 updates the clock cycle designation value CIN on the basis of the number of clocks N changing as mentioned above, and a phase comparison result between the signal STP and the clock signal CK2. In the above-described way, it is possible to reduce a conversion error caused by deviation between transition timings of the clock signals CK1 and CK2 at the phase synchronization timings TMA and TMB.

10. Binary Search Method

Figure 29:
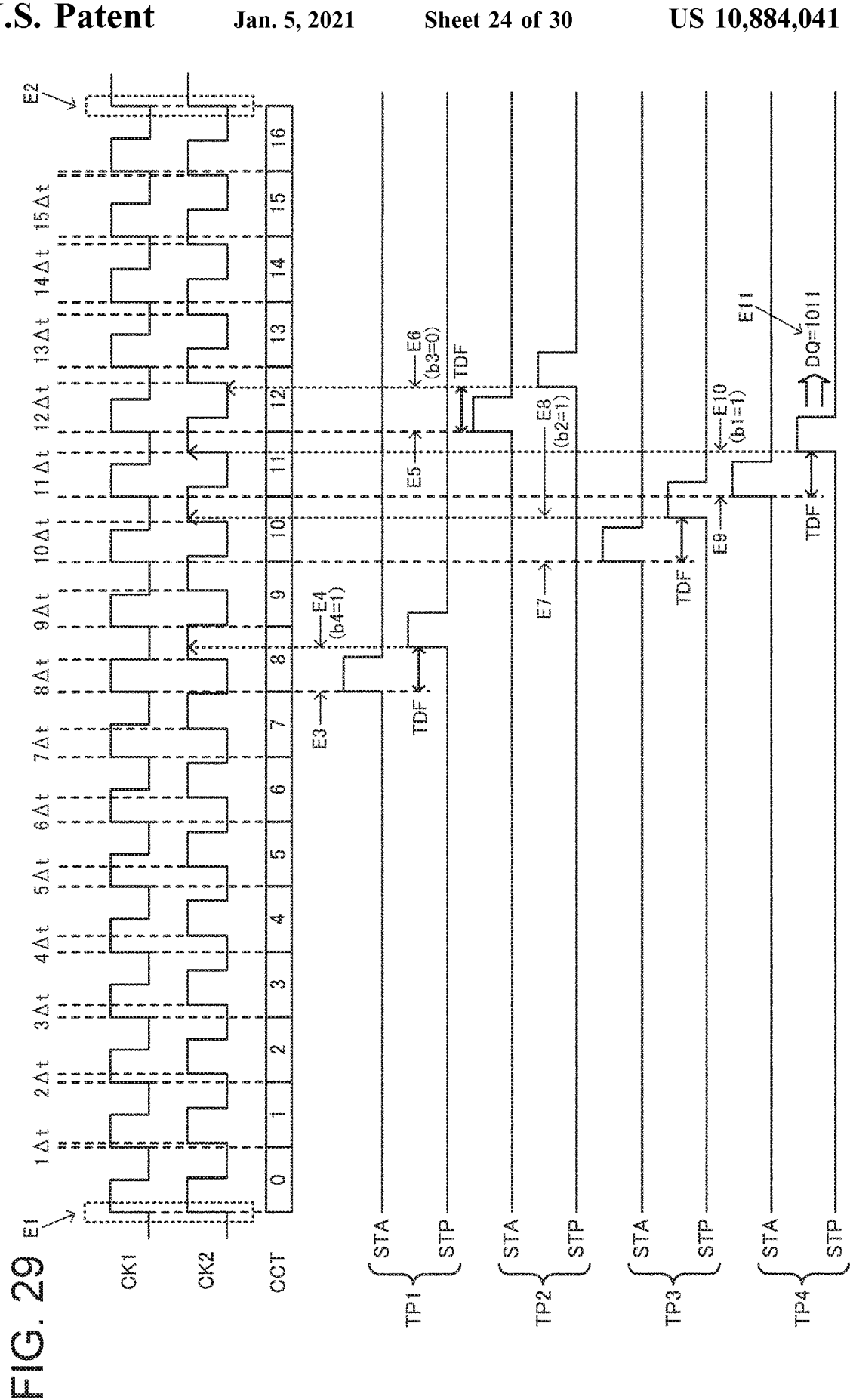
FIG. 29 is a signal waveform diagram for explaining a binary search method.

Next, as a time-to-digital conversion method of the present embodiment, a description will be made of a binary search method. FIG. 29 is a signal waveform diagram for explaining a binary search method. In FIG. 29, a digital value corresponding to a time difference between transition timings of the signal STA and the signal STP is obtained according to a binary search with a resolution corresponding to a frequency difference of the clock frequencies f1 and f2. Specifically, updating of the clock cycle designation value CIN based on a phase comparison result between the signal STP and the clock signal CK2 is performed through a binary search.

The binary search (halving method) is a method in which a search range is sequentially divided (halving) in order to narrow a search range and to obtain a final digital value. For example, the digital value DQ into which a time difference is converted is represented by 4-bit data, and respective 4 bits are assumed to be b4, b3, b2, and b1. Here, b4 is the MSB, and b1 is the LSB. In FIG. 29, the respective bits b4, b3, b2, and b1 of the digital value DQ is obtained through a binary search. For example, the respective bits b4, b3, b2, and b1 of the digital value DQ is sequentially obtained according to the same method as in A/D conversion using successive comparison.

For example, in FIG. 29, clock frequencies of the clock signals CK1 and CK2 are, for example, f1=100 MHz (cycle=10 ns), and f2=94.12 MHz (cycle=10.625 ns), a resolution is Δt=0.625 ns. In FIG. 29, E1 and E2 are phase synchronization timings, and are, for example, timings at which transition timings of the clock signals CK1 and CK2 match each other. The clock cycle designation value CIN is set to, for example, CIN=8 as an initial value. The initial value CIN=8 corresponds to, for example, a value around the center within an initial search range.

If CIN=8 is set as mentioned above, in a first update period of TP1 (first update period), as indicated by E3 in FIG. 29, a signal level of the signal STA is caused to transition in a case where a clock cycle value is CCT=8. If a signal level of the signal STP transitions so as to correspond to the signal STA, phase comparison is performed between the signal STP and the clock signal CK2. For example, phase comparison in which the signal STP is sampled with the clock signal CK2 is performed so that an "H" level of the clock signal CK2 is sampled as indicated by E4, and this "H" level is a phase comparison result. In a case where a phase comparison result is an "H" level as mentioned above, it is determined that a logic level of the bit b4 which is the MSB of the digital value DQ is b4=1.

If b4=1 is obtained as mentioned above, a search range in the binary search is narrowed, and CIN corresponding to the final digital value DQ is determined to be within a search range of, for example, 8 to 15. A clock cycle designation value is updated to, for example, CIN=12 so that a value (for example, a value around the center) within the search range is set.

If a clock cycle designation value is updated to CIN=12 as mentioned above, in the next update period of TP2 (second update period), as indicated by E5, a signal level of the signal STA is caused to transition in a case where a clock cycle value is CCT=12. For example, as indicated by E6, an "L" level of the clock signal CK2 is sampled through phase comparison between the signal STP and the clock signal CK2, and thus the "L" level is a phase comparison result. In a case where a phase comparison result is an "L" level as mentioned above, it is determined that a logic level of the next bit b3 of the digital value DQ is b3=0.

If b4=1 and b3=0 are obtained as mentioned above, a search range in the binary search is narrowed, and CIN corresponding to the final digital value DQ is determined to be within a search range of, for example, 8 to 11. A clock cycle designation value is updated to, for example, CIN=10 so that a value (for example, a value around the center) within the search range is set.

If a clock cycle designation value is updated to CIN=10 as mentioned above, in the next update period of TP3 (third update period), as indicated by E7, a signal level of the signal STA is caused to transition in a case where a clock cycle value is CCT=10. For example, as indicated by E8, an "H" level of the clock signal CK2 is sampled through phase comparison between the signal STP and the clock signal CK2, and thus the "H" level is a phase comparison result. In a case where a phase comparison result is an "H" level as mentioned above, it is determined that a logic level of the next bit b2 of the digital value DQ is b2=1.

Finally, if a clock cycle designation value is updated to CIN=11, in the next update period of TP4 (fourth update period), as indicated by E9, a signal level of the signal STA is caused to transition in a case where a clock cycle value is CCT=11. For example, as indicated by E10, an "H" level of the clock signal CK2 is sampled through phase comparison between the signal STP and the clock signal CK2, and thus the "H" level is a phase comparison result. In a case where a phase comparison result is an "H" level as mentioned above, it is determined that a logic level of the next bit b1 which is the LSB of the digital value DQ is b1=1. As indicated by E11, DQ=1011 (binary number) is output as an output code which is a final digital value.

If such a binary search method is used, it is possible to obtain the digital value DQ corresponding to a time difference between transition timings of the signals STA and STP at a high speed. For example, in the technique of the related art disclosed in JP-A-5-87954, in a case of FIG. 29, it is necessary to perform time measurement, for example, a maximum of fifteen times in order to obtain the final digital value DQ. In contrast, according to the method of the present embodiment, as illustrated in FIG. 29, the final digital value DQ can be obtained in, for example, four update periods, and thus it is possible to perform time-to-digital conversion at a high speed.

Particularly, in a case where the resolution Δt is reduced, and thus the number of bits L of the digital value DQ is increased, in the technique of the related art, for example, time measurement of the number of times of about $2^L$ is necessary, and thus conversion time is considerably increased. In contrast, according to the method of the present embodiment, the final digital value DQ can be obtained in, for example, L update periods, and thus it is possible to perform time-to-digital conversion at a considerably higher speed than in the technique of the related art.

A high-order bit side of the digital value DQ may be obtained according to the binary search method in FIG. 29, and then a low-order bit side (for example, low-order bits including the LSB or low-order bits of the LSB) may be obtained according to the update method described in, for example, FIGS. 26 to 28. For example, in FIG. 29, as in the A/D conversion using successive comparison, a search range (successive comparison range) is sequentially narrowed, and the clock cycle designation value CIN is updated so that a value within the search range is obtained. In contrast, in the update methods in FIGS. 26 to 28, as in the ΔΣ type A/D conversion, the clock cycle designation value CIN is updated to increase or decrease GK on the basis of a phase comparison result. GK is a gain coefficient, and is a value of GK≤1. Specifically, in a case where a phase of the signal STP delays with respect to a phase of the clock signal CK2 as a phase comparison result, the clock cycle designation value CIN is updated (digital calculation process) to be increased by GK. On the other hand, in a case where a phase of the signal STP advances with respect to a phase of the clock signal CK2 as a phase comparison result, the clock cycle designation value CIN is updated (digital calculation process) to be decreased by GK. By combining the two methods with each other, it is possible to realize both a high speed and high accuracy of time-to-digital conversion.

11. Other Configuration Example

Figure 30:
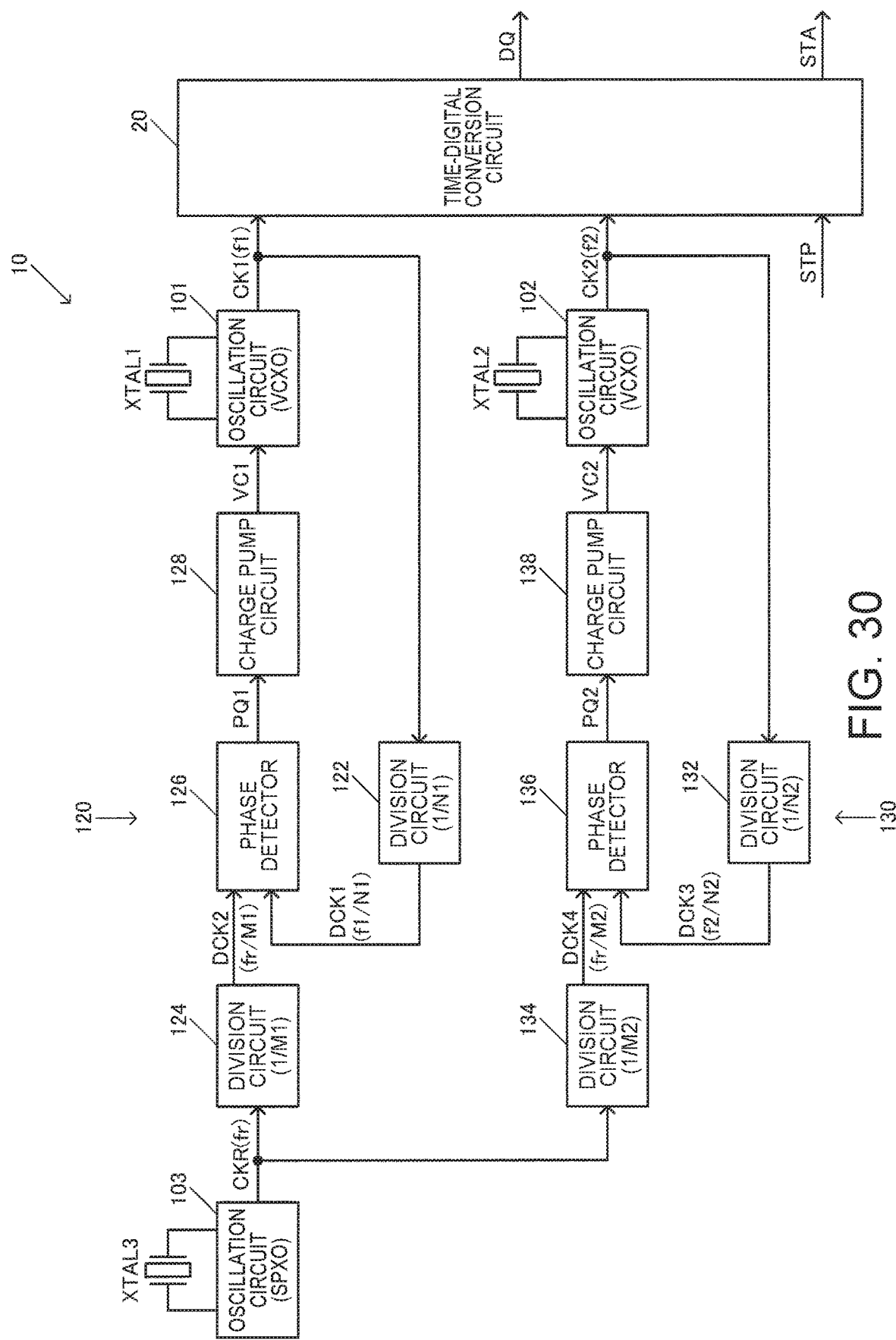
FIG. 30 illustrates another configuration example of the integrated circuit device.

FIG. 30 illustrates another configuration example of the integrated circuit device 10 according to the present embodiment. In the integrated circuit device 10 in FIG. 30, a plurality of PLL circuits 120 and 130 are provided as the synchronization circuit 110 illustrated in FIG. 16.

The PLL circuit 120 (first PLL circuit) performs phase synchronization between the clock signal CK1 and a reference clock signal CKR. Specifically, the PLL circuit 120 receives the clock signal CK1 having the clock frequency f1 generated by using the oscillator XTAL1 (first resonator), and the reference clock signal CKR, and performs phase synchronization between the clock signal CK1 and the reference clock signal CKR. For example, the PLL circuit 120 performs phase synchronization between the clock signal CK1 and the reference clock signal CKR at a first phase synchronization timing (in each first period) (matches transition timings thereof with each other).

The PLL circuit 130 (second PLL circuit) performs phase synchronization between the clock signal CK2 and the reference clock signal CKR. Specifically, the PLL circuit 130 receives the clock signal CK2 having the clock frequency f2 generated by using the oscillator XTAL2 (second oscillator), and the reference clock signal CKR, and performs phase synchronization between the clock signal CK2 and the reference clock signal CKR. For example, the PLL circuit 130 performs phase synchronization between the clock signal CK2 and the reference clock signal CKR at a second phase synchronization timing (in each second period) (matches transition timings thereof with each other).

For example, an oscillation circuit 103 causes an oscillator XTAL3 (third oscillator) to oscillate, and thus the reference clock signal CKR is generated. A clock frequency fr of the reference clock signal CKR is different from the clock frequencies f1 and f2 of the clock signals CK1 and CK2, and is lower than, for example, the clock frequencies f1 and f2. As the oscillator XTAL3, the same element as that of the oscillators XTAL1 and XTAL2 may be used, and, for example, a quartz crystal resonator may be used. By using the quartz crystal resonator, it is possible to generate the highly accurate reference clock signal CKR in which a jitter or a phase error is reduced, and, as a result, it is possible to realize high accuracy of time-to-digital conversion by also reducing jitters or phase errors of the clock signals CK1 and CK2.

As mentioned above, in the present embodiment, phases of the clock signal CK1 and the reference clock signal CKR are synchronized with each other by the PLL circuit 120, and phases of the clock signal CK2 and the reference clock signal CKR are synchronized with each other by the PLL circuit 130. Consequently, the phases of the clock signal CK1 and the clock signal CK2 are synchronized with each other. There may be a modification in which three or more PLL circuits (three or more oscillators) are provided, and phase synchronization between the clock signals CK1 and CK2 is performed.

Specifically, the PLL circuit 120 includes division circuits 122 and 124 (first and second division circuits) and a phase detector 126 (first phase comparator). The division circuit 122 performs frequency division so that the clock frequency f1 of the clock signal CK1 is multiplied by 1/N1, and thus outputs a frequency-divided clock signal DCK1 having f1/N1 as a clock frequency. The division circuit 124 performs frequency division so that the clock frequency fr of the reference clock signal CKR is multiplied by 1/M1, and thus outputs a frequency-divided clock signal DCK2 having a fr/M1 as a clock frequency. The phase detector 126 performs phase comparison between the frequency-divided clock signal DCK1 and the frequency-divided clock signal DCK2, and outputs a signal PQ1 which is an up/down signal to a charge pump circuit 128. The oscillation circuit 101 (VCXO) performs an oscillation operation of the oscillator XTAL1 whose oscillation frequency is controlled on the basis of a control voltage VC1 from the charge pump circuit 128, and thus generates the clock signal CK1.

Specifically, the PLL circuit 130 includes division circuits 132 and 134 (third and fourth division circuits) and a phase detector 136 (second phase comparator). The division circuit 132 performs frequency division so that the clock frequency f2 of the clock signal CK2 is multiplied by 1/N2, and thus outputs a frequency-divided clock signal DCK3 having f2/N2 as a clock frequency. The division circuit 134 performs frequency division so that the clock frequency fr of the reference clock signal CKR is multiplied by 1/M2, and thus outputs a frequency-divided clock signal DCK4 having a fr/M2 as a clock frequency. The phase detector 136 performs phase comparison between the frequency-divided clock signal DCK3 and the frequency-divided clock signal DCK4, and outputs a signal PQ2 which is an up/down signal to a charge pump circuit 138. The oscillation circuit 102 (VCXO) performs an oscillation operation of the oscillator XTAL2 whose oscillation frequency is controlled on the basis of a control voltage VC2 from the charge pump circuit 138, and thus generates the clock signal CK2.

Figure 31:
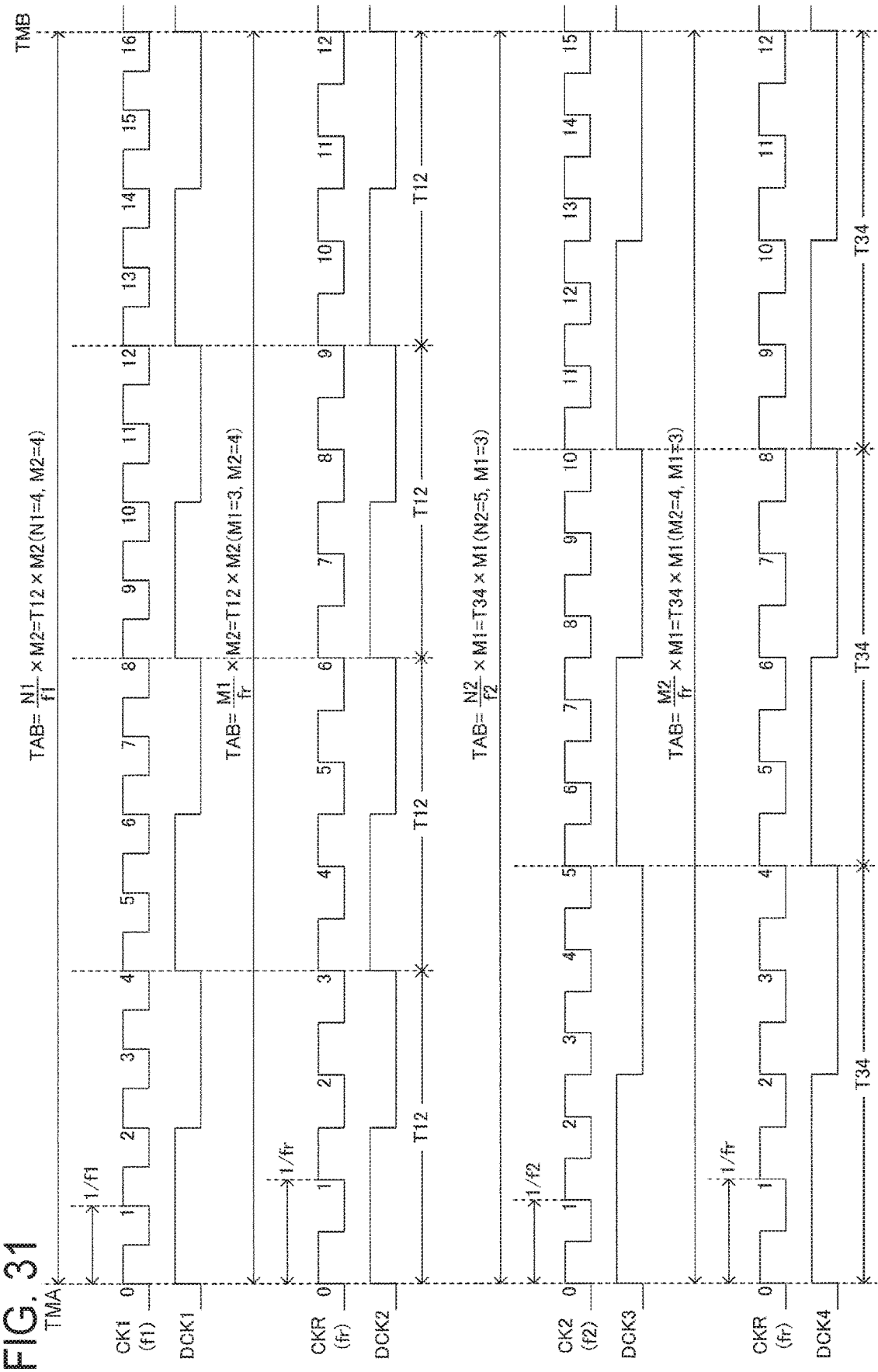
FIG. 31 is a signal waveform diagram for explaining an operation in another configuration example of the integrated circuit device.

FIG. 31 is a signal waveform diagram for explaining an operation of the integrated circuit device 10 illustrated in FIG. 30. For simplification of description, FIG. 31 illustrates an example in which N1=4, M1=3, N2=5, and M2=4 are set, but, actually, N1, M1, N2, and M2 are set to considerably great numbers in order to heighten a resolution.

As illustrated in FIG. 31, a signal obtained by dividing a frequency of the clock signal CK1 by N1=4 is the frequency-divided clock signal DCK1, and a signal obtained by dividing a frequency of the reference clock signal CKR by M1=3 is the frequency-divided clock signal DCK2, and phase synchronization is performed in each period T12. In other words, phases of the clock signal CK1 and the reference clock signal CKR are synchronized with each other by the PLL circuit 120 so that a relationship of T12=N1/f1=M1/fr is established.

A signal obtained by dividing a frequency of the clock signal CK2 by N2=5 is the frequency-divided clock signal DCK3, and a signal obtained by dividing a frequency of the reference clock signal CKR by M2=4 is the frequency-divided clock signal DCK4, and phase synchronization is performed in each period T34. In other words, phases of the clock signal CK2 and the reference clock signal CKR are synchronized with each other by the PLL circuit 130 so that a relationship of T34=N2/f2=M2/fr is established. As mentioned above, since phases of the clock signal CK1 and the reference clock signal CKR are synchronized with each other in each period T12, and phases of the clock signal CK2 and the reference clock signal CKR are synchronized with each other in each period T34, phases of the clock signals CK1 and CK2 are synchronized with each other in each period TAB. Here, a relationship of TAB=T12×M2=T34×M1 is established. For example, in a case of M2=4 and M1=3, TAB is T12×4=T34×3.

Figures 32, 33:
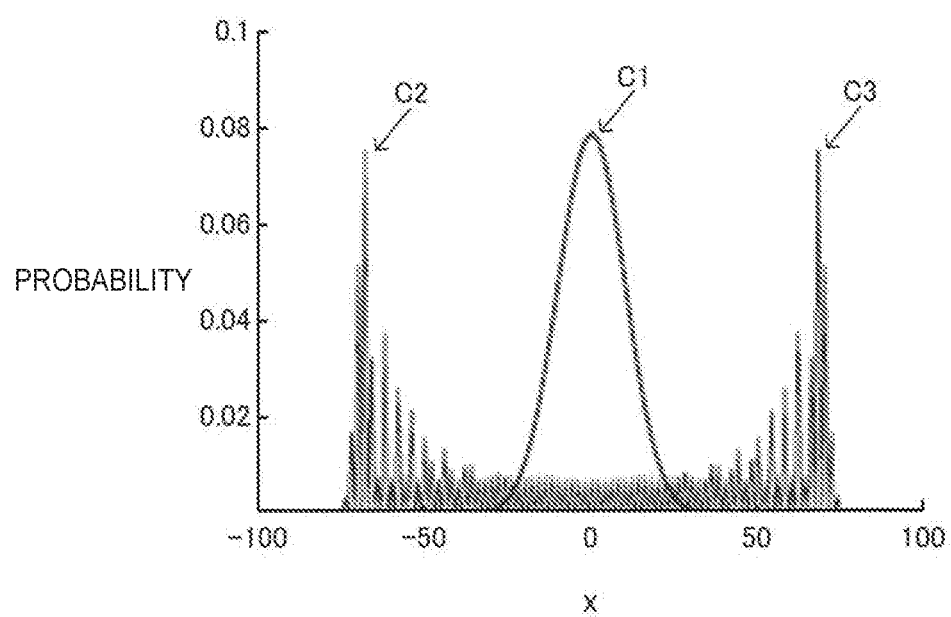
FIG. 32 is a diagram illustrating an example of setting a division ratio.
FIG. 33 is a diagram for explaining a random walk and a quantum walk.

The frequency division ratios N1, M1, N2 and M2 of the division circuits 122, 124, 132 and 134 in FIG. 30 are actually set to considerably great numbers. FIG. 32 illustrates an example of setting frequency division ratios. For example, in a case where a clock frequency of the reference clock signal CKR is fr=101 MHz, frequency division ratios of the division circuits 122 and 124 are respectively set to be N1=101 and M1=100, and thus the clock signal CK1 having f1=102.01 MHz is generated by the PLL circuit 120. Frequency division ratios of the division circuits 132 and 134 are respectively set to be N2=102 and M2=101, and thus the clock signal CK2 having f2=102 MHz is generated by the PLL circuit 130. Consequently, the resolution (temporal resolution) in time-to-digital conversion, described in FIG. 2, can be set to be Δt=|1/f1−1/f2|=0.96 picoseconds (ps), and thus it is possible to perform time-to-digital conversion with a considerably high resolution.

As illustrated in FIG. 32, N1 and M1 are different integers of 2 or more, and N2 and M2 are also different integers of 2 or more. At least one of N1 and M1, and at least one of N2 and M2 are different from each other. Preferably, the greatest common divisor between N1 and N2 is 1, the least common multiple therebetween is N1×N2, and the greatest common divisor between M1 and M2 is 1, and the least common multiple therebetween is M1×M2.

In FIG. 32, a relationship of |N1×M2−N2×M1|=1 is established. In other words, N1, M1, N2, and M2 are set so that the relationship of |N1×M2−N2×M1|=1 is established. For example, in FIG. 31 in which N1=4, M1=3, N2=5, and M2=4 are set, |N1×M2−N2×M1|=|4×4−5×3|=1 is obtained. This indicates that a length corresponding to sixteen clock signals CK1 is the same as a length corresponding to fifteen clock signals CK2. In the above-described way, the clock signal CK1 and the clock signal CK2 are deviated relative to each other by one clock cycle (one clock period) in each period TAB. Consequently, it is possible to easily performed time-to-digital conversion using a Nonius' (Vernier) principle.

In FIGS. 30 and 31, phase synchronization is performed between the clock signal CK1 and the reference clock signal CKR in each period T12 shorter than the period TAB, and phase synchronization is performed between the clock signal CK2 and the reference clock signal CKR in each period T34 shorter than the period TAB. Therefore, a frequency of performing phase comparison increases compared with the above-described configuration example in FIG. 19, and thus it is possible to reduce jitters (cumulative jitter) of the clock signals CK1 and CK2 or phase noise. Particularly, in a case where N1, M1, N2, and M2 are set to great numbers in order to realize a high resolution Δt, in the configuration example illustrated in FIG. 19, a length of the period TAB is considerably increased, errors are accumulated, and thus jitters or errors become considerable. In contrast, in FIGS. 30 and 31, since phase comparison is performed in the respective periods T12 and T34 shorter than the period TAB, accumulated errors can be reduced, and thus there is an advantage in that a jitter or a phase error can be improved.

The PLL circuits 120 and 130 in FIG. 30 have an analog type circuit configuration, but may employ a digital type (ADPLL) circuit configuration. In this case, each PLL circuit (120, 130) may be implemented by, for example, a phase detector having a counter and a TDC, and a digital calculation unit. The counter generates digital data corresponding to an integer part as a result of dividing a clock frequency (fr) of a reference clock signal (CKR) by a clock frequency (f1, f2) of a clock signal (CK1, CK2). The TDC generates digital data corresponding to a fractional part of the division result. Digital data corresponding to an addition result of the integer part and the fractional part is output to the digital calculation unit. The digital calculation unit detects a phase error with set frequency data on the basis of the set frequency data (FCW1, FCW2) and the digital data regarding a comparison result from the phase detector, performs a smoothing process on the phase error so as to generate frequency control data, and outputs the frequency control data to an oscillation circuit (101, 102). An oscillation frequency of the oscillation circuit is controlled on the basis of the frequency control data, and thus a clock signal (CK1, CK2) is generated. Instead of using the TDC, a digital type PLL circuit may be implemented by a bang-bang type phase detector and a configuration using PI control.

12. Jitter and Resolution

As mentioned above, in the present embodiment, high resolution time-to-digital conversion is realized, but there is a problem in that accuracy corresponding to a high resolution cannot be realized due to a cumulative jitter of a clock signal. For example, if a jitter is only treated as white noise, the cumulative jitter exhibits, for example, a random walk. In other words, in contrast with a jitter (white noise) such as complete noise not having autocorrelation, a cumulative jitter which is accumulated exhibits a random walk and thus has autocorrelation.

For example, the random walk converges on a normal distribution (Gaussian distribution) as indicated by C1 in FIG. 33. A quantum walk converges on a predetermined probability density function having a finite base (compact support) as indicated by C2 and C3.

For example, in FIG. 13, phase synchronization is performed between the clock signals CK1 and CK2 in each period TAB. As indicated by D1 in FIG. 34, there is a jitter in the clock signals CK1 and CK2 in each clock cycle. Phases of the clock signals CK1 and CK2 are synchronized with each other in each period TK, but D2 indicates a cumulative jitter in this period TK. Here, a jitter amount of the clock signals CK1 and CK2 per clock cycle is indicated by J, and the number of clocks of one (or reference clock signal) of the clock signals CK1 and CK2 in the period TK is indicated by K. In this case, if a random walk is assumed, a cumulative jitter amount (jitter accumulated error) may be represented by, for example, $K^{1/2} \times J$. If a quantum walk is assumed, a cumulative jitter amount may be represented by, for example, $K \times J$.

Here, the jitter amount J indicates a deviation between phases relative to an ideal clock signal, and is expressed as an RMS value, and the unit thereof is time. For example, the jitter amount J is a standard value (maximum standard value) defined depending on performance or the like of an oscillator, and is an RMS value indicating an average deviation between phases per clock. The number of clocks K is the number of clocks (instances) of one clock signal in the period TK between a timing at which one of the clock signals CK1 and CK2 is phase-synchronized with the other clock signal or a reference clock signal (CKR) and the next phase synchronization timing. In the example illustrated in FIG. 13, the number of clocks K corresponds to the number of clocks N and M of the clock signals CK1 and CK2. The period TK corresponds to the period TAB in FIG. 13. In a case where a frequency of one of the clock signals CK1 and CK2 is indicated by f (f1, f2), and a resolution in time-to-digital conversion is indicated by Δt, the number of clocks may be expressed by K=1/(f×Δt). On the other hand, in the example illustrated in FIG. 30, the number of clocks K corresponds to N1 and N2 in FIG. 32. The period TK corresponds to the periods T12 and T34 in FIG. 31.

Figure 34:
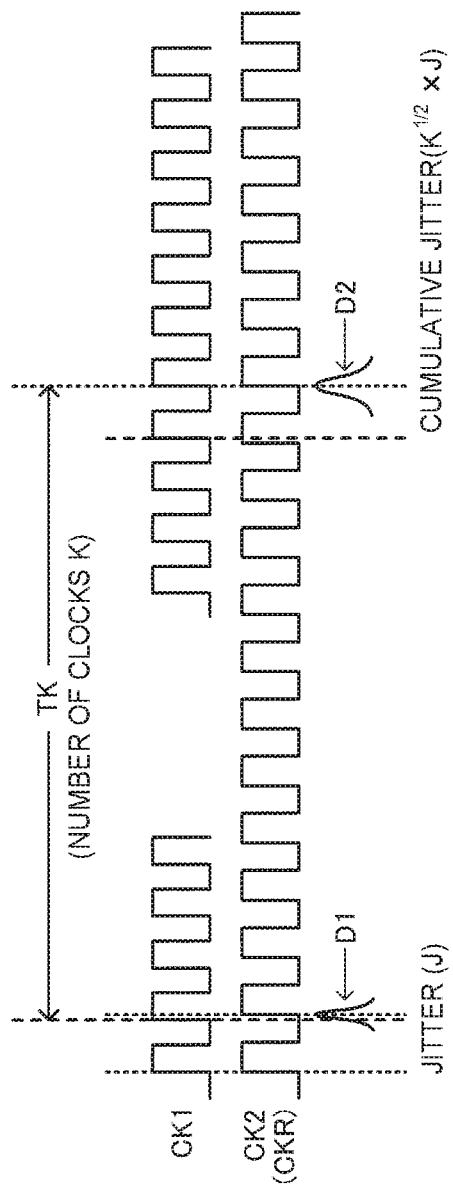
FIG. 34 is a diagram for explaining a cumulative jitter.

As illustrated in FIG. 34, as the number of clocks K in the period TK indicating a phase synchronization interval increases, an error amount due to a cumulative jitter increases, and thus accuracy is reduced. In this sense, in the configuration example illustrated in FIG. 30, since the number of clocks K in the period TK can be reduced, an error amount due to a cumulative jitter can be reduced, and accuracy can be improved.

Figure 35:
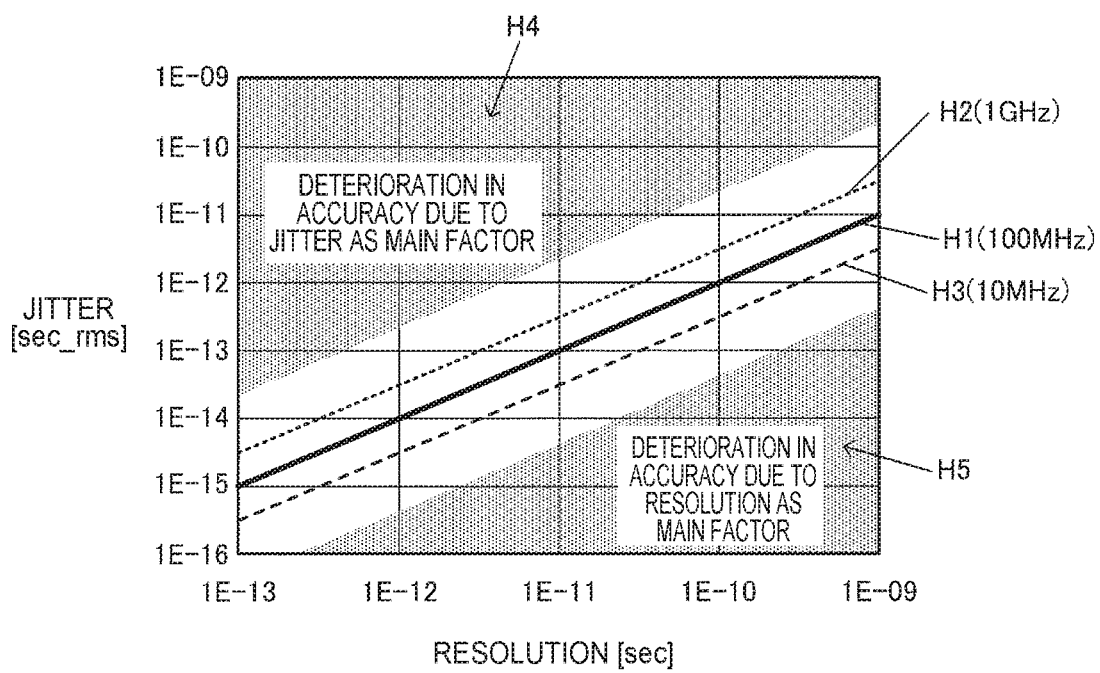
FIG. 35 is a diagram for explaining a relationship between resolution and jitter.

H1, H2, and H3 in FIG. 35 indicate, for example, a relationship between a resolution (sec) and a jitter (sec_rms) of a clock signal in a case where a random walk is assumed. H1, H2, and H3 in FIG. 35 indicate a relationship between a resolution and a jitter, for example, in a case where a cumulative jitter amount is represented by $K^{1/2} \times J$, and respectively correspond to cases where a frequency of a clock signal (CK1, CK2) is 100 MHz, 1 GHz, and 10 MHz. In FIG. 35, a region indicated by H4 is a region in which accuracy deteriorates due to jitter as a main factor. A region indicated by H5 is a region in which accuracy deteriorates due to resolution as a main factor.

For example, H1 in FIG. 35 indicates a case where a frequency of the clock signal is 100 MHz, and the number of clocks K is about $10^4$. For example, in H1, in a case where a resolution (Δt) is 1 ps ($10^{-12}$ sec), a jitter (J) is 0.01 ps ($10^{-14}$ sec_rms), and a relationship of $\Delta t = K^{1/2} \times J$ is established at $K=10^4$. For example, since the number of clocks K can be reduced if a frequency of the clock signal is increased to, for example, 1 GHz, a line indicating the relationship of $\Delta t = K^{1/2} \times J$ appears in H2, and thus the demand for a jitter is relaxed. On the other hand, since the number of clocks K is increased if a frequency of the clock signal is decreased to, for example, 10 MHz, a line indicating the relationship of $\Delta t = K^{1/2} \times J$ appears in H3, and thus the demand for a jitter becomes strict.

Figure 36:
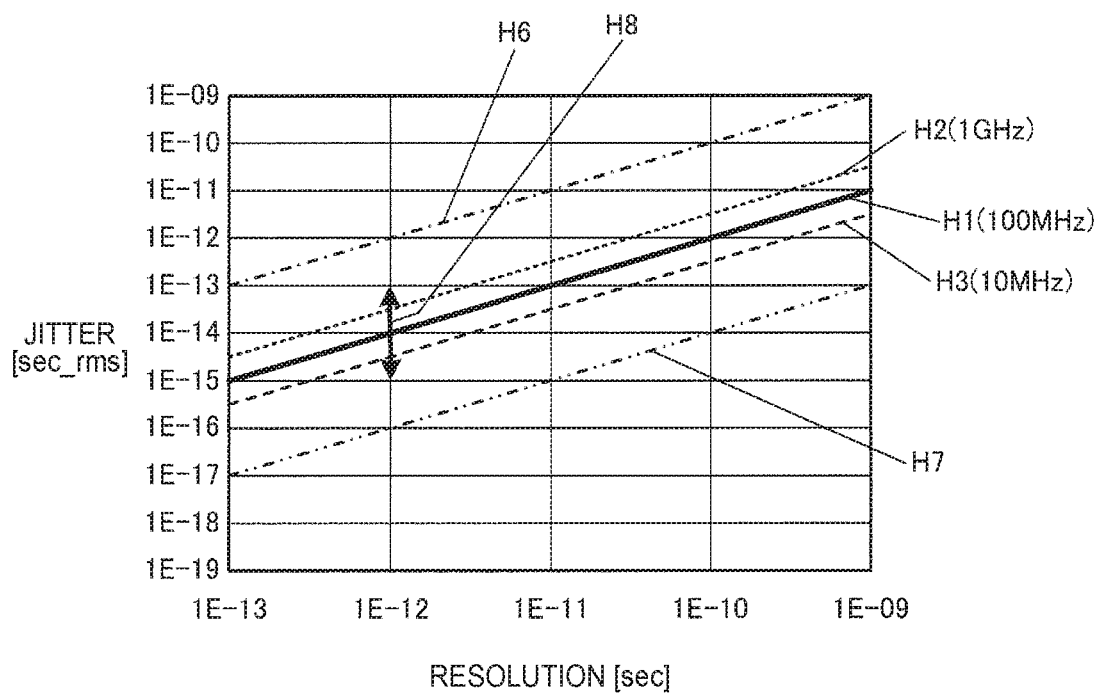
FIG. 36 is a diagram for explaining a relationship between resolution and jitter.

In the present embodiment, in a case where a jitter amount of the clock signals CK1 and CK2 per clock cycle is indicated by J, and a resolution in time-to-digital conversion is indicated by Δt, at least a relationship of $J \leq \Delta t$ is established. For example, H6 in FIG. 36 indicates a line in which a relationship of $J = \Delta t$ is established, and this corresponds to a region in which accuracy deteriorates due to jitter as a main factor as indicated by H4 in FIG. 35, and indicates an upper limit of the jitter that the jitter does not exceed at least a resolution. For example, in a case where a resolution (Δt) is 1 ps ($10^{-12}$ sec), the jitter amount J is to be at least 1 ps ($10^{-12}$ sec_rms), and thus the jitter amount J is not allowed to exceed 1 ps (RMS value). This is because, if the jitter amount J exceeds 1 ps, achievement of a high resolution such as Δt=1 ps is meaningless.

In the present embodiment, in a case where the number of clocks of one clock signal in the period TK between a timing at which one of the clock signals CK1 and CK2 is phase-synchronized with the other clock signal or a reference clock signal (CKR) and the next phase synchronization timing is indicated by K, a relationship of J≥Δt/K is established. For example, H7 in FIG. 36 indicates a line in which the relationship of J≥Δt/K is established, and this corresponds to a region in which accuracy deteriorates due to resolution as a main factor as indicated by H5 in FIG. 35, and indicates a lower limit of the jitter for a resolution. For example, H7 corresponds to a quantum walk. If J≥Δt/K as mentioned above, this can also cope with a case where a behavior of a cumulative jitter is assumed to be a quantum walk, and thus an oscillator in which jitter characteristics are good more than necessary may not be selected.

For example, a frequency of a clock signal (CK1, CK2) is indicated by f (f1, f2), and the number of clocks in the period TK is indicated by K, a relationship of K=1/(f×Δt) is established. In the example illustrated in FIG. 13, N=1/(f1×Δt) and M=1/(f2×Δt) are established. This indicates that phases of one clock signal and the other clock signal (CK1, CK2) are deviated relative to each other by one clock cycle in each period TK (TAB). Therefore, the relational expression of J≥Δt/K becomes a relational expression of J≥f×Δt² when expressed by the frequency f of the clock signal.

In the present embodiment, for example, a relationship of $(1/10)\times(\Delta t/K^{1/2})\leq J\leq 10\times(\Delta t/K^{1/2})$ is established. For example, in a case where a clock frequency is 100 MHz, H1 in FIG. 36 corresponds to the line of $J=\Delta t/K^{1/2}$, and this corresponds to a line of a random walk. In this case, for example, in a range indicated by H8 in FIG. 36, accuracy does not deteriorate due to jitter as a main factor as indicated by H4 in FIG. 35, or accuracy does not deteriorate due to resolution as a main factor as indicated by H5. The relationship of $(1/10)\times(\Delta t/K^{1/2})\leq J\leq 10\times(\Delta t/K^{1/2})$ is included in the range indicated by H8 in FIG. 36, and a relationship between a resolution and a jitter is preferably included in the range indicated by H8. Since the region of the range indicated by H8 is a region corresponding to a boundary between a region in which a cumulative jitter regulates accuracy and a region in which a resolution regulates accuracy, it is possible to perform time-to-digital conversion with high accuracy even if an oscillator having an over-specification is not used.

For example, if a random walk is assumed, a relational expression in which a resolution and a cumulative jitter amount antagonize each other may be expressed by $J=\Delta t/K^{1/2}$. As described above, in a case where a relationship of K=1/(f×Δt) is established, the relationship of $J=\Delta t/K^{1/2}$ becomes a relationship of $J=(f\times\Delta t^3)^{1/2}$. Therefore, as in FIG. 36, if a frequency f of a clock signal is set to a range of 10 MHz to 1 GHz, a relationship of $(10^7\times\Delta t^3)^{1/2}\leq J\leq(10^9\times\Delta t^3)^{1/2}$ is established. If a frequency f of a clock signal is set to a range of 10 KHz to 10 GHz, a relationship of $(10^4\times\Delta t^3)^{1/2}\leq j\leq(10^{10}\times\Delta t^3)^{1/2}$ is established.

13. Electronic Apparatus and Vehicle

Figure 37:
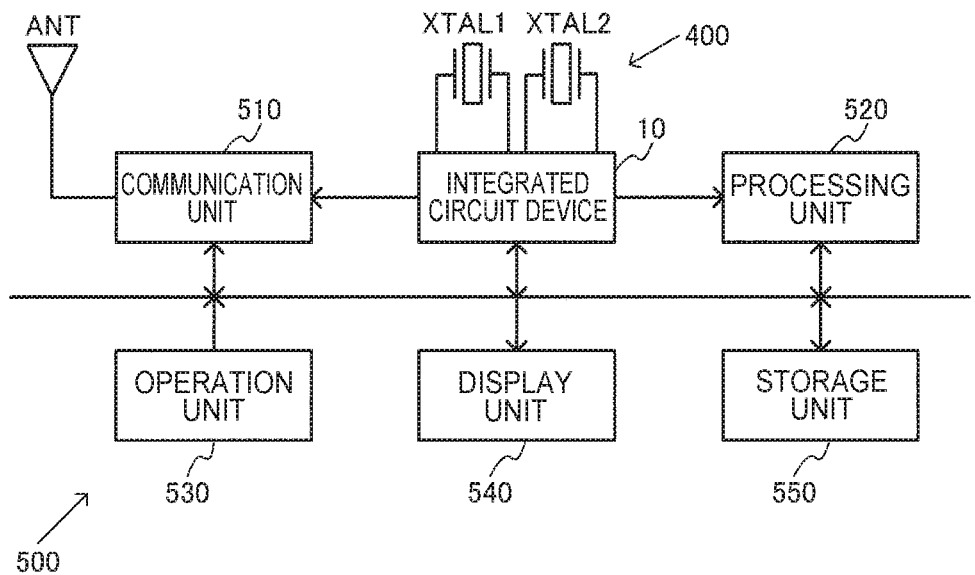
FIG. 37 illustrates a configuration example of an electronic apparatus.

FIG. 37 illustrates a configuration example of an electronic apparatus 500 including the integrated circuit device 10 of the present embodiment. The electronic apparatus 500 includes the integrated circuit device 10 and the oscillators XTAL1 and XTAL2 of the present embodiment, and a processing unit 520. A communication unit 510, an operation unit 530, a display unit 540, a storage unit 550, and an antenna ANT may be included. The physical quantity measurement apparatus 400 is formed of the integrated circuit device 10 and the oscillators XTAL1 and XTAL2. However, the electronic apparatus 500 is not limited to the configuration illustrated in FIG. 37, and may be variously modified, for example, some of the constituent elements may be omitted, or other constituent elements may be added thereto.

The electronic apparatus 500 may be, for example, a measurement apparatus measuring a physical quantity such as a distance, time, a flow velocity, or a flow rate, a biological information measurement apparatus (ultrasonic measurement apparatus, a pulse wave meter, a blood pressure measurement apparatus, or the like), an on-vehicle apparatus (an apparatus for automatic driving), and a network related apparatus of a base station or a router. The electronic apparatus 500 may be, for example, a wearable apparatus such as a head mounted display or a watch related apparatus, a printing apparatus, a projection apparatus, a robot, a portable information terminal (a smart phone, a mobile phone, a portable game apparatus, a notebook PC, or a tablet PC), a content providing apparatus delivering content, or a video apparatus such as a digital camera or a video camera.

The communication unit 510 (wireless circuit) performs a process of receiving data from the outside via the antenna ANT or transmitting data to the outside via the antenna ANT. The processing unit 520 performs a control process on the electronic apparatus 500, or various digital processes on data transmitted and received via the communication unit 510. The processing unit 520 performs various processes using physical quantity information measured in the physical quantity measurement apparatus 400. The functions of the processing unit 520 may be realized by, for example, a processor such as a microcomputer.

The operation unit 530 is used for a user's input operation, and may be implemented by operation buttons, a touch panel display, and the like. The display unit 540 displays various pieces of information, and may be implemented by a liquid crystal display or an organic EL display. If a touch panel display is used as the operation unit 530, the touch panel display also functions as the operation unit 530 and the display unit 540. The storage unit 550 stores data, and a function thereof may be realized by, for example, a semiconductor memory such as a RAM or a ROM, or a hard disk drive (HDD).

Figure 38:
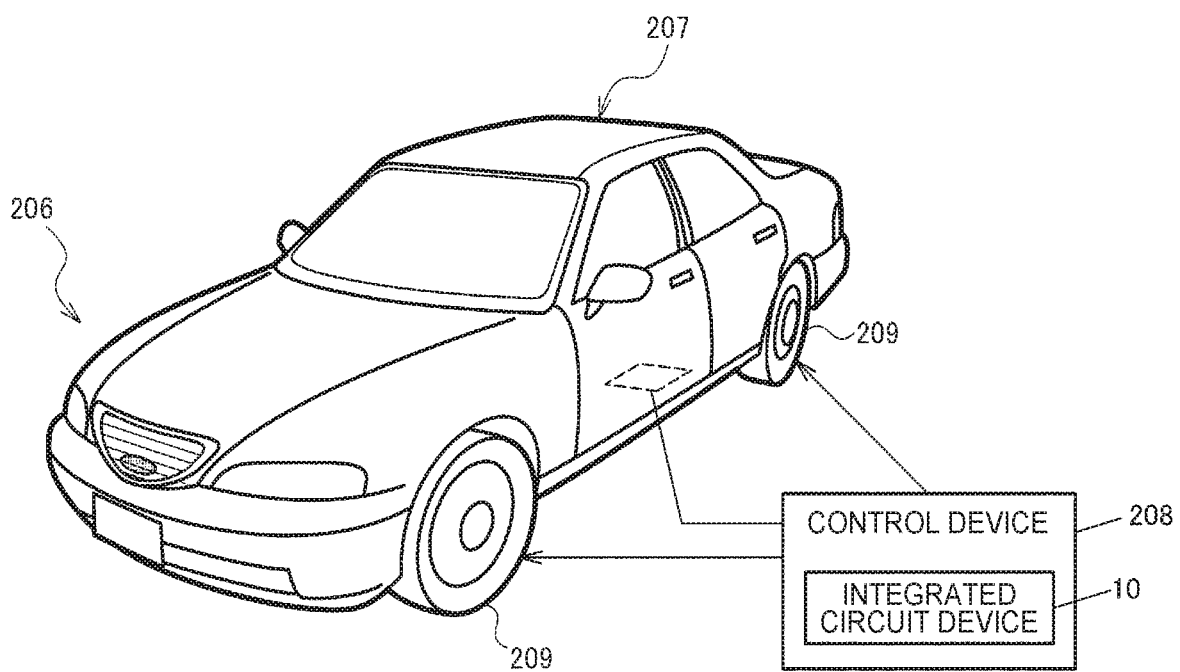
FIG. 38 illustrates a configuration example of a vehicle.

FIG. 38 illustrates an example of a vehicle including the integrated circuit device 10 of the present embodiment. The integrated circuit device 10 (oscillator) of the present embodiment may be incorporated into various vehicles such as a car, an aircraft, a motorbike, a bicycle, and a ship. The vehicles are pieces of equipment or instruments which are provided with, for example, driving mechanisms such as engines or motors, steering mechanisms such as handles or rudders, and various electronic apparatuses (on-vehicle apparatuses), and move on the ground, in the air, and in the sea. FIG. 38 schematically illustrates an automobile 206 as a specific example of a vehicle. The physical quantity measurement apparatus (not illustrated) including the integrated circuit device 10 and the oscillator of the present embodiment is incorporated into the automobile 206 (vehicle). A control device 208 performs various control processes on the basis of physical quantity information measured in the physical quantity measurement apparatus. For example, in a case where distance information of an object around the automobile 206 is measured as physical quantity information, the control unit 208 performs various control processes for automatic driving by using the measured distance information. The control device 208 controls hardness and softness of a suspension or a brake of each car wheel 209, for example, in accordance with the attitude of a car body 207. An apparatus into which the integrated circuit device 10 or the physical quantity measurement apparatus of the present embodiment is incorporated is not limited to the control device 208, and the circuit device or the oscillator of the present embodiment may be incorporated into various apparatuses (on-vehicle apparatuses) provided in a vehicle such as the automobile 206.

Although the present embodiment has been described as above in detail, it can be easily understood by a person skilled in the art that various modifications without substantially departing from the new matters and effects of the invention are possible. Therefore, these modifications are all included in the scope of the invention. For example, in the specification or the drawings, the terminologies (a clock cycle designation value, a control voltage, and the like) which are mentioned at least once along with different terminologies (clock cycle designation information, a control signal, and the like) which have broader meanings or the same meanings may be replaced with the different terminologies in any location of the specification or the drawings. All combinations of the present embodiment and the modification examples are included in the scope of the invention. In addition, configurations and operations of the physical quantity measurement apparatus, the integrated circuit device, the electronic apparatus, and the vehicle, configurations of the oscillation circuit, the measurement unit, the time-to-digital conversion circuit, and the control unit, the control process, the time-to-digital conversion process, the phase synchronization process, the oscillation process, and the first and second signal generation process, and the phase comparison process in the control unit are also not limited to the above description of the present embodiment, and may have various modifications.

The entire disclosure of Japanese Patent Application Nos. 2016-187798 filed Sep. 27, 2016 and 2017-102223 filed May 24, 2017 are expressly incorporated by reference herein.

What is claimed is:

1. A physical quantity measurement apparatus comprising:
    a first resonator;
    a second oscillator; and
    an integrated circuit device,
    wherein the integrated circuit device includes:
        a first oscillation circuit configured to cause the first resonator to oscillate and generate a first clock signal having a first clock frequency,
        a second oscillation circuit configured to cause the second oscillator to oscillate and generate a second clock signal having a second clock frequency, the second clock frequency being different from the first clock frequency, and
        a measurement unit having a time-to-digital conversion circuit configured to convert time into a digital value based on the first clock signal and the second clock signal,
    wherein the time-to-digital conversion circuit is configured to convert a time difference between transition timings of a first signal and a second signal into a digital value,
    wherein an inter-clock time difference is a time difference between transition timings of the first clock signal and the second clock signal in a first clock cycle to an i-th clock cycle,
    wherein the inter-clock time difference is $\Delta t$ to $i \times \Delta t$, where $\Delta t$ is a resolution and i is an integer of 2 or more, after a phase synchronization timing of the first clock signal and the second clock signal, and
    wherein the time-to-digital conversion circuit is configured to specify that the time difference of the first signal and the second signal corresponds to one of $\Delta t$ to $i \times \Delta t$.

2. The physical quantity measurement apparatus according to claim 1,
    wherein the integrated circuit device includes:
        a first terminal that connects one end of the first resonator to the first oscillation circuit;
        a second terminal that connects the other end of the first resonator to the first oscillation circuit;
        a third terminal that connects one end of the second oscillator to the second oscillation circuit; and
        a fourth terminal that connects the other end of the second oscillator to the second oscillation circuit.

3. The physical quantity measurement apparatus according to claim 2, further comprising:
    a package in which the first resonator, the second oscillator, and the integrated circuit device are accommodated; and
    internal wires of the package,
    wherein one end of the first resonator and the first terminal, the other end of the first resonator and the second terminal, one end of the second oscillator and the third terminal, and the other end of the second oscillator and the fourth terminal are connected to each other via the internal wires.

4. The physical quantity measurement apparatus according to claim 1,
    wherein the integrated circuit device includes a first side, a second side, a third side, and a fourth side,
    the first oscillation circuit is disposed along the first side, and
    the second oscillation circuit is disposed along one of the second side, the third side, and the fourth side.

5. The physical quantity measurement apparatus according to claim 1,
    wherein the measurement unit includes a processing circuit configured to perform signal processing on a detection signal corresponding to a physical quantity.

6. The physical quantity measurement apparatus according to claim 5,
    wherein the physical quantity is at least one of a time, a distance, a flow rate, a flow velocity, and a frequency.

7. The physical quantity measurement apparatus according to claim 5,
    wherein the processing circuit is configured to perform a waveform shaping process on the detection signal.

8. The physical quantity measurement apparatus according to claim 5, further comprising:
    a light emitter configured to irradiate a target object with light or a sonic wave transmitter configured to transmit a sonic wave to the target object; and
    a light receiver configured to receive light from the target object or a sonic wave receiver configured to receive a sonic wave from the target object.

9. The physical quantity measurement apparatus according to claim 8,
    wherein the processing circuit is configured to perform the signal processing on the detection signal from the light receiver or the sonic wave receiver.

10. The physical quantity measurement apparatus according to claim 1,
    wherein the integrated circuit device includes a controller configured to control at least one of the first oscillation circuit and the second oscillation circuit.

11. The physical quantity measurement apparatus according to claim 10, wherein the controller is configured to control at least one of an oscillation frequency and a phase of an oscillation signal of the at least one oscillation circuit.

12. The physical quantity measurement apparatus according to claim 10,
wherein the controller is configured to control the at least one oscillation circuit so that the first clock signal and the second clock signal have a predetermined frequency relationship or a predetermined phase relationship with each other.

13. The physical quantity measurement apparatus according to claim 1,
wherein a first update period is from a first phase synchronization timing to a second phase synchronization timing of the first clock signal and the second clock signal,
a second update period is from the second phase synchronization timing to a third phase synchronization timing,
an inter-clock time difference is a time difference between transition timings of the first clock signal and the second clock signal, and
the time-to-digital conversion circuit is configured to:
in the first update period, generate the first signal in an m-th clock cycle, where m is an integer of 1 or more, acquire the second signal whose signal level changes so as to correspond to the generated first signal, and compare the time difference of the first signal and the second signal with the inter-clock time difference in the m-th clock cycle, and
in the second update period, generate the first signal in an n-th clock cycle, where n is an integer of 1 or more, and the n-th clock cycle is set according to a result of the comparison in the first update period, acquire the second signal whose signal level changes so as to correspond to the generated first signal, and compares the time difference of the first signal and the second signal with the inter-clock time difference in the n-th clock cycle.

14. The physical quantity measurement apparatus according to claim 1,
wherein the integrated circuit device includes:
a first PLL circuit configured to perform phase synchronization between the first clock signal and a reference clock signal; and
a second PLL circuit configured to perform phase synchronization between the second clock signal and the reference clock signal.

15. A physical quantity measurement apparatus comprising:
a first resonator;
a second oscillator; and
an integrated circuit device,
wherein the integrated circuit device includes:
a first oscillation circuit configured to cause the first resonator to oscillate and generate a first clock signal having a first clock frequency,
a second oscillation circuit configured to cause the second oscillator to oscillate and generate a second clock signal having a second clock frequency, the second clock frequency being different from the first clock frequency, and
a measurement unit having a time-to-digital conversion circuit configured to convert time into a digital value based on the first clock signal and the second clock signal,
wherein the time-to-digital conversion circuit is configured to convert a time difference between transition timings of a first signal and a second signal into a digital value,
wherein a measurement period is from a first phase synchronization timing to a second phase synchronization timing of the first clock signal and the second clock signal,
wherein an inter-clock time difference is a time difference between transition timings of the first clock signal and the second clock signal, and
wherein the time-to-digital conversion circuit is configured to:
generate a plurality of the first signals in a plurality of clock cycles of the measurement period, and acquire a plurality of the second signals whose signal levels have been changed so as to correspond to the plurality of generated first signals, and
obtain the digital value based on a comparison of the time difference of the first signal and the second signal in each of the plurality of clock cycles with the inter-clock time difference in each clock cycle.

16. A physical quantity measurement apparatus comprising:
a first resonator;
a second oscillator; and
an integrated circuit device,
wherein the integrated circuit device includes:
a first oscillation circuit configured to cause the first resonator to oscillate and generate a first clock signal having a first clock frequency,
a second oscillation circuit configured to cause the second oscillator to oscillate and generate a second clock signal having a second clock frequency, the second clock frequency being different from the first clock frequency, and
a measurement unit having a time-to-digital conversion circuit configured to convert time into a digital value based on the first clock signal and the second clock signal,
wherein a jitter amount of the first clock signal and the second clock signal per clock cycle is J,
wherein a resolution in time-to-digital conversion is $\Delta t$, and wherein $J \le \Delta t$.

17. The physical quantity measurement apparatus according to claim 16,
wherein the number of clocks of one clock signal in a period between a timing at which one of the first clock signal and the second clock signal is phase-synchronized with the other clock signal or a reference clock signal and the next phase synchronization timing is K, and
$J \ge \Delta t / K$.

18. The physical quantity measurement apparatus according to claim 16,
wherein the number of clocks of one clock signal in a period between a timing at which one of the first clock signal and the second clock signal is phase-synchronized with the other clock signal or a reference clock signal and the next phase synchronization timing is K, and $$(1/10) \times (\Delta t / K^{1/2}) \le J \le 10 \times (\Delta t / K^{1/2}).$$

* * * * *